(12) United States Patent
Amundson et al.

(10) Patent No.: US 7,843,626 B2
(45) Date of Patent: Nov. 30, 2010

(54) ELECTRO-OPTIC DISPLAY AND MATERIALS FOR USE THEREIN

(75) Inventors: Karl R. Amundson, Cambridge, MA (US); Robert W. Zehner, Belmont, MA (US); Richard M. Webber, Brookline, MA (US); Katharine Geramita, Berkeley, CA (US); Libing Zhang, Sharon, MA (US); Andrew L. Loxley, Philadelphia, PA (US); Gregg M. Duthaler, Needham, MA (US); John E. Ritter, Westford, MA (US); Michael L. Steiner, New Richmond, WI (US); Mavyn M. Holman, Billerica, MA (US); Justin J. Abramson, New York, NY (US); Glen Crossley, Hamilton, CA (US)

(73) Assignee: E Ink Corporation, Cambridge, MA (US)

( * ) Notice: Subject to any disclaimer, the term of this patent is extended or adjusted under 35 U.S.C. 154(b) by 70 days.

(21) Appl. No.: 12/417,137

(22) Filed: Apr. 2, 2009

(65) Prior Publication Data

US 2009/0225397 A1 Sep. 10, 2009

Related U.S. Application Data

(60) Division of application No. 11/428,584, filed on Jul. 5, 2006, now Pat. No. 7,535,624, which is a continuation-in-part of application No. 10/907,065, filed on Mar. 18, 2005, now Pat. No. 7,236,292, which is a division of application No. 10/249,957, filed on May 22, 2003, now Pat. No. 6,982,178, said application No. 11/428,584 is a continuation-in-part of application No. 10/708,121, filed on Feb. 10, 2004, now Pat. No. 7,110,163, which is a continuation-in-part of application No. 10/064,389, filed on Jul. 9, 2002, now Pat. No. 6,831,769, said application No. 11/428,584 is a continuation-in-part of application No. 11/605,024, filed on Sep. 2, 2003, now Pat. No. 7,561,324.

(60) Provisional application No. 60/320,186, filed on May 12, 2003, provisional application No. 60/319,973, filed on Feb. 26, 2003, provisional application No. 60/319,934, filed on Feb. 11, 2003, provisional application No. 60/319,516, filed on Sep. 3, 2002, provisional application No. 60/319,300, filed on Jun. 10, 2002, provisional application No. 60/304,117, filed on Jul. 9, 2001.

(51) Int. Cl.
*G02B 7/02* (2006.01)
(52) U.S. Cl. .................. 359/296; 359/290; 345/107
(58) Field of Classification Search ................. 359/290, 359/238, 296; 345/84, 85, 107
See application file for complete search history.

(56) References Cited

U.S. PATENT DOCUMENTS 2,800,457 A 7/1957 Green et al.
(Continued)

FOREIGN PATENT DOCUMENTS

EP 0 659 866 A2 6/1995
(Continued)

OTHER PUBLICATIONS

Amundson, K., et al., "Flexible, Active-Matrix Display Constructed Using a Microencapsulated Electrophoretic Material and an Organic-Semiconductor-Based Backplane", SID 01 Digest, 160 (Jun. 2001).
(Continued)

*Primary Examiner*—Timothy J Thompson
(74) *Attorney, Agent, or Firm*—David J. Cole

(57) ABSTRACT

An electro-optic display comprises a layer (130) of a solid electro-optic material, at least one electrode disposed adjacent the layer (130) of electro-optic material, and a layer (180) of a lamination adhesive interposed between the layer (130) of electro-optic material and the electrode, the lamination adhesive (180) having a higher electrical conductivity in a direction perpendicular to the layer of lamination adhesive than in the plane of the layer.

29 Claims, 14 Drawing Sheets

U.S. PATENT DOCUMENTS

| | | |
|---|---|---|
| 3,668,106 A | 6/1972 | Ota |
| 3,756,693 A | 9/1973 | Ota |
| 3,767,392 A | 10/1973 | Ota |
| 3,792,308 A | 2/1974 | Ota |
| 3,870,517 A | 3/1975 | Ota et al. |
| 3,892,568 A | 7/1975 | Ota |
| 4,001,140 A | 1/1977 | Foris et al. |
| 4,273,672 A | 6/1981 | Vassiliades |
| 4,418,346 A | 11/1983 | Batchelder |
| 4,448,493 A | 5/1984 | Matsudaira et al. |
| 4,550,982 A | 11/1985 | Hirai |
| 4,613,351 A | 9/1986 | Spohr |
| 4,640,583 A | 2/1987 | Hoshikawa et al. |
| 4,650,288 A | 3/1987 | White |
| 4,690,749 A | 9/1987 | Van Alstine et al. |
| 4,742,345 A | 5/1988 | Di Santo et al. |
| 4,892,607 A | 1/1990 | DiSanto et al. |
| 5,128,226 A | 7/1992 | Hung |
| 5,213,715 A | 5/1993 | Patterson et al. |
| 5,213,983 A | 5/1993 | Gustafsson et al. |
| 5,250,938 A | 10/1993 | DiSanto et al. |
| 5,302,235 A | 4/1994 | DiSanto et al. |
| 5,380,362 A | 1/1995 | Schubert |
| 5,403,518 A | 4/1995 | Schubert |
| 5,411,656 A | 5/1995 | Schubert |
| 5,460,688 A | 10/1995 | DiSanto et al. |
| 5,627,561 A | 5/1997 | Laspina et al. |
| 5,635,317 A | 6/1997 | Taniguchi et al. |
| 5,686,383 A | 11/1997 | Long et al. |
| 5,688,584 A | 11/1997 | Casson et al. |
| 5,699,097 A | 12/1997 | Takayama et al. |
| 5,707,738 A | 1/1998 | Hou |
| 5,737,115 A | 4/1998 | Mackinlay et al. |
| 5,745,094 A | 4/1998 | Gordon, II et al. |
| 5,760,761 A | 6/1998 | Sheridon |
| 5,777,782 A | 7/1998 | Sheridon |
| 5,784,190 A | 7/1998 | Worley |
| 5,808,783 A | 9/1998 | Crowley |
| 5,872,552 A | 2/1999 | Gordon, II et al. |
| 5,891,366 A | 4/1999 | Gruenwald et al. |
| 5,930,026 A | 7/1999 | Jacobson et al. |
| 5,961,804 A | 10/1999 | Jacobson et al. |
| 5,972,493 A | 10/1999 | Iwasaki et al. |
| 6,017,584 A | 1/2000 | Albert et al. |
| 6,054,071 A | 4/2000 | Mikkelsen, Jr. |
| 6,055,091 A | 4/2000 | Sheridon et al. |
| 6,067,185 A | 5/2000 | Albert et al. |
| 6,097,531 A | 8/2000 | Sheridon |
| 6,113,810 A | 9/2000 | Hou et al. |
| 6,118,426 A | 9/2000 | Albert et al. |
| 6,120,588 A | 9/2000 | Jacobson |
| 6,120,839 A | 9/2000 | Comiskey et al. |
| 6,124,851 A | 9/2000 | Jacobson |
| 6,128,124 A | 10/2000 | Silverman |
| 6,130,773 A | 10/2000 | Jacobson et al. |
| 6,130,774 A | 10/2000 | Albert et al. |
| 6,136,128 A | 10/2000 | Chung |
| 6,137,467 A | 10/2000 | Sheridon et al. |
| 6,140,405 A | 10/2000 | Eckstein et al. |
| 6,144,361 A | 11/2000 | Gordon, II et al. |
| 6,147,791 A | 11/2000 | Sheridon |
| 6,172,798 B1 | 1/2001 | Albert et al. |
| 6,177,921 B1 | 1/2001 | Comiskey et al. |
| 6,184,331 B1 | 2/2001 | Chiang et al. |
| 6,184,856 B1 | 2/2001 | Gordon, II et al. |
| 6,215,920 B1 | 4/2001 | Whitehead et al. |
| 6,225,971 B1 | 5/2001 | Gordon, II et al. |
| 6,232,950 B1 | 5/2001 | Albert et al. |
| 6,241,921 B1 | 6/2001 | Jacobson et al. |
| 6,249,271 B1 | 6/2001 | Albert et al. |
| 6,252,564 B1 | 6/2001 | Albert et al. |
| 6,262,706 B1 | 7/2001 | Albert et al. |
| 6,262,833 B1 | 7/2001 | Loxley et al. |
| 6,271,823 B1 | 8/2001 | Gordon, II et al. |
| 6,300,932 B1 | 10/2001 | Albert |
| 6,301,038 B1 | 10/2001 | Fitzmaurice et al. |
| 6,312,304 B1 | 11/2001 | Duthaler et al. |
| 6,312,971 B1 | 11/2001 | Amundson et al. |
| 6,323,989 B1 | 11/2001 | Jacobson et al. |
| 6,327,072 B1 | 12/2001 | Comiskey et al. |
| 6,344,155 B1 | 2/2002 | Kitahara et al. |
| 6,365,949 B1 | 4/2002 | Ruiter et al. |
| 6,376,828 B1 | 4/2002 | Comiskey |
| 6,377,387 B1 | 4/2002 | Duthaler et al. |
| 6,392,785 B1 | 5/2002 | Albert et al. |
| 6,392,786 B1 | 5/2002 | Albert |
| 6,413,790 B1 | 7/2002 | Duthaler et al. |
| 6,422,687 B1 | 7/2002 | Jacobson |
| 6,428,650 B1 | 8/2002 | Chung |
| 6,445,374 B2 | 9/2002 | Albert et al. |
| 6,445,489 B1 | 9/2002 | Jacobson et al. |
| 6,459,418 B1 | 10/2002 | Comiskey et al. |
| 6,473,072 B1 | 10/2002 | Comiskey et al. |
| 6,480,182 B2 | 11/2002 | Turner et al. |
| 6,498,114 B1 | 12/2002 | Amundson et al. |
| 6,504,524 B1 | 1/2003 | Gates et al. |
| 6,506,438 B2 | 1/2003 | Duthaler et al. |
| 6,512,354 B2 | 1/2003 | Jacobson et al. |
| 6,515,649 B1 | 2/2003 | Albert et al. |
| 6,518,949 B2 | 2/2003 | Drzaic |
| 6,521,489 B2 | 2/2003 | Duthaler et al. |
| 6,531,997 B1 | 3/2003 | Gates et al. |
| 6,535,197 B1 | 3/2003 | Comiskey et al. |
| 6,538,801 B2 | 3/2003 | Jacobson et al. |
| 6,545,291 B1 | 4/2003 | Amundson et al. |
| 6,580,545 B2 | 6/2003 | Morrison et al. |
| 6,639,578 B1 | 10/2003 | Comiskey et al. |
| 6,652,075 B2 | 11/2003 | Jacobson |
| 6,657,772 B2 | 12/2003 | Loxley |
| 6,664,944 B1 | 12/2003 | Albert et al. |
| D485,294 S | 1/2004 | Albert |
| 6,672,921 B1 | 1/2004 | Liang et al. |
| 6,680,725 B1 | 1/2004 | Jacobson |
| 6,683,333 B2 | 1/2004 | Kazlas et al. |
| 6,693,620 B1 | 2/2004 | Herb et al. |
| 6,704,133 B2 | 3/2004 | Gates et al. |
| 6,710,540 B1 | 3/2004 | Albert et al. |
| 6,721,083 B2 | 4/2004 | Jacobson et al. |
| 6,724,519 B1 | 4/2004 | Comiskey et al. |
| 6,727,881 B1 | 4/2004 | Albert et al. |
| 6,738,050 B2 | 5/2004 | Comiskey et al. |
| 6,750,473 B2 | 6/2004 | Amundson et al. |
| 6,753,999 B2 | 6/2004 | Zehner et al. |
| 6,788,449 B2 | 9/2004 | Liang et al. |
| 6,816,147 B2 | 11/2004 | Albert |
| 6,819,471 B2 | 11/2004 | Amundson et al. |
| 6,822,782 B2 | 11/2004 | Honeyman et al. |
| 6,825,068 B2 | 11/2004 | Denis et al. |
| 6,825,829 B1 | 11/2004 | Albert et al. |
| 6,825,970 B2 | 11/2004 | Goenaga et al. |
| 6,831,769 B2 | 12/2004 | Holman et al. |
| 6,839,158 B2 | 1/2005 | Albert et al. |
| 6,842,167 B2 | 1/2005 | Albert et al. |
| 6,842,279 B2 | 1/2005 | Amundson |
| 6,842,657 B1 | 1/2005 | Drzaic et al. |
| 6,864,875 B2 | 3/2005 | Drzaic et al. |
| 6,865,010 B2 | 3/2005 | Duthaler et al. |
| 6,866,760 B2 | 3/2005 | Paolini Jr. et al. |
| 6,870,657 B1 | 3/2005 | Fitzmaurice et al. |
| 6,870,661 B2 | 3/2005 | Pullen et al. |
| 6,900,851 B2 | 5/2005 | Morrison et al. |
| 6,922,276 B2 | 7/2005 | Zhang et al. |
| 6,950,220 B2 | 9/2005 | Abramson et al. |
| 6,958,848 B2 | 10/2005 | Cao et al. |

| | | |
|---|---|---|
| 6,967,640 B2 | 11/2005 | Albert et al. |
| 6,980,196 B1 | 12/2005 | Turner et al. |
| 6,982,178 B2 | 1/2006 | LeCain et al. |
| 6,987,603 B2 | 1/2006 | Paolini, Jr. et al. |
| 6,995,550 B2 | 2/2006 | Jacobson et al. |
| 7,002,728 B2 | 2/2006 | Pullen et al. |
| 7,012,600 B2 | 3/2006 | Zehner et al. |
| 7,012,735 B2 | 3/2006 | Honeyman et al. |
| 7,023,420 B2 | 4/2006 | Comiskey et al. |
| 7,030,412 B1 | 4/2006 | Drzaic et al. |
| 7,030,854 B2 | 4/2006 | Baucom et al. |
| 7,034,783 B2 | 4/2006 | Gates et al. |
| 7,038,655 B2 | 5/2006 | Herb et al. |
| 7,061,663 B2 | 6/2006 | Cao et al. |
| 7,071,913 B2 | 7/2006 | Albert et al. |
| 7,075,502 B1 | 7/2006 | Drzaic et al. |
| 7,075,703 B2 | 7/2006 | O'Neil et al. |
| 7,079,305 B2 | 7/2006 | Paolini, Jr. et al. |
| 7,106,296 B1 | 9/2006 | Jacobson |
| 7,109,968 B2 | 9/2006 | Albert et al. |
| 7,110,163 B2 | 9/2006 | Webber et al. |
| 7,110,164 B2 | 9/2006 | Paolini, Jr. et al. |
| 7,116,318 B2 | 10/2006 | Amundson et al. |
| 7,116,466 B2 | 10/2006 | Whitesides et al. |
| 7,119,772 B2 | 10/2006 | Amundson et al. |
| 7,148,128 B2 | 12/2006 | Jacobson |
| 7,167,155 B1 | 1/2007 | Albert et al. |
| 7,170,670 B2 | 1/2007 | Webber |
| 7,173,752 B2 | 2/2007 | Doshi et al. |
| 7,176,880 B2 | 2/2007 | Amundson et al. |
| 7,180,649 B2 | 2/2007 | Morrison et al. |
| 7,190,008 B2 | 3/2007 | Amundson et al. |
| 7,193,625 B2 | 3/2007 | Danner et al. |
| 7,202,847 B2 | 4/2007 | Gates |
| 7,202,991 B2 | 4/2007 | Zhang et al. |
| 7,206,119 B2 | 4/2007 | Honeyman et al. |
| 7,223,672 B2 | 5/2007 | Kazlas et al. |
| 7,230,750 B2 | 6/2007 | Whitesides et al. |
| 7,230,751 B2 | 6/2007 | Whitesides et al. |
| 7,236,290 B1 | 6/2007 | Zhang et al. |
| 7,236,291 B2 | 6/2007 | Kaga et al. |
| 7,236,292 B2 | 6/2007 | LeCain et al. |
| 7,242,513 B2 | 7/2007 | Albert et al. |
| 7,247,379 B2 | 7/2007 | Pullen et al. |
| 7,256,766 B2 | 8/2007 | Albert et al. |
| 7,259,744 B2 | 8/2007 | Arango et al. |
| 7,280,094 B2 | 10/2007 | Albert |
| 7,304,634 B2 | 12/2007 | Albert et al. |
| 7,312,784 B2 | 12/2007 | Baucom et al. |
| 7,312,794 B2 | 12/2007 | Zehner et al. |
| 7,312,916 B2 | 12/2007 | Pullen et al. |
| 7,321,459 B2 | 1/2008 | Masuda et al. |
| 7,327,511 B2 | 2/2008 | Whitesides et al. |
| 7,339,715 B2 | 3/2008 | Webber et al. |
| 7,352,353 B2 | 4/2008 | Albert et al. |
| 7,365,394 B2 | 4/2008 | Denis et al. |
| 7,365,733 B2 | 4/2008 | Duthaler et al. |
| 7,382,363 B2 | 6/2008 | Albert et al. |
| 7,388,572 B2 | 6/2008 | Duthaler et al. |
| 7,391,555 B2 | 6/2008 | Albert et al. |
| 7,764,420 B2 * | 7/2010 | Kawase et al. ............. 359/296 |
| 2001/0030639 A1 | 10/2001 | Goden |
| 2002/0027635 A1 | 3/2002 | Sakamaki et al. |
| 2002/0060321 A1 | 5/2002 | Kazlas et al. |
| 2002/0090980 A1 | 7/2002 | Wilcox et al. |
| 2002/0130832 A1 | 9/2002 | Baucom et al. |
| 2003/0102858 A1 | 6/2003 | Jacobson et al. |
| 2003/0132908 A1 | 7/2003 | Herb et al. |
| 2003/0179437 A1 | 9/2003 | Liang et al. |
| 2004/0105036 A1 | 6/2004 | Danner et al. |
| 2004/0112525 A1 | 6/2004 | Pereira et al. |
| 2004/0112750 A1 | 6/2004 | Jacobson et al. |
| 2004/0119681 A1 | 6/2004 | Albert et al. |
| 2004/0120024 A1 | 6/2004 | Chen et al. |
| 2004/0155857 A1 | 8/2004 | Duthaler et al. |
| 2004/0180476 A1 | 9/2004 | Kazlas et al. |
| 2004/0190114 A1 | 9/2004 | Jacobson et al. |
| 2004/0233509 A1 | 11/2004 | Zhang et al. |
| 2004/0263947 A1 | 12/2004 | Drzaic et al. |
| 2005/0001810 A1 | 1/2005 | Yakushiji et al. |
| 2005/0007336 A1 | 1/2005 | Albert et al. |
| 2005/0012980 A1 | 1/2005 | Wilcox et al. |
| 2005/0018273 A1 | 1/2005 | Honeyman et al. |
| 2005/0024353 A1 | 2/2005 | Amundson et al. |
| 2005/0062714 A1 | 3/2005 | Zehner et al. |
| 2005/0122284 A1 | 6/2005 | Gates et al. |
| 2005/0122306 A1 | 6/2005 | Wilcox et al. |
| 2005/0122563 A1 | 6/2005 | Honeyman et al. |
| 2005/0151709 A1 | 7/2005 | Jacobson et al. |
| 2005/0152018 A1 | 7/2005 | Abramson et al. |
| 2005/0156340 A1 | 7/2005 | Valianatos et al. |
| 2005/0179642 A1 | 8/2005 | Wilcox et al. |
| 2005/0212747 A1 | 9/2005 | Amundson |
| 2005/0253777 A1 | 11/2005 | Zehner et al. |
| 2005/0259068 A1 | 11/2005 | Nihei et al. |
| 2005/0270261 A1 | 12/2005 | Danner et al. |
| 2005/0280626 A1 | 12/2005 | Amundson et al. |
| 2006/0007527 A1 | 1/2006 | Paolini, Jr. et al. |
| 2006/0038772 A1 | 2/2006 | Amundson et al. |
| 2006/0087479 A1 | 4/2006 | Sakurai et al. |
| 2006/0087489 A1 | 4/2006 | Sakurai et al. |
| 2006/0087718 A1 | 4/2006 | Takagi et al. |
| 2006/0139308 A1 | 6/2006 | Jacobson et al. |
| 2006/0139310 A1 | 6/2006 | Zehner et al. |
| 2006/0139311 A1 | 6/2006 | Zehner et al. |
| 2006/0176267 A1 | 8/2006 | Honeyman et al. |
| 2006/0181492 A1 | 8/2006 | Gates et al. |
| 2006/0181504 A1 | 8/2006 | Kawai |
| 2006/0194619 A1 | 8/2006 | Wilcox et al. |
| 2006/0197737 A1 | 9/2006 | Baucom et al. |
| 2006/0197738 A1 | 9/2006 | Kawai |
| 2006/0202949 A1 | 9/2006 | Danner et al. |
| 2006/0209008 A1 | 9/2006 | Nihei et al. |
| 2006/0214906 A1 | 9/2006 | Kobayashi et al. |
| 2006/0223282 A1 | 10/2006 | Amundson et al. |
| 2006/0231401 A1 | 10/2006 | Sakurai et al. |
| 2006/0232531 A1 | 10/2006 | Amundson et al. |
| 2006/0238488 A1 | 10/2006 | Nihei et al. |
| 2006/0263927 A1 | 11/2006 | Sakurai et al. |
| 2006/0279527 A1 | 12/2006 | Zehner et al. |
| 2006/0291034 A1 | 12/2006 | Patry et al. |
| 2007/0013683 A1 | 1/2007 | Zhou et al. |
| 2007/0103427 A1 | 5/2007 | Zhou et al. |

FOREIGN PATENT DOCUMENTS

| | | |
|---|---|---|
| EP | 1 099 207 B1 | 3/2002 |
| EP | 1 145 72 B1 | 5/2003 |
| JP | 02-223936 A | 9/1990 |
| JP | 02-284124 A | 11/1990 |
| JP | 02-284125 A | 11/1990 |
| JP | 05-143009 A | 6/1993 |
| JP | 05-307197 A | 11/1993 |
| JP | 06-118452 A | 4/1994 |
| JP | 2000-259102 | 9/2000 |
| JP | 2002-072258 | 3/2002 |
| WO | WO 00/36560 | 6/2000 |
| WO | WO 00/38000 | 6/2000 |
| WO | WO 00/67110 | 11/2000 |
| WO | WO 01/07961 | 2/2001 |
| WO | WO 2004/079442 | 9/2004 |

OTHER PUBLICATIONS

Amundson, K., "Electrophoretic Imaging Films for Electronic Paper Displays" in Crawford, G. ed. Flexible Flat Panel Displays, John Wiley & Sons, Ltd., Hoboken, NJ: 2005.

Au, J. et al., "Ultra-Thin 3.1-in. Active-Matrix Electronic Ink Display for Mobile Devices", IDW'02, 223 (2002).

Bach, U., et al., "Nanomaterials-Based Electrochromics for Paper-Quality Displays", Adv. Mater, 14(11), 845 (2002).

Bouchard, A. et al., "High-Resolution Microencapsulated Electrophoretic Display on Silicon", SID 04 Digest, 651 (2004).

Caillot, E. et al. "Active Matrix Electrophoretic Information Display for High Performance Mobile Devices", IDMC Proceedings (2003).

Chen, Y., et al., "A Conformable Electronic Ink Display using a Foil-Based a-Si TFT Array", SID 01 Digest, 157 (Jun. 2001).

Comiskey, B., et al., "An electrophoretic ink for all-printed reflective electronic displays", Nature, 394, 253 (1998).

Comiskey, B., et al., "Electrophoretic Ink: A Printable Display Material", SID 97 Digest (1997), p. 75.

Danner, G.M. et al., "Reliability Performance for Microencapsulated Electrophoretic Displays with Simulated Active Matrix Drive", SID 03 Digest, 573 (2003).

Drzaic, P., et al., "A Printed and Rollable Bistable Electronic Display", SID 98 Digest (1998), p. 1131.

Duthaler, G., et al., "Active-Matrix Color Displays Using Electrophoretic Ink and Color Filters", SID 02 Digest, 1374 (2002).

Gates, H. et al., "A5 Sized Electronic Paper Display for Document Viewing", SID 05 Digest, (2005).

Gutcho, M.H., Microcapsules and Mlcroencapsulation Techniques, Noyes Data Corp., Park Ridge NJ, (1976).

Hayes, R.A., et al., "Video-Speed Electronic Paper Based on Electrowetting", Nature, vol. 425, Sep. 25, pp. 383-385 (2003).

Henzen, A. et al., "An Electronic Ink Low Latency Drawing Tablet", SID 04 Digest, 1070 (2004).

Henzen, A. et al., "Development of Active Matrix Electronic Ink Displays for Handheld Devices", SID 03 Digest, 176, (2003).

Henzen, A. et al., "Development of Active Matrix Electronic Ink Displays for Smart Handheld Applications", IDW'02, 227 (2002).

Hou, J., et al., "Active Matrix Electrophoretic Displays Containing Black and White Particles with Opposite Polarities", SID 01 Digest, 164 (Jun. 2001).

Jacobson, J., et al., "The last book", IBM Systems J., 36, 457 (1997).

Jo, G-R, et al., "Toner Display Based on Particle Movements", Chem. Mater, 14, 664 (2002).

Johnson, M. et al., "High Quality Images on Electronic Paper Displays", SID 05 Digest, 1666 (2005).

Kazlas, P. et al., "Card-size Active-matrix Electronic Ink Display", Eurodisplay 2002, 259 (2002).

Kazlas, P., et al., "12.1" SVGA Microencapsulated Electrophoretic Active Matrix Display for Information Applicances, SID 01 Digest, 152 (Jun. 2001).

Kitamura, T., et al., "Electrical toner movement for electronic paper-like display", Asia Display/IDW '01, p. 1517, Paper HCS1-1 (2001).

O'Regan, B. et al., "A Low Cost, High-efficiency Solar Cell Based on Dye-sensitized colloidal $TiO_2$ Films", Nature, vol. 353, Oct. 24, 1991, 773-740.

Ota, I., et al., "Developments in Electrophoretic Displays", Proceedings of the SID, 18, 243 (1977).

Pitt, M.G., et al., "Power Consumption of Microencapsulated Electrophoretic Displays for Smart Handheld Applications", SID 02 Digest, 1378 (2002).

Vandegaer, J.E. (ed.), "Microencapsulation Processes and Applications", pp. v-x, 1-180 (Plenum Press, New York 1974).

Webber, R., "Image Stability in Active-Matrix Microencapsulated Electrophoretic Displays", SID 02 Digest, 126 (2002).

Whitesides, T. et al., "Towards Video-rate Microencapsulated Dual-Particle Electrophoretic Displays", SID 04 Digest, 133 (2004).

Wood, D., "An Electrochromic Renaissance?" Information Display, 18(3), 24 (Mar. 2002).

Yamaguchi, Y., et al., "Toner display using insulative particles charged triboelectrically", Asia Display/IDW '01, p. 1729, Paper AMD4-4 (2001).

Zehner, R. et al., "Drive Waveforms for Active Matrix Electrophoretic Displays", SID 03 Digest, 842 (2003).

\* cited by examiner

| Materials | Wt (g) | Wt% | MW | Mole | Mole% |
|---|---|---|---|---|---|
| PPO2000 | 50.00 | 0.653 | 2000.00 | 0.025 | 0.152 |
| DMPA | 3.35 | 0.044 | 134.13 | 0.025 | 0.152 |
| SnB2L2 | 0.04 | | 631.56 | | |
| NMP | 10.00 | | | | |
| H12MDI | 18.36 | 0.240 | 262.35 | 0.070 | 0.424 |
| TEA | 2.53 | 0.033 | 101.19 | 0.025 | 0.152 |
| H2O | 105.00 | | | | |
| HMDA | 2.32 | 0.030 | 116.21 | 0.020 | 0.121 |
| H2O in 50% HDA soln | 2.32 | | | | |

Theorectical polymer wt    76.57 g
Dispersion weight    193.94 g
Solids (%)    39.5%
NMP (%)    5.2%

Fig.17

| Materials | Wt (g) | Wt% | MW | Mole | Mole% |
|---|---|---|---|---|---|
| PPO2000 | 50.00 | 0.673 | 2000.00 | 0.025 | 0.172 |
| DMPA | 3.35 | 0.045 | 134.13 | 0.025 | 0.172 |
| SnB2L2 | 0.04 | | 631.56 | | |
| NMP | 10.00 | | | | |
| H12MDI | 18.36 | 0.247 | 262.35 | 0.070 | 0.483 |
| TEA | 2.53 | 0.034 | 101.19 | 0.025 | 0.172 |
| H2O | 100.00 | | | | |

Polymer weight    74.25 g
Dispersion weight    184.29 g
Solids (%)    40.3%

Fig. 18

ELECTRO-OPTIC DISPLAY AND MATERIALS FOR USE THEREIN

REFERENCE TO RELATED APPLICATIONS

This application is a divisional of copending application Ser. No. 11/428,584, filed Jul. 5, 2006 (Publication No. 2007/0035808), which is itself a continuation-in-part of application Ser. No. 10/708,121, filed Feb. 10, 2004 (Publication No. 2004/0252360, now U.S. Pat. No. 7,110,163), which itself is a continuation-in-part of application Ser. No. 10/064,389, filed Jul. 9, 2002 (Publication No. 2003/0025855, now U.S. Pat. No. 6,831,769), which in turn claims benefit of Application Ser. No. 60/304,117, filed Jul. 9, 2001. The aforementioned application Ser. No. 10/708,121 claims benefit of Application Ser. No. 60/319,934, filed Feb. 11, 2003 and Application Ser. No. 60/319,973, filed Feb. 26, 2003.

The aforementioned copending application Ser. No. 11/428,584 is also a continuation-in-part of copending application Ser. No. 10/605,024, filed Sep. 2, 2003 (Publication No. 2004/0155857), which claims benefit of Application Ser. No. 60/319,516, filed Sep. 3, 2002.

The aforementioned copending application Ser. No. 11/428,584 is also a continuation-in-part of application Ser. No. 10/907,065, filed Mar. 18, 2005 (Publication No. 2005/0146774, now U.S. Pat. No. 7,236,292), which is a divisional of application Ser. No. 10/249,957, filed May 22, 2003 (now U.S. Pat. No. 6,982,178), which claims benefit of Application Ser. No. 60/319,300, filed Jun. 10, 2002, and Application Ser. No. 60/320,186, filed May 12, 2003.

This application is also related to the following applications and patents: (a) application Ser. No. 10/329,023 (Publication No. 2003/0112491), filed Dec. 24, 2002, now U.S. Pat. No. 6,727,881; (b) U.S. Pat. No. 6,727,881, issued on application Ser. No. 09/140,846, filed Aug. 27, 1998, of which the aforementioned application Ser. No. 10/329,023 is a continuation; (c) U.S. Pat. No. 6,124,851, issued on application Ser. No. 08/504,896, filed Jul. 20, 1995, of which the aforementioned application Ser. No. 09/140,846 is a continuation-in-part; (d) application Ser. No. 08/983,404, filed Mar. 26, 1999 (now U.S. Pat. No. 7,106,296), of which the aforementioned application Ser. No. 09/140,846 is a continuation-in-part; (e) International Application No. PCT/US96/12000 (Publication No. WO 97/04398), of which the aforementioned application Ser. No. 08/983,404 is the United States national phase; (f) U.S. Pat. No. 6,120,588, issued on application Ser. No. 08/935,800, filed Sep. 23, 1997, of which the aforementioned application Ser. No. 09/140,846 is a continuation-in-part; (g) Provisional Application Ser. Nos. 60/057,118; 60/057,122; 60/057,133; 60/057,163; 60/057,716; 60/057,798; 60/057,799; 60/059,358; 60/059,543; 60/065,529; 60/065,605; 60/065,630; 60/066,115; 60/066,147; 60/066,245; 60/066,246; 60/066,334; 60/066,418; 60/070,935; 60/070,939; 60/070,940; 60/071,371; 60/072,390; 60/074,454; 60/076,955; 60/076,956; 60/076,957; 60/076,959; 60/076,978; 60/078,363; 60/081,362; 60/081,374; 60/083,252; 60/085,096; 60/090,222; 60/090,223; 60/090,232; 60/092,046; 60/092,050; 60/092,742; and 60/093,689; from all of which the aforementioned application Ser. No. 09/140,846 claims priority; (h) U.S. Pat. No. 6,657,772; (i) Application Ser. No. 60/304,015, filed Jul. 9, 2001, from which the aforementioned application Ser. No. 10/064,279 claims priority; (j) U.S. Pat. No. 6,312,304. The entire contents of all the aforementioned patents and applications, and of all United States patents, published applications and copending applications mentioned below are herein incorporated by reference.

BACKGROUND OF INVENTION

This invention relates to electro-optic displays and to materials, especially adhesive compositions and binders, for use therein. This invention relates in part to adhesive compositions and binders with electrical and other properties which render them especially suitable for use in electro-optic displays. Certain adhesive compositions of the present invention may also be useful in applications other than electro-optic displays. This invention also relates to materials and processes for lamination of electro-optic displays.

Electro-optic displays comprise a layer of electro-optic material, a term which is used herein in its conventional meaning in the art to refer to a material having first and second display states differing in at least one optical property, the material being changed from its first to its second display state by application of an electric field to the material. The optical property is typically color perceptible to the human eye, but may be another optical property, such as optical transmission, reflectance, luminescence or, in the case of displays intended for machine reading, pseudo-color in the sense of a change in reflectance of electromagnetic wavelengths outside the visible range.

The electro-optic displays of the present invention typically contain an electro-optic material which is a solid in the sense that the electro-optic material has solid external surfaces, although the material may, and often does, have internal liquid- or gas-filled spaces, and to methods for assembling displays using such an electro-optic material. Such displays using solid electro-optic materials may hereinafter for convenience be referred to as "solid electro-optic displays". Thus, the term "solid electro-optic displays" includes rotating bichromal member displays (see below), encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in published U.S. patent application Ser. No. 2002/0180687 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed to applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870.657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, Vol. 425, pages 383-385 (25 Sep. 2003). It is shown in copending application Ser. No. 10/711,802, filed Oct. 6, 2004 (Publication No. 2005/0151709), that such electro-wetting displays can be made bistable.

Another type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Patent Publication No. 2005/0001810; European Patent Applications 1,462,847; 1,482,354; 1,484,635; 1,500,971; 1,501,194; 1,536,271; 1,542,067; 1,577,702; 1,577,703; and 1,598,694; and International Applications WO 2004/090626; WO 2004/079442; and WO 2004/001498. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspending medium, and a capsule wall surrounding the internal phase. Typically, the capsules are themselves held within a polymeric binder to form a coherent layer positioned between two electrodes. Encapsulated media of this type are described, for example, in U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; 6,459,418; 6,473,072; 6,480,182; 6,498,114; 6,504,524; 6,506,438; 6,512,354; 6,515,649; 6,518,949; 6,521,489; 6,531,997; 6,535,197; 6,538,801; 6,545,291; 6,580,545; 6,639,578; 6,652,075; 6,657,772; 6,664,944; 6,680,725; 6,683,333; 6,704,133; 6,710,540; 6,721,083; 6,724,519; 6,727,881; 6,738,050; 6,750,473; 6,753,999; 6,816,147; 6,819,471; 6,822,782; 6,825,068; 6,825,829; 6,825,970; 6,831,769; 6,839,158; 6,842,167; 6,842,279; 6,842,657; 6,864,875; 6,865,010; 6,866,760; 6,870,661; 6,900,851; 6,922,276; 6,950,200; 6,958,848; 6,967,640; 6,982,178; 6,987,603; 6,995,550; 7,002,728; 7,012,600; 7,012,735; 7,023,430; 7,030,412; 7,030,854; 7,034,783; 7,038,655; 7,061,663; 7,071,913; 7,075,502; and 7,075,703; and U.S. Patent Applications Publication Nos. 2002/0060321; 2002/0090980; 2002/0113770; 2002/0180687; 2003/0011560; 2003/0102858; 2003/0151702; 2003/0222315; 2004/0014265; 2004/0075634; 2004/0094422; 2004/0105036; 2004/0112750; 2004/0119681; 2004/0136048; 2004/0155857; 2004/0180476; 2004/0190114; 2004/0196215; 2004/0226820; 2004/0239614; 2004/0252360; 2004/0257635; 2004/0263947; 2005/0000813; 2005/0001812; 2005/0007336; 2005/0012980; 2005/0017944; 2005/0018273; 2005/0024353; 2005/0062714; 2005/0067656; 2005/0078099; 2005/0099672; 2005/0105159; 2005/0105162; 2005/0122284; 2005/0122306; 2005/0122563; 2005/0122564; 2005/0122565; 2005/0134554; 2005/0146774; 2005/0151709; 2005/0152018; 2005/0152022; 2005/0156340; 2005/0168799; 2005/0179642; 2005/0190137; 2005/0212747; 2005/0213191; 2005/0219184; 2005/0253777; 2005/0270261; 2005/0280626; 2006/0007527; 2006/0023296; 2006/0024437; and 2006/0038772; and International Applications Publication Nos. WO 00/38000; WO 00/36560; WO 00/67110; WO 01/07961; and European Patents Nos. 1,099,207 B1; and 1,145,072 B1.

Many of the aforementioned patents and applications recognize that the walls surrounding the discrete microcapsules in an encapsulated electrophoretic medium could be replaced by a continuous phase, thus producing a so-called "polymer-dispersed electrophoretic display" in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, International Application Publication No. WO 02/01281, and published US Application No. 2002/0075556, both assigned to Sipix Imaging, Inc. Hereinafter, the term "microcavity electrophoretic display" may be used to cover both encapsulated and microcell electrophoretic displays.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: premetered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; inkjet printing processes; and other similar techniques.) Thus, the resulting display can be flexible. Further, because the display medium can be printed (using a variety of methods), the display itself can be made inexpensively.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, the aforementioned U.S. Pat. Nos. 6,130,774 and 6,172,798, and U.S. Pat. Nos. 5,872,552; 6,144,361; 6,271,823; 6,225,971; and 6,184,856. Dielectrophoretic displays, which are similar to electrophoretic displays but rely upon variations in electric field strength, can operate in a similar mode; see U.S. Pat. No. 4,418,346.

Other types of electro-optic materials, for example, polymer-dispersed liquid crystal, may also be used in some of the displays of the present invention.

In addition to the layer of electro-optic material, an electro-optic display normally comprises at least two other layers disposed on opposed sides of the electro-optic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electro-optic display, which is intended for use with a stylus, print head or similar movable electrode separate from the display, only one of the layers adjacent the electro-optic layer comprises an electrode, the layer on the opposed side of the electro-optic layer typically being a protective layer intended to prevent the movable electrode damaging the electro-optic layer.

The manufacture of a three-layer electro-optic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium tin oxide or a similar conductive coating (which acts as an one electrode of the final display) on a plastic film, the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. (A very similar process can be used to prepare an electrophoretic display useable with a stylus or similar movable electrode by replacing the backplane with a simple protective layer, such as a plastic film, over which the stylus or other movable electrode can slide.) In one preferred form of such a process, the backplane is itself flexible and is prepared by printing the pixel electrodes and conductors on a plastic film or other flexible substrate. The obvious lamination technique for mass production of displays by this process is roll lamination using a lamination adhesive. Similar manufacturing techniques can be used with other types of electro-optic displays. For example, a microcell electrophoretic medium or a rotating bichromal member medium may be laminated to a backplane in substantially the same manner as an encapsulated electrophoretic medium.

In the processes described above, the lamination of the substrate carrying the electro-optic layer to the backplane may advantageously be carried out by vacuum lamination. Vacuum lamination is effective in expelling air from between the two materials being laminated, thus avoiding unwanted air bubbles in the final display; such air bubbles may introduce undesirable artifacts in the images produced on the display. However, vacuum lamination of the two parts of an electro-optic display in this manner imposes stringent requirements upon the lamination adhesive used, especially in the case of a display using an encapsulated electrophoretic medium. The lamination adhesive must have sufficient adhesive strength to bind the electro-optic layer to the layer (typically an electrode layer) to which it is to be laminated, and in the case of an encapsulated electrophoretic medium, the adhesive should also have sufficient adhesive strength to assist in mechanically holding the capsules together. If the electro-optic display is to be of a flexible type (and one of the important advantages of rotating bichromal member and encapsulated electrophoretic displays is that they can be made flexible), the adhesive must have sufficient flexibility not to introduce defects into the display when the display is flexed. The lamination adhesive must have adequate flow properties at the lamination temperature to ensure high quality lamination, and in this regard, the demands of laminating encapsulated electrophoretic and some other types of electro-optic media are unusually difficult; the lamination has to be conducted at a temperature of not more than about 110° C. since the medium cannot be exposed to substantially higher temperatures without damage, but the flow of the adhesive must cope with the relatively uneven surface of the capsule-containing layer, the surface of which is rendered irregular by the underlying capsules. The lamination temperature should indeed be kept as low as possible, and room temperature lamination would be ideal, but no commercial adhesive has been found which permits such room temperature lamination. The lamination adhesive must be chemically compatible with all the other materials in the display. Solvent-based lamination adhesives should be avoided; it has been found (although this does not appear to have been described in the literature), that any solvent left behind in the adhesive after lamination has a strong tendency to introduce undesirable contaminants into the electro-optic medium.

As discussed in detail in the aforementioned U.S. Pat. No. 6,831,769, a lamination adhesive used in an electro-optic display must meet certain electrical criteria, and this introduces considerable problems in the selection of the lamination adhesive. Commercial manufacturers of lamination adhesives naturally devote considerable effort to ensuring that properties, such as strength of adhesion and lamination temperatures, of such adhesives are adjusted so that the adhesives perform well in their major applications, which typically involve laminating polymeric and similar films. However, in such applications, the electrical properties of the lamination adhesive are not relevant, and consequently the commercial manufacturers pay no heed to such electrical properties. Indeed, E Ink researchers have observed substantial variations (of up to several fold) in certain electrical properties between different batches of the same commercial lamination adhesive, presumably because the manufacturer was attempting to optimize non-electrical properties of the lamination adhesive (for example, resistance to bacterial growth) and was not at all concerned about resulting changes in electrical properties.

However, in electro-optic displays, in which the lamination adhesive is normally located between the electrodes which apply the electric field needed to change the electrical state of the electro-optic medium, the electrical properties of the adhesive become crucial. As will be apparent to electrical engineers, the volume resistivity of the lamination adhesive becomes important, since the voltage drop across the electro-optic medium is essentially equal to the voltage drop across the electrodes, minus the voltage drop across the lamination adhesive. If the resistivity of the adhesive layer is too high, a substantial voltage drop will occur within the adhesive layer, requiring an increase in voltage across the electrodes. Increasing the voltage across the electrodes in this manner is undesirable, since it increases the power consumption of the display, and may require the use of more complex and expensive control circuitry to handle the increased voltage involved. On the other hand, if the adhesive layer, which extends continuously across the display, is in contact with a matrix of electrodes, as in an active matrix display, the volume resistivity of the adhesive layer should not be too low, or lateral conduction of electric current through the continuous adhesive layer may cause undesirable cross-talk between adjacent electrodes. Also, since the volume resistivity of most materials decreases rapidly with increasing temperature, if the volume resistivity of the adhesive layer is too low, the performance of the display at temperatures substantially above room temperature is adversely affected. For these reasons, there is an optimum range of lamination adhesive resistivity values for use with any given electro-optic medium, this range varying with the resistivity of the electro-optic medium. The volume resistivities of encapsulated electrophoretic media are typically around $10^{10}$ ohm cm, and the resistivities of other electro-optic medium are usually of the same order of magnitude. Accordingly, the volume resistivity of the lamination adhesive should normally be around $10^8$ to $10^{12}$ ohm cm, and preferably about $10^9$ to $10^{11}$ ohm cm, at the operating temperature of the display, typically around 20° C.

While it may be apparent that there should be a relationship between the volume resistivities of the electro-optic medium and the lamination adhesive used in an electro-optic display, it has been discovered, as noted in the aforementioned U.S. Pat. No. 6,831,769, that other problems which have been observed in the operation of electro-optic displays are attributable to the electrical and related properties of the lamination adhesive. For example, although the number of commercial materials which can meet most of the previously discussed, rather disparate requirements for a lamination adhesive for use in an electro-optic display is small, in practice it has been found that a small number of water-dispersed urethane emulsions, primarily polyester-based urethane emulsions, do appear to have most of the requisite properties. However, although these materials perform well when the displays are first produced, after the resultant displays have been operated for substantial periods of time (of the order of hundreds of hours) at room temperature, or stored for a similar period, the performance of the display suffers substantial degradation. This degradation first manifests itself as reduced white state reflectivity and slower or incomplete switching of the electro-optic medium, especially in areas where the lamination adhesive is thickest; the thickness of the lamination adhesive may vary across the display both because of a non-planar electro-optic layer, as for example in an encapsulated electrophoretic medium where the spherical or ellipsoidal capsules introduce deviations from planarity, and/or because the manufacturing process normally used to produce the electrode matrix in such displays produces a non-planar surface on the electrode matrix. This degradation increases at lower temperatures (10° C. or below) and with time, so that after long periods the switching of the whole display is affected at room temperature. This degradation in optical performance with time is an important factor in limiting the service life of the displays.

The aforementioned U.S. Pat. No. 6,831,769 teaches that the aforementioned degradation in performance is caused, at least in part, by changes in the volume resistivity of the lamination adhesive, and that this performance degradation of electrophoretic displays can be reduced or eliminated, and the service life of such displays increased, by using an adhesive the resistivity of which does not vary greatly with time; it appears that similar effects are produced in other types of electro-optic displays. The use of such an adhesive has also been found to improve the performance of the displays at low temperature, as manifested by improved reflectance in the light optical state of the display.

Accordingly, the aforementioned U.S. Pat. No. 6,831,769 describes electro-optic displays in which the composition of the lamination adhesive is controlled so that the optical characteristics of the display do not change rapidly with time, so that the displays have an improved operating lifetime. More specifically, this patent teaches that the lamination adhesive should possess one or more of the following characteristics:

(a) having a volume resistivity, measured at 10° C., which does not change by a factor of more than about 3 after being held at 25° C. and 45 percent relative humidity for 1000 hours;

(b) having a peel strength from an electrode material in contact with the lamination adhesive of at least about 2 lb/inch;

(c) the volume resistivity of the lamination adhesive changes by a factor of less than about 10 within a range of 10 to 90 percent relative humidity and over a temperature range of 10 to 50° C.;

(d) the lamination adhesive has a thickness in the range of about 10 to about 20 μm;

(e) the lamination adhesive has a shear modulus at 120° C. of not more than about 1 megaPascal;

(f) the product of the dielectric constant and the volume resistivity of the lamination adhesive is not greater than the product of the dielectric constant and the volume resistivity of the electro-optic medium within a range of 10 to 90 percent relative humidity and over a temperature range of 10 to 50° C.;

(g) comprising an ultra-violet stabilizer;

(h) comprising a light absorbing material;

(i) the product of the dielectric constant and the volume resistivity of the lamination adhesive is from about 0.01 to about 100 times the product of the dielectric constant and the volume resistivity of the suspending fluid;

(j) the ratio of the dielectric constant of the lamination adhesive to the dielectric constant of the suspending fluid within the temperature range of from 10 to 50° C. does not vary from this ratio at 25° C. by more than about 2 percent;

(k) the ratio of the volume resistivity of the lamination adhesive to the volume resistivity of the suspending fluid within the temperature range of from 10 to 50° C. does not vary from this ratio at 25° C. by more than a factor of about 100;

(l) the solubility of the suspending fluid in the lamination adhesive does not exceed about 1 percent weight/weight over the range of 10 to 50° C.; and (m) being substantially free from mobile species.

The aforementioned U.S. Pat. No. 6,831,769 further teaches that other problems known to occur in electro-optic displays, but which had not previously been explained, including degradation of the performance of the display with increasing temperature, even when the display is first produced, as manifested, inter alia, by a reduction in the contrast ratio of the display (the relative reflectance or optical transmission of the two extreme optical states of the display) with increasing temperature, the similar degradation of the performance of the display with increasing humidity, and the phenomenon known as "self-erasing" are all dependent upon the choice of lamination adhesive. Ota, I., et al., "Developments in Electrophoretic Displays", Proceedings of the SID, 18, 243 (1977), describes self-erasing in an unencapsulated electrophoretic display. When the voltage applied across certain electrophoretic displays is switched off, the electrophoretic medium may reverse its optical state, and in some cases a reverse voltage, which may be larger than the operating voltage, can be observed to occur across the electrodes. It appears (although this invention is in no way limited by this belief) that the self-erasing phenomenon is due to a mismatch in electrical properties between various components of the display. Obviously, self-erasing is highly undesirable in that it reverses (or otherwise distorts, in the case of a grayscale display) the desired optical state of the display. It has been found that all of these problems may be attributable, at least in part, to changes in the electrical properties of the lamination adhesive with various environmental conditions, and that all can be reduced or eliminated by careful selection of the properties of the lamination adhesives used.

In practice, a lamination adhesive layer having a uniform thickness of 10-50 μm and a conductivity of the order of 10-10 to 10-9 S/cm has been used in electro-optic displays. This conductivity range was chosen based upon electrical models for display performance, the known conductivities of various electro-optic materials and the pixel sizes typically used in such displays. This target conductivity range actually represents a compromise. More conductive lamination adhesives are desirable because higher conductivity means the electro-optic material layer sees a larger voltage gradient. However, as the conductivity of the lamination adhesive is increased at constant pixel resolution and storage capacitance, charge supplied to a pixel is leaked to neighboring pixels; this decreases the voltage gradient across the electro-optic material and counteracts the effect of increasing the lamination adhesive conductivity. In addition, as already mentioned this lateral charge leakage may cause a change in the optical state of neighboring pixels. It is desirable that the lamination adhesive be designed to provide good lateral voltage holding capability and that the gradient in voltage across the electro-optic material layer be maximized; therefore, development performance requirements for high resolution (100 to 200 lines per inch, 4 to 8 lines per mm) active matrix displays require that isotropically conductive adhesives have conductivities in the range specified above.

Furthermore, in considering the choice of a lamination adhesive for use in an electro-optic display, attention must be paid to the process by which the display is to be assembled. Most prior art methods for final lamination of electrophoretic displays are essentially batch methods in which the electro-optic medium, the lamination adhesive and the backplane are only brought together immediately prior to final assembly, and it is desirable to provide methods better adapted for mass production. The aforementioned U.S. Pat. No. 6,982,178 describes a method of assembling a solid electro-optic display (including a particle-based electrophoretic display) which is well adapted for mass production. Essentially, this patent describes a so-called "front plane laminate" ("FPL") which comprises, in order, a light-transmissive electrically-conductive layer; a layer of a solid electro-optic medium in electrical contact with the electrically-conductive layer; an adhesive layer; and a release sheet. Typically, the light-transmissive electrically-conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will be normally be viewed through the electrically-conductive layer and adjacent substrate (if present). The substrate will be typically be a polymeric film, and will normally have a thickness in the range of about 1 to about 25 mil (25 to 634 μm), preferably about 2 to about 10 mil (51 to 254 μm). The electrically-conductive layer is conveniently a thin metal oxide layer of, for example, aluminum or indium tin oxide (ITO), or may be a conductive polymer. Polyethylene terephthalate (PET) films coated with aluminum or ITO are available commercially, for example as "aluminized Mylar" ("Mylar" is a Registered Trade Mark) from E. I. du Pont de Nemours & Company, Wilmington Del., and such commercial materials may be used with good results in the front plane laminate.

Assembly of an electro-optic display using such a front plane laminate may be effected by removing the release sheet from the front plane laminate and contacting the adhesive layer with the backplane under conditions effective to cause the adhesive layer to adhere to the backplane, thereby securing the adhesive layer, layer of electro-optic medium and electrically-conductive layer to the backplane. This process is well-adapted to mass production since the front plane laminate may be mass produced, typically using roll-to-roll coating techniques, and then cut into pieces of any size needed for use with specific backplanes.

The aforementioned U.S. Pat. No. 6,982,178 also describes a method for testing the electro-optic medium in a front plane laminate prior to incorporation of the front plane laminate into a display. In this testing method, the release sheet is provided with an electrically conductive layer, and a voltage sufficient to change the optical state of the electro-optic medium is applied between this electrically conductive layer and the electrically conductive layer on the opposed side of the electro-optic medium. Observation of the electro-optic medium will then reveal any faults in the medium, thus avoiding laminating faulty electro-optic medium into a display, with the resultant cost of scrapping the entire display, not merely the faulty front plane laminate.

The aforementioned U.S. Pat. No. 6,982,178 also describes a second method for testing the electro-optic medium in a front plane laminate by placing an electrostatic charge on the release sheet, thus forming an image on the electro-optic medium. This image is then observed in the same way as before to detect any faults in the electro-optic medium.

The aforementioned 2004/0155857 describes a so-called "double release film" which is essentially a simplified version of the front plane laminate previously described. One form of the double release sheet comprises a layer of a solid electro-optic medium sandwiched between two adhesive layers, one or both of the adhesive layers being covered by a release sheet. Another form of the double release sheet comprises a layer of a solid electro-optic medium sandwiched between two release sheets. Both forms of the double release film are intended for use in a process generally similar to the process for assembling an electro-optic display from a front plane laminate already described, but involving two separate laminations; typically, in a first lamination the double release sheet is laminated to a front electrode to form a front sub-assembly, and then in a second lamination the front sub-assembly is laminated to a back-plane to form the final display.

In view of the advantages of the assembly method using a front plane laminate described in the aforementioned U.S. Pat. No. 6,982,178, it is desirable that a lamination adhesive be capable of being incorporated into such a front plane laminate. It is also desirable that a lamination adhesive be capable of being incorporated into a double release film as previously described.

This invention relates to materials and processes which are useful in the lamination and other operations in the manufacture of electro-optic displays. In particular, it has now been found that the performance of solid electro-optic displays can be improved by using a lamination adhesive having anisotropic conductivity, and in one aspect this invention relates to electro-optic displays comprising such an adhesive, to processes for forming layers of such adhesives and incorporating them into electro-optic displays, and to front plane laminates comprising such an adhesive. Since the materials and processes of the invention are especially, but not exclusively, intended for the lamination of encapsulated electrophoretic displays, they will primarily be described in connection with such displays, since any modifications and variations of the materials and processes of the present invention needed for use with other types of electro-optic displays will readily be apparent to those skilled in the manufacture of such displays.

However, the lamination adhesive is not necessarily the only polymeric component present between the electrodes in an electro-optic display. As described in, for example, the aforementioned U.S. Pat. No. 6,839,158, in an encapsulated electrophoretic display the electro-optic layer normally comprises, in addition to the electrophoretic capsules themselves, a polymeric binder which, upon drying or curing, serves to form the capsules into a mechanically coherent layer especially when, as this patent teaches is desirable, the capsules are present in the form of a monolayer of capsules. The binder is also present between the electrodes in the final display and hence also affect the electro-optic properties of the display. Indeed, to the extent that the binder lies closer to the capsules of an encapsulated electrophoretic display than does the lamination adhesive (which is typically separated from the internal phase by some thickness of binder), the binder may have a greater effect on the electro-optic properties of a display than the lamination adhesive. Similarly the continuous matrix of a rotating bichromal member medium, the continuous phase of a polymer-dispersed electrophoretic display and the wall material used in a microcell display (all of which essentially correspond to the binder of an encapsulated electrophoretic display, and all of which will hereinafter be considered binders) can have major effects on the electro-optic properties of the display. Accordingly, the present invention relates to electro-optic displays in which the properties of a binder are controlled to provide improved display performance.

The present invention thus seeks to provide an electro-optic display with a binder having optimal mechanical properties.

The present invention also seeks to provide an electro-optic display with a binder having optimal electrical properties.

In summary, the present invention seeks to provide a binder with combined manufacturing, mechanical, electrical, environmental, chemical and temporal stability properties optimally suited for use in electro-optic displays.

SUMMARY OF INVENTION

A first area of the present invention relates to electro-optic displays using an anisotropic lamination adhesive, processes for forming such lamination adhesives, and front plane laminates and double release films containing such lamination adhesives.

Accordingly, in one aspect this invention provides an electro-optic display comprising a layer of a solid electro-optic material, at least one electrode disposed adjacent the layer of electro-optic material, and a layer of a lamination adhesive interposed between the electro-optic material and the electrode, the lamination adhesive having a higher electrical conductivity in a direction perpendicular to the layer of lamination adhesive than in the plane of the layer.

In such an electro-optic display, the lamination adhesive desirably has a conductivity of less than about $10^{-10}$ S/cm. in the plane of the adhesive layer and a conductivity greater than about $10^{-9}$ S/cm. perpendicular to this plane. The lamination adhesive may comprise a plurality of conductive particles dispersed in a substantially non-conductive matrix. The conductive particles may have a conductivity greater than about $10^{-9}$ S/cm. and a diameter not greater than about one-tenth of the thickness of the layer of lamination adhesive. The conductive particles may be formed from a semiconducting polymer, or from a low conductivity material having a polar material adsorbed on its surface to increase its conductivity. The matrix may have a conductivity less than about $10^{-10}$ S/cm. and may comprise a gellable material, for example a thermally reversibly gellable polymer, a radiation-gellable material or a material which can be gelled by removal of a solvent therefrom. Alternatively, the lamination adhesive may comprise a plurality of magnetizable particles dispersed in a substantially non-magnetizable matrix. The magnetizable particles may comprise an iron oxide.

The electro-optic display of the present invention may use of any of the types of electro-optic material described above. Thus, the electro-optic material may be a rotating bichromal member, microcell, electrochromic or electrophoretic material. In a preferred embodiment of the invention, the electro-optic material is an encapsulated electrophoretic material.

This invention also provides a process for forming a layer of an anisotropic adhesive having greater conductivity perpendicular to the plane of the layer than in this plane, the process comprising: dispersing a plurality of conductive particles in an adhesive matrix, the particles having a complex conductivity differing from that of the matrix; applying to the particles/matrix mixture an electric or magnetic field effective to cause the particles to form conductive strands extending substantially perpendicular to the plane of the layer; and increasing the viscosity of the matrix to prevent the particles moving out of the strands.

In this process, the conductive particles may have a conductivity greater than about 10-9 S/cm. and a diameter not greater than about one-tenth of the thickness of the layer of lamination adhesive. The conductive particles may be formed from a semiconducting polymer, or from a low conductivity material having a polar material adsorbed on its surface to increase its conductivity. The matrix may have a conductivity less than about $10^{-10}$ S/cm. The particles may be magnetizable and the matrix substantially non-magnetizable, in which case the magnetizable particles may comprise an iron oxide. This process of the present invention may include laminating the layer of anisotropic adhesive formed to a layer of an electro-optic material.

This invention also provides an article of manufacture (a front plane laminate) comprising, in order:
 a light-transmissive electrically-conductive layer;
 a layer of a solid electro-optic medium in electrical contact with the electrically-conductive layer;
 a layer of an adhesive having a higher electrical conductivity in a direction perpendicular to the layer of lamination adhesive than in the plane of the layer; and
 a release sheet.

This invention provides an article of manufacture (a double release film) comprising:
 a layer of a solid electro-optic medium having first and second surfaces on opposed sides thereof;
 a first adhesive layer on the first surface of the layer of solid electro-optic medium;
 a release sheet disposed on the opposed side of the first adhesive layer from the layer of solid electro-optic medium; and
 a second adhesive layer on the second surface of the layer of solid electro-optic medium, at least one of the first and second adhesive layers having a higher electrical conductivity in a direction perpendicular to the adhesive layer than in the plane of the layer.

A second area of the present invention relates to electro-optic displays which use as binders the types of materials which the aforementioned U.S. Pat. No. 6,831,769 uses as lamination adhesives.

Accordingly, this invention provides an electro-optic display comprising a layer of a solid electro-optic material, and at least one electrode arranged to apply an electric field to the layer of electro-optic material, the layer of electro-optic material comprising a binder, the binder having a volume resistivity, measured at 10° C., which does not change by a factor of more than about 3 after being held at 25° C. and 45 percent relative humidity for 1000 hours.

In such an electro-optic display, desirably the volume resistivity of the binder measured at 10° C. does not change by a factor of more than about 2 after being held at 25° C. and 45 percent relative humidity for 1000 hours. Preferably, the volume resistivity of the binder measured at 10° C. does not change by a factor of more than about 1.5 after being held at 25° C. and 45 percent relative humidity for 1000 hours. It is desirable that the binder be essentially free from plasticizer, and that the binder exhibit a change in the enthalpy associated with any phase transition in the material, as measured by differential scanning calorimetry, that is not more than about 2 Joules per gram after being held at 25° C. and 45 percent relative humidity for 1000 hours. The binder may exhibit a change in dielectric constant of less than about 2 after being held at 25° C. and 45 percent relative humidity for 1000 hours.

Also, in such an electro-optic display, the binder may comprise a blend of at least two binder materials, at least one of which has a volume resistivity, measured at 10° C., which changes by a factor of more than 3 after being held at 25° C. and 45 percent relative humidity for 1000 hours. The binder may comprise at least one polyurethane, or a blend of at least two polyurethanes; in particular, the binder may comprise a blend of a non-ionically stabilized polyester-based polyurethane and an anionically stabilized polyester-based polyurethane. The binder may have a volume resistivity, measured at 10° C., of not more than about $3 \times 10^{10}$ ohm cm.

In such an electro-optic display, the electro-optic medium may comprise a rotating bichromal member, polymer-dispersed electrophoretic or microcell electrophoretic medium. Alternatively, the electro-optic medium may comprise an electrophoretic medium comprising a plurality of capsules, each capsule comprising a capsule wall and an internal phase encapsulated within the capsule wall, the internal phase comprising electrically charged particles suspended in a fluid and capable of moving through the fluid on application of an electric field to the electrophoretic material.

This invention also provides a microcavity electrophoretic display comprising a layer of a binder having a plurality of closed cavities formed therein, said cavities being at least partially filled with an electrophoretic medium comprising a plurality of electrically charged particles in a fluid and capable of moving therethrough on application of an electric field to the electrophoretic medium, the display further comprising at least one electrode arranged to apply an electric field to the electrophoretic medium, the binder being characterized by any one or more of the following:
 (a) having a volume resistivity, measured at 10° C., which does not change by a factor of more than about 3 after being held at 25° C. and 45 percent relative humidity for 1000 hours;
 (b) having a volume resistivity which changes by a factor of less than about 10 within a range of 10 to 90 percent relative humidity and over a temperature range of 10 to 50° C.;
 (c) having a shear modulus at 120° C. of not more than about 1 megaPascal;
 (d) the product of the dielectric constant and the volume resistivity of the binder is not greater than the product of the dielectric constant and the volume resistivity of the fluid within a range of 10 to 90 percent relative humidity and over a temperature range of 10 to 50° C.;
 (e) comprising an ultra-violet stabilizer;
 (f) the ratio of the dielectric constant of the binder to the dielectric constant of the fluid within the temperature range of from 10 to 50° C. does not vary from this ratio at 25° C. by more than about 2 percent;
 (g) the ratio of the volume resistivity of the binder to the volume resistivity of the fluid within the temperature range of from 10 to 50° C. does not vary from this ratio at 25° C. by more than a factor of about 100;
 (h) the solubility of the fluid in the binder does not exceed about 1 percent weight/weight over the range of 10 to 50° C.; and
 (i) the binder is substantially free from mobile species.

In such an electrophoretic display, the electro-optic medium may comprise a polymer-dispersed electrophoretic or microcell electrophoretic medium. Alternatively, the electrophoretic medium may comprise a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

This invention also provides an article of manufacture (a front plane laminate) for use in forming the aforementioned displays. This front plane laminate comprises, in order:

a light-transmissive electrically-conductive layer;

a layer of an electrophoretic medium in electrical contact with the electrically-conductive layer, the electrophoretic medium comprising a binder having a plurality of closed cavities formed therein, said cavities being at least partially filled with an electrophoretic internal phase comprising a plurality of electrically charged particles in a fluid and capable of moving therethrough on application of an electric field to the electrophoretic medium;

an adhesive layer; and a release sheet, the binder being characterized by any one or more of the following:

(a) having a volume resistivity, measured at 10° C., which does not change by a factor of more than about 3 after being held at 25° C. and 45 percent relative humidity for 1000 hours;

(b) having a volume resistivity which changes by a factor of less than about 10 within a range of 10 to 90 percent relative humidity and over a temperature range of 10 to 50° C.;

(c) having a shear modulus at 120° C. of not more than about 1 megaPascal;

(d) the product of the dielectric constant and the volume resistivity of the binder is not greater than the product of the dielectric constant and the volume resistivity of the fluid within a range of 10 to 90 percent relative humidity and over a temperature range of 10 to 50° C.;

(e) comprising an ultra-violet stabilizer;

(f) the ratio of the dielectric constant of the binder to the dielectric constant of the fluid within the temperature range of from 10 to 50° C. does not vary from this ratio at 25° C. by more than about 2 percent;

(g) the ratio of the volume resistivity of the binder to the volume resistivity of the fluid within the temperature range of from 10 to 50° C. does not vary from this ratio at 25° C. by more than a factor of about 100;

(h) the solubility of the fluid in the binder does not exceed about 1 percent weight/weight over the range of 10 to 50° C.; and (i) the binder is substantially free from mobile species.

In such a front plane laminate, the electrophoretic medium may comprise a polymer-dispersed electrophoretic or microcell electrophoretic medium. Alternatively, the electrophoretic medium may comprise a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

This invention also provides an article of manufacture (a double release film) for use in forming the aforementioned displays. This double release film comprises:

a layer of an electrophoretic medium having first and second surfaces on opposed sides thereof, the electrophoretic medium comprising a binder having a plurality of closed cavities formed therein, said cavities being at least partially filled with an internal phase comprising a plurality of electrically charged particles in a fluid and capable of moving therethrough on application of an electric field to the electrophoretic medium;

a first adhesive layer on the first surface of the layer of electrophoretic medium;

a release sheet disposed on the opposed side of the first adhesive layer from the layer of electrophoretic medium; and a second adhesive layer on the second surface of the layer of electrophoretic medium, the binder being characterized by any one or more of the following:

(a) having a volume resistivity, measured at 10° C., which does not change by a factor of more than about 3 after being held at 25° C. and 45 percent relative humidity for 1000 hours;

(b) having a volume resistivity which changes by a factor of less than about 10 within a range of 10 to 90 percent relative humidity and over a temperature range of 10 to 50° C.;

(c) having a shear modulus at 120° C. of not more than about 1 megaPascal;

(d) the product of the dielectric constant and the volume resistivity of the binder is not greater than the product of the dielectric constant and the volume resistivity of the fluid within a range of 10 to 90 percent relative humidity and over a temperature range of 10 to 50° C.;

(e) comprising an ultra-violet stabilizer;

(f) the ratio of the dielectric constant of the binder to the dielectric constant of the fluid within the temperature range of from 10 to 50° C. does not vary from this ratio at 25° C. by more than about 2 percent;

(g) the ratio of the volume resistivity of the binder to the volume resistivity of the fluid within the temperature range of from 10 to 50° C. does not vary from this ratio at 25° C. by more than a factor of about 100;

(h) the solubility of the fluid in the binder does not exceed about 1 percent weight/weight over the range of 10 to 50° C.; and; (i) the binder is substantially free from mobile species.

In such a double release film, the electrophoretic medium may comprise a polymer-dispersed electrophoretic or microcell electrophoretic medium. Alternatively, the electrophoretic medium may comprise a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

A third area of the present invention relates to front plane laminates and electro-optic displays comprising the lamination adhesives described in the aforementioned U.S. Pat. No. 6,831,769.

Accordingly, this invention provides an article of manufacture (a front plane laminate) comprising in order:

a light-transmissive electrically-conductive layer;

a layer of a solid electro-optic medium in electrical contact with the electrically-conductive layer;

an adhesive layer; and a release sheet, the adhesive layer being characterized by any one or more of the following:

(a) having a volume resistivity, measured at 10° C., which does not change by a factor of more than about 3 after being held at 25° C. and 45 percent relative humidity for 1000 hours;

(b) the volume resistivity of the adhesive changes by a factor of less than about 10 within a range of 10 to 90 percent relative humidity and over a temperature range of 10 to 50° C.;

(c) the adhesive has a shear modulus at 120° C. of not more than about 1 megaPascal;

(d) the product of the dielectric constant and the volume resistivity of the adhesive is not greater than the product of the dielectric constant and the volume resistivity of the electro-optic medium within a range of 10 to 90 percent relative humidity and over a temperature range of 10 to 50° C.;

(e) comprising an ultra-violet stabilizer;

(f) being substantially free from mobile species.

In such a front plane laminate, the electro-optic medium may comprise a rotating bichromal member, polymer-dispersed electrophoretic or microcell electrophoretic medium. Alternatively, the electro-optic medium may comprise an electrophoretic medium comprising a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

This invention also provides an article of manufacture (a front plane laminate) comprising in order:

a light-transmissive electrically-conductive layer;

a layer of an electrophoretic medium in electrical contact with the electrically-conductive layer, the electrophoretic medium comprising a plurality of electrically charged particles in a fluid and capable of moving therethrough on application of an electric field to the electrophoretic medium;

an adhesive layer; and a release sheet, the adhesive layer being characterized by any one or more of the following:

(a) the product of the dielectric constant and the volume resistivity of the adhesive layer is not greater than the product of the dielectric constant and the volume resistivity of the fluid within a range of 10 to 90 percent relative humidity and over a temperature range of 10 to 50° C.;

(b) the ratio of the dielectric constant of the adhesive layer to the dielectric constant of the fluid within the temperature range of from 10 to 50° C. does not vary from this ratio at 25° C. by more than about 2 percent;

(c) the ratio of the volume resistivity of the adhesive layer to the volume resistivity of the fluid within the temperature range of from 10 to 50° C. does not vary from this ratio at 25° C. by more than a factor of about 100; and (d) the solubility of the fluid in the adhesive layer does not exceed about 1 percent weight/weight over the range of 10 to 50° C.

In such a front plane laminate, the electrophoretic medium may comprise a polymer-dispersed electrophoretic or microcell electrophoretic medium. Alternatively, the electrophoretic medium may comprise a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

This invention also provides an article of manufacture (a double release film) comprising:

a layer of a solid electro-optic medium having first and second surfaces on opposed sides thereof;

a first adhesive layer on the first surface of the layer of solid electro-optic medium;

a release sheet disposed on the opposed side of the first adhesive layer from the layer of solid electro-optic medium; and a second adhesive layer on the second surface of the layer of solid electro-optic medium, at least one of first and second adhesive layers being characterized by any one or more of the following:

(a) having a volume resistivity, measured at 10° C., which does not change by a factor of more than about 3 after being held at 25° C. and 45 percent relative humidity for 1000 hours;

(b) the volume resistivity of the adhesive changes by a factor of less than about 10 within a range of 10 to 90 percent relative humidity and over a temperature range of 10 to 50° C.;

(c) the adhesive has a shear modulus at 120° C. of not more than about 1 megaPascal;

(d) the product of the dielectric constant and the volume resistivity of the adhesive is not greater than the product of the dielectric constant and the volume resistivity of the electro-optic medium within a range of 10 to 90 percent relative humidity and over a temperature range of 10 to 50° C.;

(e) comprising an ultra-violet stabilizer; and (f) being substantially free from mobile species.

In such a double release film, the electro-optic medium may comprise a rotating bichromal member, polymer-dispersed electrophoretic or microcell electrophoretic medium. Alternatively, the electro-optic medium may comprise an electrophoretic medium comprising a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

This invention also provides an article of manufacture (a double release film) comprising:

a layer of an electrophoretic medium having first and second surfaces on opposed sides thereof, the electrophoretic medium comprising a plurality of electrically charged particles in a fluid and capable of moving therethrough on application of an electric field to the electrophoretic medium;

a first adhesive layer on the first surface of the layer of electrophoretic medium;

a release sheet disposed on the opposed side of the first adhesive layer from the layer of electrophoretic medium; and a second adhesive layer on the second surface of the layer of electrophoretic medium, at least one of first and second adhesive layers being characterized by any one or more of the following:

(a) the product of the dielectric constant and the volume resistivity of the adhesive layer is not greater than the product of the dielectric constant and the volume resistivity of the fluid within a range of 10 to 90 percent relative humidity and over a temperature range of 10 to 50° C.;

(b) the ratio of the dielectric constant of the adhesive layer to the dielectric constant of the fluid within the temperature range of from 10 to 50° C. does not vary from this ratio at 25° C. by more than about 2 percent;

(c) the ratio of the volume resistivity of the adhesive layer to the volume resistivity of the fluid within the temperature range of from 10 to 50° C. does not vary from this ratio at 25° C. by more than a factor of about 100; and (d) the solubility of the fluid in the adhesive layer does not exceed about 1 percent weight/weight over the range of 10 to 50° C.

In such a double release film, the electrophoretic medium may comprise a polymer-dispersed electrophoretic or microcell electrophoretic medium. Alternatively, the electrophoretic medium may comprise a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

BRIEF DESCRIPTION OF DRAWINGS

FIGS. 17 and 18 list the reagents used to produce certain polyurethanes produced in Example 8 below.

DETAILED DESCRIPTION

Figure 1:
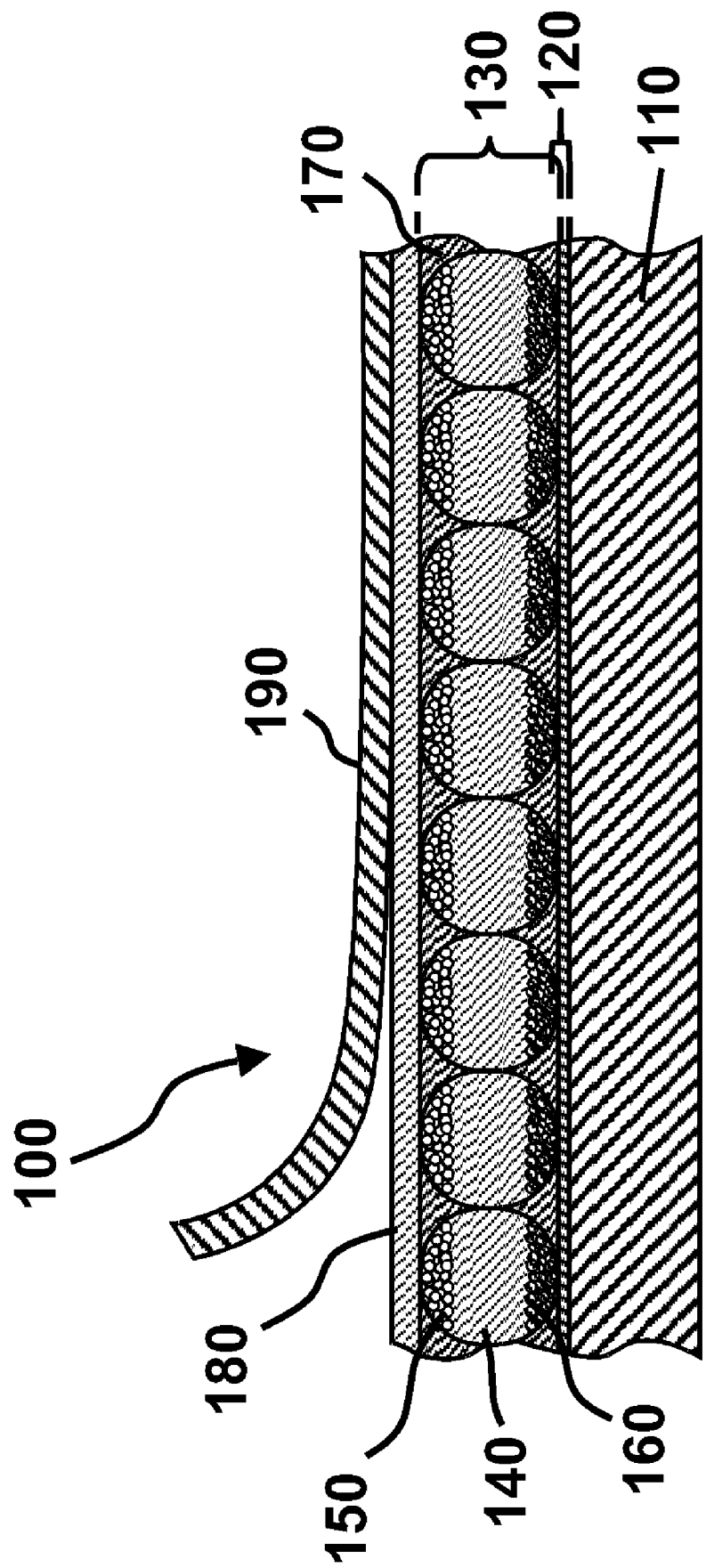
FIG. 1 is a schematic cross-section through a front plane laminate of the present invention.

As already indicated, there are three principal areas of the present invention, and each of these areas will primarily be described separately below. However, it should be recognized that more than one of the various parts of the present invention may be used in a single electro-optic display, front plane laminate or double release film. For example, an electro-optic display, front plane laminate or double release film may be provided with a lamination adhesive in accordance with one area of the present invention while its electro-optic layer may be an electrophoretic medium having a binder in accordance with a different area of the present invention.

Part A: Electro-Optic Displays and Components Using Anisotropic Lamination Adhesives, and Processes for the Production Thereof As already mentioned, the first part of this invention relates to electro-optic displays containing an adhesive having anisotropic conductivity, to processes for forming layers of such an adhesive, and to front plane laminates and double release films containing such an adhesive.

Before describing this part of the present invention in detail, it is considered desirable to explain in more detail the processes in which a lamination adhesive is used in the manufacture of an electro-optic display. As already explained, in a typical process, two subassemblies are first manufactured, one subassembly comprising an electro-optic layer and a first substrate, and the second comprising a second substrate; at least one of the subassemblies, and typically both, comprise an electrode. Also as already indicated, in one common form of such a process, used for manufacturing an active matrix display, one subassembly comprises a substrate, a single continuous ("common") electrode which extends across multiple pixels, and typically the whole, of the display, and the electro-optic layer, while the second assembly (usually referred to as the "backplane") comprises a substrate, a matrix of pixel electrodes, which define the individual pixels of the display, and non-linear devices (typically thin film transistors) and other circuitry used to produce on the pixel electrodes the potentials needed to drive the display (i.e., to switch the various pixels to the optical states necessary to provide a desired image on the display). The lamination adhesive is provided between the first and second subassemblies and adheres them together to form the final display.

In theory, if one could find a lamination adhesive with the necessary physical and mechanical properties, one could bring the two assemblies and the lamination adhesive together and form the display in a single operation, for example by feeding the three components from separate rolls and performing the lamination on a roll-to-roll basis. However, in the present state of the art this is not practicable, and normally the lamination adhesive is first applied to one of the two subassemblies, and thereafter the subassembly/adhesive combination is laminated to the other subassembly to form the final display. The lamination adhesive may be applied to either subassembly, but in general it is preferred that it be applied to the subassembly containing the electro-optic medium. As already mentioned, certain electro-optic media can be applied by printing or coating techniques on rigid or flexible substrates, and hence can be applied to flexible substrates, such as polymeric films, inexpensively by roll-to-roll processes. As discussed in the aforementioned U.S. Pat. No. 6,982,178, coating an electro-optic medium on to a flexible substrate in this manner, then covering the electro-optic medium with a lamination adhesive and a release sheet, provides a so-called "front plane laminate" which can then be cut as desired to produce portions suitable for lamination to a wide variety of backplanes. Applying the lamination adhesive to the backplane tends to be less convenient (although the present invention does not exclude this possibility), since in the present state of technology most backplanes are prepared on rigid substrates which are in the form of individual sheets less convenient for coating.

Regardless of which subassembly receives the lamination adhesive, there are two main variants of the adhesive application process, namely direct and indirect processes. Lamination adhesives are typically supplied as liquid or semi-solid solutions or dispersions, which need to be converted (either by removal of a solvent or dispersant or by some other form of curing) to a substantially solid layer before the actual lamination. In a direct process, the lamination adhesive is applied directly to one subassembly and converted to the solid layer thereon. In an indirect process, the lamination adhesive is applied to a release sheet, converted to a solid layer on this release sheet, and then transferred, typically using heat and/or pressure, to one subassembly. Finally, the release sheet is removed from the solid layer of lamination adhesive before the final lamination to the other subassembly. In general, indirect methods are preferred over direct, since many commercial lamination adhesives contain relatively mobile species, such as organic solvents and/or free monomers, which may adversely affect either the electro-optic medium or the circuitry of the backplane, depending upon the subassembly to which the adhesive is applied. An indirect process, by permitting these relatively mobile species to be removed by drying or similar processes while the lamination adhesive is still on the release sheet, avoids the adverse effects of bringing these relatively volatile materials into contact with the electro-optic medium or circuitry of the backplane.

A preferred lamination process of the present invention will now be described, though by way of illustration only, with reference to FIG. 1 of the accompanying drawings, which is a schematic section through one subassembly (a front plane laminate, or FPL) used in a process of the present invention, this subassembly comprising a substrate, a conductive layer, an electro-optic layer and an adhesive layer, the subassembly being illustrated at an intermediate stage of the process before this subassembly is laminated to a second subassembly.

The front plane laminate (generally designated 100) shown in FIG. 1 comprises a light-transmissive substrate 110, a light-transmissive electrode layer 120 (note that this is not the electrode lying on the opposed side of the lamination adhesive from the electro-optic layer in the final electro-optic display), an electro-optic layer 130, a lamination adhesive layer 180 and a release sheet 190; the release sheet is illustrated in the process of being removed from the lamination adhesive layer 180 preparatory to lamination of the FPL 100 to a backplane.

The substrate 110 is typically a transparent plastic film, such as a 7 mil (177 μm) poly(ethylene terephthalate) (PET) sheet. The lower surface (in FIG. 1) of substrate 110, which forms the viewing surface of the final display, may have one or more additional layers (not shown), for example a protective layer to absorb ultra-violet radiation, barrier layers to prevent ingress of oxygen or moisture into the final display, and anti-reflection coatings to improve the optical properties of the display. Coated on to the upper surface of substrate 110 is the thin light-transmissive electrically conductive layer 120, preferably of ITO, which acts as the common front electrode in the final display. PET films coated with ITO are available commercially.

The electro-optic layer 130 may be deposited on the conductive layer 120, typically by slot coating, the two layers being in electrical contact. The electro-optic layer 130 shown in FIG. 1 is an encapsulated electrophoretic medium and comprises microcapsules 140, each of which comprises negatively charged white particles 150 and positively charged black particles 160 in a hydrocarbon-based fluid 165. The microcapsules 140 are held retained within a polymeric binder 170. Upon application of an electrical field across electro-optic layer 130, white particles 150 move to the positive electrode and black particles 160 move to the negative electrode, so that electro-optic layer 130 appears, to an observer viewing the display through substrate 110, white or black depending on whether conductive layer 120 is positive or negative relative to the adjacent pixel electrode in the backplane.

The FPL 100 is desirably prepared by coating the lamination adhesive 180, in liquid form, conveniently by slot coating, on to release sheet 190, drying (or otherwise curing) the adhesive to form a solid layer and then laminating the adhesive and release sheet to the electro-optic layer 130, which has previously been coated on to the substrate 110 bearing the conductive layer 120; this lamination may conveniently be effected using hot roll lamination. (Alternatively, but less desirably, the lamination adhesive may be applied over the electro-optic layer 130 and there dried or otherwise cured before being covered with the release sheet 190.) The release sheet 190 is conveniently a 7 mil (177 μm) film; depending upon the nature of the electro-optic medium used, it may be desirable to coat this film with a release agent, for example a silicone. As illustrated in FIG. 1, the release sheet 190 is peeled or otherwise removed from the lamination adhesive 180 before the FPL 100 is laminated to a backplane (not shown) to form the final display.

The front plane laminate 100 is illustrated in FIG. 1 in a general form which may be used in all areas of the present invention. When the FPL 100 is to be used in the first area of the invention, it has an anisotropic adhesive layer 180, this adhesive layer 180 having a greater conductivity perpendicular to the plane of the layer (i.e., along the thickness of the layer) than in the plane of the layer.

For further details regarding front plane laminates and processes for the preparation and use thereof, the reader is respectfully directed to the aforementioned U.S. Pat. No. 6,982,178.

Figure 2:
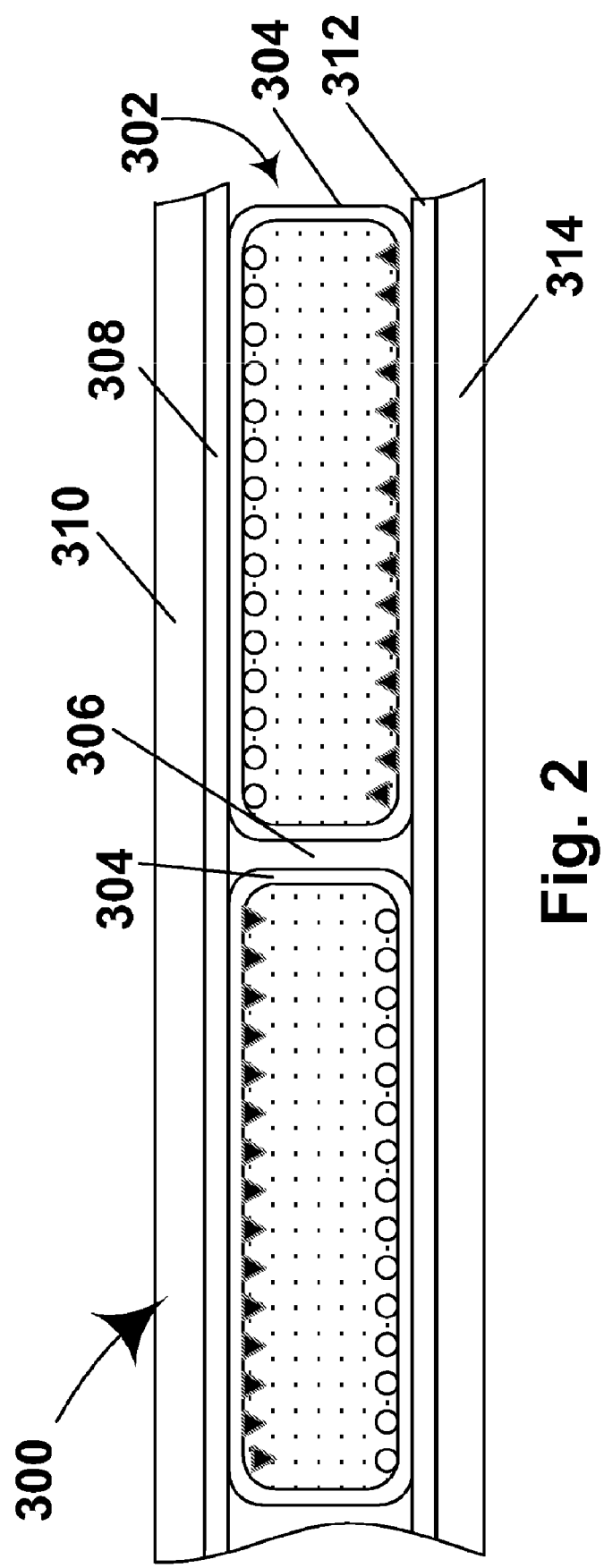
FIG. 2 is a schematic cross-section through a double release film of the present invention.

A preferred double release sheet (generally designated 300) of the present invention is shown in FIG. 2 of the accompanying drawings. Again, this double release sheet 300 is illustrated in FIG. 2 in a general form which may be used in all area of the present invention. The double release sheet 300 comprises a central layer 302 of electro-optic material, specifically in FIG. 2 a layer comprising capsules 304 in a polymeric binder 306. The capsules 304 may be similar to those described above with reference to FIG. 1. The sheet 300 further comprises a first adhesive layer 308, a first release sheet 310 covering the first adhesive layer 308, a second adhesive layer 312 disposed on the opposed side of the layer 302 from the first adhesive layer 308, and a second release sheet 314 covering the second adhesive layer 312.

The sheet 300 may be formed by first coating a the release sheet 310 with a layer of adhesive which is then dried or cured to form the first adhesive layer 308. Next, a mixture of the capsules 304 and binder 306 is printed or otherwise deposited on the first adhesive layer 308, and then the mixture is dried or cured to form a coherent layer 302. Finally, a layer of adhesive is deposited over the layer 302, dried or cured to form the second adhesive layer 312, and covered by the second release sheet 314.

It will be apparent to those skilled in coating technology that this sequence of operations used to form the sheet 300 is well adapted for continuous production and that, by careful choice of materials and process conditions, it may be possible to carry out the entire sequence of operations in a single pass through conventional roll-to-roll coating apparatus.

To assemble a display using a double release film such as the film 300, one release sheet (typically that on to which the electro-optic material was coated) is peeled away, and the remaining layers of the double release film are attached to a front substrate using, for example a thermal, radiation, or chemically based lamination process. Typically, the front substrate will include a conductive layer which will form the front electrode of the final display. The front substrate may include additional layers, such as an ultra-violet filter or a protective layer intended to protect the conductive layer from mechanical damage. Thereafter, the other release sheet is peeled away, thereby exposing the second adhesive layer, which is used to attach the electro-optic material coating assembly to a backplane. Again, a thermal, radiation, or chemically based lamination process may be used. It will be appreciated that the order of the two laminations described is essentially arbitrary and could be reversed, although it practice it is almost always more convenient to laminate the double release film to the front substrate first, and thereafter to laminate the resulting front subassembly to the backplane.

In accordance with the first area of the present invention, either or both of the adhesive layers 308 and 312 may be formed from an anisotropic adhesive having greater conductivity perpendicular to the plane of the adhesive layer than in this plane. In practice, it is typically preferred to form only the adhesive layer which will be laminated to the backplane from an anisotropic adhesive, using a conventional isotropic adhesive for the adhesive layer which will be laminated to the front substrate. For reasons discussed above, the use of an anisotropic adhesive is especially useful adjacent a backplane in preventing cross-talk between adjacent electrodes in the backplane. The strand-containing anisotropic adhesives formed by the processes of the first area of the present invention may be somewhat less transparent than conventional isotropic adhesives, but this is typically not a problem when such adhesives are used between the backplane and the electro-optic medium; most solid electro-optic media are essentially opaque, so that an adhesive layer adjacent the backplane is not visible to an observer viewing the display through the front substrate. On the other hand, since the front substrate typically carries a single continuous electrode, cross-talk is not usually a problem, whereas reduced transparency may be, since an adhesive layer adjacent the front substrate is visible to an observer viewing the display through the front substrate.

For further details regarding double release films and processes for the preparation and use thereof, the reader is respectfully directed to the aforementioned 2004/0155857.

As already mentioned, the first area of the present invention relates to the use of an anisotropic lamination adhesive having a conductivity which is greater in the direction from the electrode to the electro-optic material (i.e., perpendicular to the thickness of the layer of lamination adhesive) than in the plane of this layer. Such an anisotropic adhesive produces only a small voltage drop between the electrode and the electro-optic material (thus allowing as large an electric field as possible across the layer of electro-optic material) while presenting high resistance to current flow between adjacent electrodes, and thus minimizing cross-talk between adjacent pixels of a display.

The lamination adhesive used in the present invention is typically a hot melt adhesive, but can also be a thermosetting, radiation curable, or pressure sensitive adhesive. The adhesive may be based upon ethylene vinyl acetate, acrylic, polyolefin, polyamide, polyester, polyurethane, silicone, epoxy, polyvinyl butyrate, polystyrene-butadiene or vinyl monomers or oligomers. To provide the necessary anisotropic conductivity, the adhesive may be loaded with conductive particles, for example carbon particles, silver particles, plated polymer spheres, plated glass spheres, indium tin oxide particles, or nano-phase indium tin oxide particles. Alternatively, conductive polymers such as polyacetylene, polyaniline, polypyrrole, poly(3,4-ethylenedioxythiophene) (PEDOT), or polythiophene can be used to dope the polymer and cause it to conduct well in the z-axis direction (perpendicular to the thickness of the layer of adhesive) but not in the plane of this layer. In order to make these films, the adhesive sheet can be cast and then stretched in one or both axes to introduce the necessary anisotropic conductivity. Various types of anisotropic adhesives are described in U.S. Pat. Nos. 6,365,949; 5,213,715; and 4,613,351, and anisotropic adhesives are available commercially, for example from Minnesota Mining and Manufacturing Corporation ("3M"), Henkel Loctite Corporation, 1001 Trout Brook Crossing, Rocky Hill Conn. 06067, Btech Corporation, 8395 Greenwood Drive, Longmont Colo. 80503, and Dana Enterprises International, 43006 Osgood Road, Fremont Calif. 94539.

It is generally preferred that the anisotropic adhesive used in the present invention have a conductivity of less than about $10^{-10}$ S/cm. in the plane of the adhesive layer and a conductivity greater than about $10^{-9}$ S/cm. in a the z-axis direction.

However, it appears that the commercially available anisotropic adhesives are not well adapted for use in high resolution active matrix electro-optic displays having resolutions of 150 lines per inch (approximately 6 lines per mm) or more. According to the manufacturers' technical literature, most if not all currently commercially available anisotropic adhesives consist of randomly dispersed metal-coated polymer or metallic particles in a high resistivity adhesive matrix, so that these materials are isotropic, low conductivity films prior to application of z-axis pressure to introduce the desired anisotropy. The volume fraction of the metal or metal-coated particles is low enough that the particles do not percolate, and therefore, do no electrically short the adhesive in any direction. High z-axis conductivity is achieved when pressure is applied in the z-axis direction, and through either a reduction of the film thickness to less than the particle size or local increases in particle volume fraction (due to flow of the adhesive matrix into intentional voids or gaps in the substrate geometry), the particles make mechanical contact between the two substrates and therefore provide conductive paths in the z-axis direction. Generally, these types of adhesive films are designed to be compressed to a thickness close to the diameter of a conductive particle, i.e., conductive paths span only a single particle. Therefore, the particle size distribution and loading determine a minimum lateral spacing required between conductive features, corresponding to the spacing between pixels in an active matrix display. The smallest particulate adhesive available from 3M contains 6 μm particles and the technical literature advises a minimum gap of 35 μm between laterally adjacent conductive features to ensure that lateral shorting does not occur. It may be difficult to apply the z-axis compression necessary to introduce anisotropy into such adhesives without risk of damage to some types of electro-optic materials, for example encapsulated electrophoretic materials. More importantly, high resolution active matrix displays with a resolution of about 160 lines per inch have gaps between neighboring pixels of only about 6 μm. Thus, the commercially available products appear to be inadequate for use in such displays and simply scaling down the particle size in these materials will not yield a suitable anisotropic adhesive.

To avoid these problems with the commercial materials, the first area of the present invention provides a process for forming a layer of an anisotropic adhesive having greater conductivity perpendicular to the plane of the layer than in this plane. The process comprises dispersing a plurality of conductive particles in an adhesive matrix, the particles having a complex conductivity differing from that of the matrix; applying to the particles/matrix mixture an electric or magnetic field effective to cause the particles to form conductive strands extending substantially perpendicular to the plane of the layer; and increasing the viscosity of the matrix (typically by gelling or curing the matrix) to prevent the particles moving our of the strands.

Figure 3B:
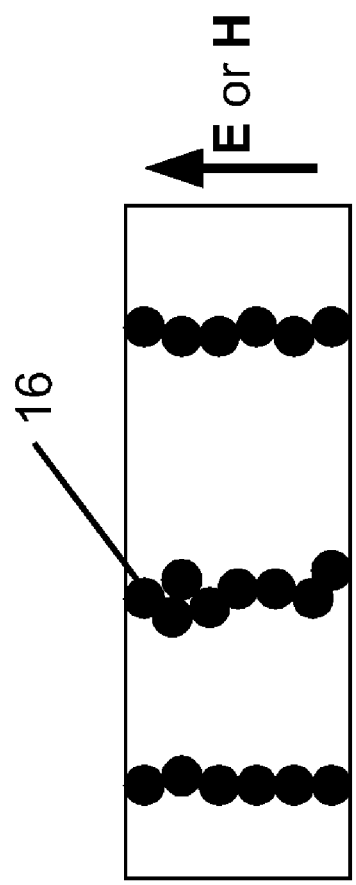
FIGS. 3A and 3B are schematic cross-sections through an adhesive layer at two successive stages of the process of the present invention.
Figure 3A:
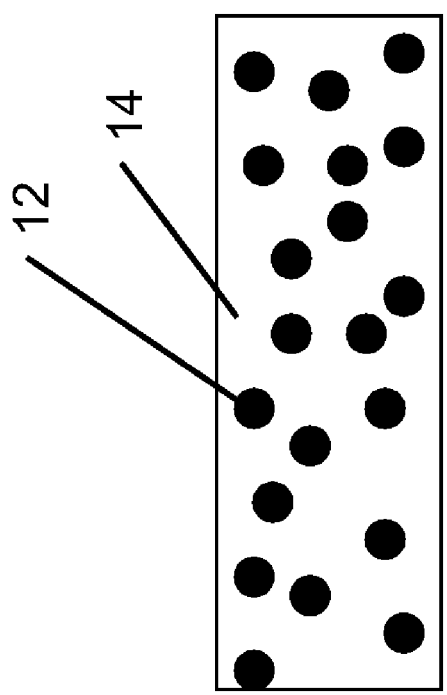

The use of electrorheological and magnetorheological effects to produce anisotropically conductive films by the process of the present invention is illustrated in a highly schematic manner in FIGS. 3A and 3B of the accompanying drawings. The electrorheological (ER) effect is an effect by which application of an electrical field across a particulate dispersion, e.g., a dispersion contained between parallel plate electrodes, causes the particles composing the dispersion to form into strands or acicular agglomerates. As shown in FIG. 3A, the process begins by forming a layer of conductive particles 12 dispersed in a matrix (continuous phase) of a lamination adhesive 14. An electric or magnetic field is applied perpendicular to the plane of the layer, thereby causing the particles 12 to form strands 16 extending through the thickness of the layer, as illustrated in FIG. 3B. Finally, the viscosity of the matrix 14 is greatly increased, typically by gelling or curing the matrix, to prevent further movement of the particles 12 through the matrix 14, and thus lock the strands 16 in place.

Formation of strands parallel to the electric field lines occurs when the complex conductivity (k*) of the particles is significantly higher than that of the matrix. In a preferred process of the present invention, the precursor adhesive (as shown in FIG. 3A) consists of relatively high conductivity particles, $kp > 10^{-9}$ S/cm, dispersed in a low conductivity matrix, $kp < 10^{-11}$ S/cm. The particles are aligned in the z-axis direction by application of an electric field across the dispersion, and the resultant z-axis strands are locked in place by curing or gelling the matrix. The final adhesive film then contains conductive strands spanning or percolating only in the z-axis direction because strands are spaced laterally and therefore separated by the low conductivity matrix. Z-axis conduction will be dominated by the conductivity of the strands and therefore by the particle conductivity, while lateral conductivity will be dominated by that of the continuous low conductivity matrix.

This method is particularly well-suited for preparing continuous thin films of a z-axis lamination adhesive. For example, continuous thin film z-axis conductive adhesives can be prepared by feeding a well mixed dispersion of conductive particles in a low conductivity adhesive matrix into a coating die, and coating the dispersion into a thin film, typically 10-100 μm thick, followed by application of the electric field and curing or gelling.

A magnetorheological process for producing a z-axis conductive adhesive is similar to the electrorheological process; magnetic particles are dispersed in a non-magnetic adhesive matrix, the particles are aligned into strands in the z-axis direction by application of a magnetic field, and the strands are locked in by curing or gelling of the matrix. In this case, the particles need to be both magnetically polarizable and to have a conductivity in the range described above, typically greater than 10-9 S/cm. The range of particles meeting these requirements for the magnetorheological process is perhaps more limited than the range of particles suitable for the electrorheological process, but a magnetorheological process is of interest because application of the magnetic field across the layer does not require making electrical contact with the surface of the layer, and thus an aqueous based adhesive matrix can be used, which is typically not the case with the electrorheological process.

In lamination adhesive compositions for use in the electrorheological process of the present invention, the conductive particles desirably have a conductivity greater than 10-9 S/cm, and a diameter not greater than about ⅒ of the thickness of the final film. (The term "diameter" is used herein to include what is usually known as the "equivalent diameter" of a non-spherical particle, namely the diameter of a spherical particle having the same volume as the non-spherical one.) The particles can be formed from semiconducting polymers, for example acidically doped polyanilines, polythiophenes, and pyrolyzed polyacrylonitriles. The particles may alternatively be formed from low k* materials that are "activated" (raised) to higher k* (relative to that of the matrix) by addition of trace amount of a polar material, for example water or ethylene glycol, that adsorbs primarily on the surface of the particles. Suitable low k* materials include cellulosic materials, and various aluminas, silicates, and zeolites. The matrix (continuous phase) should have a low conductivity relative to that of the particles, this low conductivity preferably being less than $10^{-10}$ S/cm. Many low-conductivity, low-viscosity oils, such as the hydrocarbons used as the fluids in many encapsulated electrophoretic media may be suitable; however the matrix must also behave as an adhesive, and be gellable or curable to lock in the z-axis strands formed in the process. For example thermally reversible gelling materials such as Kraton (Registered Trade Mark) rubbers (block copolymers) may be particularly advantageous as a continuous phase, alone or in combination with a diluent to lower viscosity for coating and particle alignment. Typical non-aqueous pressure sensitive adhesives like polyacrylate solutions, or succinate-functionalized hydrocarbon polymers, for example ethylene propylene copolymers, or silicone rubber type adhesives, may also be used. For gelling type matrices, coating and particle alignment occurs under conditions where the material is not gelled, and then after formation of the strands, the matrix is gelled, for example by lowering the temperature or cross-linking the matrix by addition or removal of a chemical component or reactant or exposure to an ultra-violet light source. For solvent based non-aqueous adhesives, the strands can be locked in position by rapidly evaporating the solvent.

The magnetorheological process of the present invention may use any of the types of matrices discussed above, since the magnetorheological process differs from the electrorheological process only in the formation of the strands by magnetic field alignment instead of electric field alignment. However, since the magnetorheological process can make use of aqueous matrices as well as non-aqueous ones, polyurethane adhesives, gelatin, or other aqueous continuous phases may also be used. Particles suitable for use in the magnetorheological process include iron and other magnetizable materials, such as nickel and carbonyl iron; these materials are generally supplied in particle sizes greater than 1-10 μm, which may not be optimal for preparing thin films of adhesive, but they may be milled to smaller sizes for use in the present process. Iron oxides, such as $\gamma$-$Fe_2O_3$ materials used in the magnetic recording industry, are typically supplied in much smaller particle sizes, around 10-100 nm, and may therefore be used as supplied in the preparation of thin films.

The criteria for particles to be used in the magnetorheological process of the present invention differ somewhat from most other applications of magnetorheological particles.

The present process does not require strong saturation magnetization, a typical criterion for choosing particles for a magnetorheological fluid, but in the present process the particles should be conductive enough to satisfy the z-axis conductivity range outlined above.

The processes of the first area of the present invention provide an anisotropically conductive lamination adhesive film having high z-axis conductivity gelled or locked into the film. This film can then be laminated to the electro-optic material and ultimately to an active matrix backplane, under conditions where the anisotropic conductivity of the adhesive is maintained because the film never undergoes large scale flow (with respect to strand length) during the lamination processes.

Some processes of the first area of the present invention allow production of an anisotropically conductive lamination adhesive the z-axis conductivity of which can be orders of magnitude greater than the lateral conductivity. This type of adhesive maximizes the electric field gradient across the electro-optic material (and therefore maximizes the switching speed and/or electro-optical properties for a given impulse of the electro-optic material) while eliminating or minimizing lateral charge leakage between neighboring pixels, thus allowing improved electro-optic display performance from any given electro-optic material. In addition, since the z-axis conductivity is much greater than the lateral conductivity, displays which exhibit temperature and humidity sensitivity should exhibit less sensitivity than corresponding displays employing isotropic lamination adhesives, thus enabling such displays to operate under a wider range of environmental conditions.

Any anisotropic z-axis conductive adhesive based upon conductive strands or similar conductive regions within an essentially non-conductive matrix needs to have sufficient strands or conductive regions per unit area for each pixel of the electro-optic material with which the adhesive is used to experience a substantially uniform or homogeneous electric field over its entire area, or undesirable optical effects may occur. The processes of the present invention provide great flexibility in adjusting strand density per unit area, for example by altering conductive particle size, volume fraction of conductive particles, and the intensity and duration of the aligning field, thereby allowing the fine structure of the anisotropic adhesive to be varied.

Typically, the processes of the first area of the present invention will be carried out using sub-micron conductive particles. Sub-micron particles have hitherto not been regarded as an advantageous size range for electrorheological and magnetorheological fluids because as particle size decreases Brownian motion increases and this motion tends to disrupt or weaken structures formed from the conductive particles. However, two aspects of the processes of the present invention reduce such problems. Firstly, continuous phases can be used having relatively high viscosity compared to those typically used for electrorheological and magnetorheological applications and the high viscosity acts to decrease Brownian motion. Secondly, the present processes need only provide an anisotropic strand structure, not such a structure having high shear strength, since once the strand structure is formed, it can be locked in place by gelling or curing the polymer matrix, and after such gelling or curing the shear strength of the strand structure is no longer an issue.

Consideration will now be given to matters specific to the manufacture of electro-optic displays using encapsulated electrophoretic materials. It should be noted that the considerations discussed below apply to the manufacture of all encapsulated electrophoretic displays of the present invention, not only those using anisotropic adhesives. There are a number of important areas which need to be considered, including dewatering of the capsules, the binder/solids ratio in the final electrophoretic medium, lamination processes and materials, planarization and capsule size uniformity. Each of these areas is discussed in more detail below.

As already indicated, typically encapsulated electrophoretic media consist of a dispersion of capsules in a polymeric binder. The capsules contain an electrophoretically active suspension (internal phase). The dispersion is typically coated on to a front electrode on a flexible polymeric substrate, preferably achieving a substantially close-packed monolayer of microcapsules (see the aforementioned U.S. Pat. No. 6,839,158). This coated film is then laminated to a rear substrate previously patterned in a single or multi-layer electrode structure. The following discussion relates to materials and processes for the lamination step in such a process in the construction of an encapsulated electrophoretic display, although certain of these materials and processes may be used in the manufacture of any electro-optic display where the joining of a front active surface to a rear electrode substrate is desired.

The encapsulation process produces a capsule slurry, which is typically dewatered to achieve a target solids content; such dewatering can be achieved through centrifugation, absorption, evaporation, mesh filtration, or osmotic separation. After dewatering, the slurry is typically mixed with a polymeric binder (normally in the form of a polymer latex), for example an aqueous polyurethane dispersion. This slurry of capsules in binder is then agitated to ensure uniform distribution of the binder material. It has been found that in order to encourage close packing of the capsules in the monolayer film, the binder solids to capsule solids ratio should be kept as low as possible. Minimizing the amount of non-optically active material (such as binder) allows the highest possible contrast ratio between the white and dark states (or other extreme optical states) of the final display. However, the binder is present in the electrophoretic medium to provide structural integrity, and the optimum amount of binder is therefore a compromise between reducing the amount of binder to improve optical properties and increasing the amount of binder for structural integrity. It has been found that the optimal binder solids to capsule mass ratio is typically in the range of 1:2 and 1:20, preferably between 1:4 and 1:12, and most desirably between 1:6 and 1:10. These ratios also apply to the polymer matrix content in a polymer-dispersed electrophoretic display of the type previously described.

The slurry of microcapsules in aqueous binder is then coated down into a film, preferably one containing a monolayer of capsules, by any convenient process, such as by metering through a slot die coating head. To produce the structure shown in FIG. 1, the slurry is generally coated onto an ITO layer previously formed on a polyester substrate, which will ultimately serve as the front transparent electrode and front substrate. The resultant capsule film is dried through evaporation of the aqueous phase, typically at 60° C.

To produce the final display, the dried capsule film is laminated to a rear electrode structure, which may be of the type described in, for example, the aforementioned U.S. Pat. Nos. 6,232,950 and 6,445,374, and consist of a multi-layer conductor/insulator stack printed on the substrate. The conductors used are typically conductive particle (i.e. carbon, silver, palladium, tin oxide, doped tin oxide, copper) doped polyesters and vinyl polymers which are screen printed and heat cured. Alternatively, the rear electrode structure may be an active matrix backplane, as described for example in the aforementioned U.S. Pat. Nos. 7,030,412 and 6,825,068.

There are several possible processes to join the dried film with the rear electrode structure. In one such process, the dried film is used as prepared and laminated directly to the rear substrate, which has electrodes on the topmost layer. This lamination is performed with heat and pressure, typically supplied by a vacuum chamber.

However, films prepared by this process are susceptible to several flaws. As discussed above, the binder level in the dried film is kept as low as possible to maximize optically active area, which means that there is very little binder to flow and absorb the stresses of the lamination pressure. The capsule wall bears the brunt of these stresses, which can result in capsule breakage. Additionally, with little plastic material to flow into the voids between capsules, the resulting film may have trapped air or trapped vacuum pockets, either of which can both change the mechanical stresses experienced by the film and affect the electrical characteristics, which may result in non-uniform switching of the final display.

In an alternative process, an additional insulator layer is provided as the topmost layer of the rear electrode structure, i.e., the layer which directly contacts the dried film during the lamination process. This insulator layer is preferably an adhesive which can flow at the lamination temperature. For example, it could be a polymeric material identical or similar to that of the binder material, or it could be a hot melt adhesive sheet, which could be thermoplastic or thermosetting. Alternatively, it could be a material which is initially in liquid form at room temperature but forms a solid matrix after curing or cross-linking. Such insulator layers provide a flowable material which can fill in any voids between capsules and smooth out the roughness of the exposed surface of the dried film during the lamination process without putting undue stresses on the capsule walls themselves.

In another alternative process, an additional adhesive layer is initially coated on to the dried film (i.e. on to the exposed surface of the capsules) before the lamination procedure. This additional adhesive layer serves to planarize the capsule film and provide a tacky surface to facilitate the lamination. This process has advantages in that the dried film will then be planarized before the lamination, and there is no need to store tacky front and rear substrates separately, since only the front substrate (i.e., the dried film) will be tacky. The thickness of the planarization layer (or the adhesive layer on the rear substrate) can be reduced by using more uniform capsules. It has been found that capsules which are mostly monodispersed are most efficient in that they require the smallest thickness of planarization layer.

Turning to consideration of the lamination process itself, it will be seen that in the fabrication of electrophoretic devices an effective lamination process is essential. Several types of lamination process may be are used for this purpose, including batch unit operations.

As already indicated, the lamination process typically involves bringing the two electrodes and the dried capsule-containing layer together, followed by a heated pressing process. The pressing process may be either in a vacuum bagging operation or in a bladder press, the objective in either case being the close contact of thermoplastic layers of resin, with the exclusion and expulsion of entrapped air bubbles. For effective void-free lamination, all air spaces must be filled by resin during this heated pressing process. The flow properties of the resins, even at the moderately elevated temperatures reached during lamination and cure, may not be adequate for void filling.

This problem may be mitigated by the use of thickened liquid resins capable of cure by externally applied radiation, for example, by the use of an ultra-violet curing system. With carefully controlled irradiation and cure kinetics, rear electrode assemblies opaque to radiation may be effectively laminated to front electrodes bearing a dried capsule-containing layer.

Figure 4:
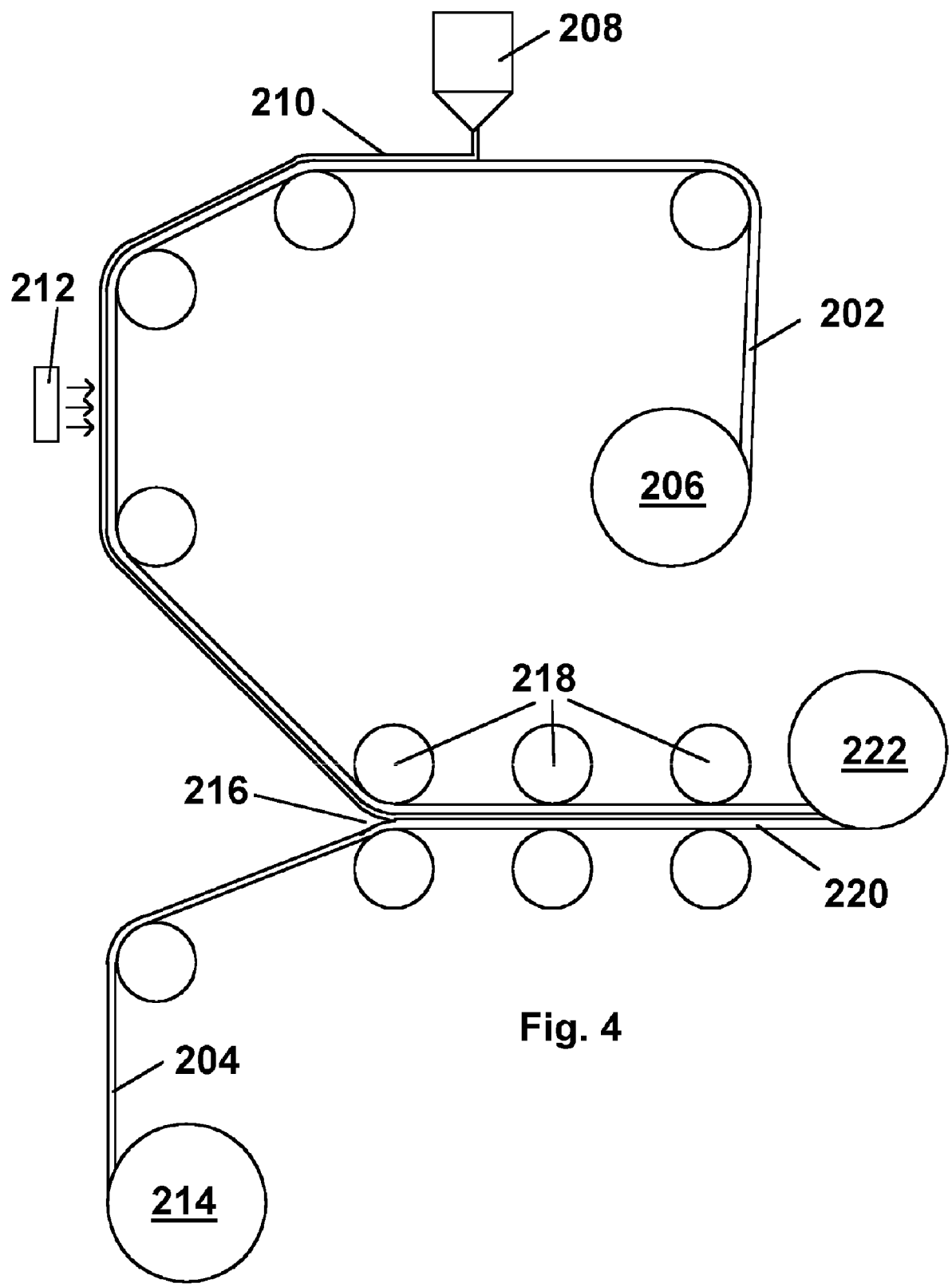
FIG. 4 is a schematic side elevation of apparatus which may be used to carry out a process of the present invention.

A preferred process of this type is illustrated in a highly schematic manner and in side elevation in FIG. 4 of the accompanying drawings. As shown in this Figure, the process forms a display by the convergence of two webs 202 and 204. The web 202, comprises a rear electrode assembly on a flexible substrate, although the individual components are not shown in FIG. 4. Similarly, the web 204 comprises a flexible substrate, a transparent electrode layer, for example an ITO layer, and a dried film of capsules and binder, although again the individual components are not shown in FIG. 4. As shown in FIG. 4, the web 202 is unwound from a feed spool 206 and brought, electrode side up, beneath a die 208 for coating with a thin layer of a radiation curable lamination adhesive 210. The adhesive 210 may for example be curable by visible, ultra-violet or electron beam radiation. The web 202 bearing adhesive 210 passes a radiation source 212, the intensity of which is adjusted having regard to both the catalyst concentration (and hence curing speed) of the adhesive 210 and the speed of the web 202. (If an anisotropic adhesive is being used, an electrical or magnetic head may be provided between the die 208 and the radiation source 212 to form the desired strands of conductive particles before the matrix is cured or gelled by the radiation source 212.)

The web 204 is unwound from a feed spool 214 and carries the dried capsule-containing layer to a convergence point 216, at which the webs 202 and 204 are brought together. At this convergence point 216, the radiation curable resin 210 is still in liquid form, and easily fills voids on the surface of the capsule-containing layer. The coordination of web speed, catalyst concentration and radiation intensity is adjusted to provide a cure rate such that hardening occurs after the convergence point 216, while the two webs 202 and 204 are being held together with rollers 218. Finally, the laminated web 220 produced is wound on a take-up spool 222a.

It will be seen that the foregoing process allows the lamination process to operate in-line, and thus enables higher production rates than the batch unit processes previously discussed.

When using a radiation-curable adhesive, it is greatly preferred that this be an adhesive which can undergo curing in the presence of water. The use of such waterborne, or water-reducible, radiation-curable adhesives is highly desirable when, as is typically the case, an encapsulated electrophoretic medium has capsules the walls of which are formed from hydrophilic materials; for convenience, such capsules may hereinafter be called "hydrophilic capsules". (In practice, most electrophoretic media use hydrocarbon-based hydrophobic fluids, and it is easier to encapsulate such hydrocarbon-based fluids in hydrophilic materials, since the hydrophilic materials used for the capsule walls are essentially insoluble in the fluid, thus avoiding problems which might arise from the presence of "impurities" in the fluid.) It has been found empirically that it is difficult if not impossible to disperse hydrophilic capsules in most polymeric and oligomeric matrices, which are typically hydrophobic. Water-reducible resins, which allow small quantities of water to be added primarily for viscosity reduction, are available commercially, and it has been found that these water-reducible resins will accept and disperse hydrophilic capsules with little difficulty.

When a water-reducible resin is used, the radiation-curable adhesive typically consists essentially of three components, namely a high solids water-reducible oligomer, a water-compatible monomer and a catalyst. Significant formulation latitude can be achieved by the use of more than one of any of the components in a single formulation.

Oligomers include both aliphatic and aromatic urethane acrylates, urethane methacrylates, epoxy acrylates, epoxy methacrylates, specialty low viscosity aliphatic and aromatic mono- and di-acrylates, and polyester acrylates. These materials are generally supplied as very high viscosity liquids.

Water-compatible monomers include mono-, di- and tri-functional materials, which can be water-soluble, water-reducible, or only soluble in the oligomer. Monomers of interest include isobornyl acrylate, cyclohexyl acrylate, several epoxy acrylates, low ethoxylated trimethylolpropane triacrylate, tetraethylene glycol diacrylate, phenoxyethyl acrylate, polyethylene glycol ethyl ether acrylate, diethylene glycol ether acrylate, pentaerythritol tetraacrylate, pentaerythritol diacrylate monostearate, castor oil, methyl methacrylate, butyl methacrylate, N-(hydroxymethyl)acrylamide, polyethylene glycol 400 diacrylate, 1,5-hexanediol diacrylate, bisphenol-A epoxy diacrylate, water soluble triacrylates, and others.

Catalysts vary significantly with the type of radiation used for curing, and with the intended type of cross-linking. In thin films, such as are typically used in electro-optic displays, the α-cleavage photoinitiators Darocure (Registered Trade Mark) 1173 and members of the Irgacure (Registered Trade Mark) series (369, 907, 651 and 184) may be used. Benzophenone may be used to speed up curing by reducing air inhibition at the surface of the resin. Photoinitiators are not needed in electron beam curable systems. At low concentrations, camphorquinone and a tertiary amine can be used for visible light curing.

In general, the use of water-reducible oligomers does not yield a hard cured resin. However, the ratio of the various levels of functionality of both the monomer and oligomer plays a significant role in the final hardness of the cured system. Lack of hardness is not a major issue in flexible displays, and in this regard, as previously, mentioned, significant latitude is possible with multiple component blending.

Good results have been achieved in encapsulated electrophoretic displays using several mixtures of oligomer 155 (a water-reducible material from PurElaSt (Polymer Systems Corp)), epoxy acrylate, n-vinylpyrrolidone, ethoxylated trimethylpropane triacrylate, Darocure 1173 and water. The best results were obtained when the formulation was made up without the catalyst and stored in light-shielded containers, with the catalyst being added immediately prior to use.

Several advantages are inherent in the use of radiation cured systems, particularly water-reducible systems. Reduced handling of devices before and after lamination can be realized from the ability of the water-reducible systems to cure without having the water removed, but some water removal prior to curing has been found to give increased lamination strength. Curing can be achieved through transparent polyethylene terephthalate, or, as in the system of FIG. 4, curing may be allowed to proceed after irradiation; either case allows for a very uniform lamination with a central adhesive layer that transforms from liquid to solid. The need for large thermal ovens is reduced when using ultra-violet curing systems, with resultant significant plant operating cost reductions. Since curing can occur with water in solution with the resins, a very clear and durable film results, from which the water will eventually evaporate. This can be used to great advantage if a vapor-permeable electrode is used in the display.

It has been found that ultra-violet-cured systems adhere very well to cured waterborne systems, opening the possibility of using a specific ultra-violet layer to passivate or shield an electrode. Since ultra-violet curing is rapid and simple, multiple laminations with ultra-violet cured resins are possible, if needed. Switching characteristics of electrophoretic displays have been found to be unaffected by the ultra-violet exposure needed for lamination.

The following Example is now given, though by way of illustration only, to show details of preferred materials, processes and techniques used in the first area of the present invention.

Example 1

This Example describes the preparation of a display of the present invention using a gelatin/acacia microencapsulated electrophoretic medium.

A Preparation of Oil (Internal) Phase

To a 1 L flask is added 0.5 g of Oil Blue N (Aldrich, Milwaukee, Wis.), 0.5 g of Sudan Red 7B (Aldrich), 417.25 g of Halogenated hydrocarbon Oil 0.8 (Halogenated Hydrocarbon Products Corp., River Edge, N.J.), and 73.67 g of Isopar-G (Exxon, Houston, Tex.—"ISOPAR" is a Registered Trade Mark). The mixture is stirred at 60° C. for six hours and is then cooled to room temperature. 50.13 g of the resulting solution is placed in a 50 mL polypropylene centrifuge tube, to which is added 1.8 g of titanium dioxide (TiO2) (E. I. du Pont de Nemours & Company, Wilmington, Del.), 0.78 g of a 10% solution of OLOA 1200 (Chevron, Somerset, N.J.), in Halogenated hydrocarbon Oil 0.8, and 0.15 g of Span 85 (Aldrich). This mixture is then sonicated for five minutes at power 9 in an Aquasonic Model 75D sonicator (VWR, Westchester, Pa.) at 30° C.

B Preparation of Aqueous Phase 10.0 g of acacia (Aldrich) is dissolved in 100.0 g of water with stirring at room temperature for 30 minutes. The resulting mixture is decanted into two 50 mL polypropylene centrifuge tubes and centrifuged at about 2000 rpm for 10 minutes to remove insoluble material. 66 g of the purified solution is then decanted into a 500 mL non-baffled jacketed reactor, and the solution is then heated to 40° C. A six-blade (vertical geometry) paddle agitator is then placed just beneath the surface of the liquid. While agitating the solution at 200 rpm, 6 g of gelatin (300 bloom, type A, Aldrich) is carefully added over about 20 seconds in order to avoid lumps. Agitation is then reduced to 50 rpm to reduce foaming. The resulting solution is then stirred for 30 minutes.

C Encapsulation

With agitation at 200 rpm, the oil phase, prepared as described above, is slowly poured over about 15 seconds into the aqueous phase, also prepared as described above. The resulting oil/water emulsion is allowed to emulsify for 20 minutes. To this emulsion is slowly added over about 20 seconds 200 g of water that has been pre-heated to 40° C. The pH is then reduced to 4.4 over five minutes with a 10% acetic acid solution (acetic acid from Aldrich). The pH is monitored using a pH meter that was previously calibrated with pH 7.0 and pH 4.0 buffer solutions. The resultant mixture is stirred for 40 minutes. 150 g of water that has been preheated to 40° C. is then added, and the contents of the reactor are then cooled to 10° C. When the solution temperature reaches 10° C., 3.0 mL of a 37% formalin solution (Aldrich) is added, and the solution is further stirred for another 60 minutes. 20 g of sodium carboxymethylcellulose is added, and the pH is then raised to 10.0 by the addition of a 20 wt % solution of sodium hydroxide. The thermostat bath is then set to 40° C. and allowed to stir for another 70 minutes. The slurry is allowed to cool to room temperature overnight with stirring. The resulting capsule slurry is then ready to be sieved.

D Formation of Display

The resulting capsule slurry from Part C above is mixed with an aqueous urethane binder NeoRez R-9320 (Zeneca Resins, Wilmington, Mass.) at a weight ratio of one part binder to 10 parts capsules. The resulting mixture is then coated using a doctor blade onto a 0.7 mm thick sheet of indium tin oxide sputtered polyester film. The blade gap of the doctor blade is controlled at 0.18 mm so as to lay down a single layer of capsules. The coated film is then dried in hot air (60° C.) for 30 minutes. After drying, the dried film is hot laminated at 60° C. to a backplane comprising a 3 mm thick sheet of polyester screen printed with thick film silver and dielectric inks with a pressure of 15 psi in a hot roll laminate from Cheminstruments, Fairfield, Ohio. The backplane is connected to the film using an anisotropic tape. The conductive areas form addressable areas of the resulting display.

As already indicated, it will be apparent to those skilled in electro-optic display technology that, in addition to anisotropic conductivity, the adhesive used in the displays of the first area of the present invention should satisfy numerous other requirements. For a full discussion of these other requirements, the reader is referred to the aforementioned U.S. Pat. No. 6,831,769.

Part B: Electro-Optic Displays and Components Using as Binders Materials Described in U.S. Pat. No. 6,831,769

As already mentioned, the second area of this invention relates to electro-optic displays and components using as binders the materials described in the aforementioned U.S. Pat. No. 6,831,769 as useful as lamination adhesives.

Before explaining in detail the characteristics which the binders used in the second area of the present invention should possess, it is appropriate to first review the demands upon binder materials used in electro-optic displays. The mechanical properties of a binder material are important for several reasons, including adhesion of the electro-optic medium to an adjacent electrode, resistance of the electro-optic medium to mechanical damage, and (in the case of encapsulated electrophoretic displays comprising a plurality of capsules, such as that shown in FIG. 1) forming the capsules into a mechanically coherent layer. In the case of a polymer-dispersed electrophoretic display, the binder (continuous phase) also serves to keep the droplets of internal phase (the discontinuous phase) separate from one another.

The binder must also meet certain physico-chemical requirements, including, in the case of an electrophoretic medium, compatibility with the internal phase of the medium. The binder must also be compatible with the capsule wall (in the case of an encapsulated display), any lamination adhesive used, and with electrode surfaces. The binder should have stable properties over the long term (of the order of several years) to provide the display with a long operating life. It is also highly desirable that the binder be essentially free of small molecule, mobile species, since such species may migrate from the binder into other components of the display, including the internal phase and conductive layers, thus adversely affecting the electro-optic properties of the display. The binder material must of course also be compatible with the process used to form a layer of electro-optic medium, and in particular with the preferred coating techniques for forming such layers.

Electro-optic displays are often exposed to substantial variations in environmental parameters, for example, temperature and relative humidity, and hence the binder should be capable of fulfilling its role over wide ranges of such parameters. In addition, since at least some electro-optic media are sensitive to variations in relative humidity, it is desirable that, as far as possible, the binder provide some protection for the medium against variations in relative humidity.

Having thus summarized the way in which a binder is used to form the electro-optic displays of the present invention, we now turn to describing in detail the preferred characteristics of the binder itself. For ease of comprehension, the following aspects of the binder will be described separately hereinafter:

(i) Storage stability;
(ii) Light resistance and control;
(iii) Mechanical properties;
(iv) Electrical properties; and
(v) Physico-chemical properties.

It will readily be apparent that the optimum properties for the binder used in an electro-optic display will vary somewhat with the exact type of electro-optic medium in the display, and the following discussion does not purport to specify an exhaustive list of such optimum properties for all types of electro-optic displays. However, the structure of an encapsulated electrophoretic display, in which electrically charged particles move through an internal phase which is itself confined by a capsule wall and (typically) a polymeric binder, does impose upon the binder used in such an encapsulated electrophoretic display requirements in addition to those common to all electro-optic displays. In particular, certain of the optimum electrical properties are peculiar to encapsulated electrophoretic displays, as are the optimum physico-chemical properties discussed below. In this regard, depending upon the material in which the microcells are formed, microcell electrophoretic displays may typically impose substantially the same requirements as encapsulated electrophoretic displays, since both types of electrophoretic display use the same types of fluids, and as discussed below the additional requirements for electrophoretic displays relate to relationships between the properties of the fluid and the binder.

Section (i): Resistivity Stability

The present inventors have discovered that the degradation in performance of electro-optic displays with time is caused, at least in part, by changes in the volume resistivity of the lamination adhesive and binder, and that this degradation can be reduced, and the service life of the displays increased, by using a lamination adhesive and binder the volume resistivity of which does not vary greatly with time. In particular, the binder should have a volume resistivity, measured at 10° C., which does not change by a factor of more than about 3 after being held at 25° C. and 45 percent relative humidity for 1000 hours.

The phrase "being held" is deliberately used to stress that, in testing binders to determine whether they conform to the requirements of this aspect of the present invention, care should be taken to ensure that the binder material does equilibrate with the specified atmosphere within a reasonable time. If a binder material is tested in thick layers, it may not equilibrate with the specified atmosphere for a considerable period and misleading results may be obtained. Such misleading results can be avoided by testing successively thinner layers of the binder material and checking that the results are consistent. For sufficiently thin layers, merely storing the binder material under the specified conditions for the specified period will suffice.

It is believed (although the invention is in no way limited by this belief) that the change in volume resistivity experienced in many lamination adhesives and binders is due to partial crystallization of the polymeric material, and that materials which meet the resistivity stability test defined above are substantially non-crystallizing. Those skilled in polymer technology are of course aware that partial or complete crystallization of polymers occurs in a variety of contexts and often produces substantial changes in a variety of physico-chemical properties of the polymers. Often, such changes can be reduced or eliminated by adding a plasticizer to the polymer. However, the addition of a plasticizer is usually not practicable in lamination adhesives and binders used in electro-optic displays, since almost all conventional plasticizers are small molecules with substantial affinity for organic solvents, and the addition of such a material to the lamination adhesive or binder will result in migration of the plasticizer into the electro-optic layer, with adverse effects upon the performance of that layer. Cf. the discussion below regarding the importance of avoiding mobile species in the lamination adhesive or binder.

Alternative tests for non-crystallization, which in practice normally give substantially the same results as the resistivity stability test already defined, are a change in the enthalpy associated with any phase transition in the material, as measured by differential scanning calorimetry, that is not more than about 2 Joules per gram after being held at 25° C. and 45 percent relative humidity for 1000 hours, or a change in dielectric constant of less than about 2 after the same period of storage. Desirably, the lamination adhesive or binder used in the displays of the present invention will meet all three tests.

The stable resistivity binder used in the present display and process could, at least in theory, be a single material, and indeed it may be possible, by custom design of polymers as discussed below, to produce a binder which meets the resistivity stability requirement, as well as all the other requirements for a binder for use in electro-optic displays, as discussed above. However, no single commercial material which itself meets the resistivity stability requirement and the other requirements for a binder has been found. Accordingly, the presently preferred materials for use in the present invention are blends of two or more materials. Such a blend may comprise one or more binders and one or more polymeric additives which are not themselves binders. However, in order to obtain the best binder properties, it is preferred that the blend used comprise at least two binders. Such a blend may comprise a mixture of a first binder which has unstable resistivity (but which has other properties which render it desirable) and a second binder which does have stable resistivity, but whose other properties, such as inadequate adhesion, render it unsuitable for use alone. However, it has been found that certain stable resistivity blends can be formed from two or more binders which do not have stable resistivities, and some of the presently preferred blends are of this type.

It may seem strange that a stable resistivity blend can be formed from two or more binders each of which individually does not possess stable resistivity; however, this is explicable given that unstable resistivity is believed to be associated with partial crystallization within the material, and the present understanding of the partial crystallization of polymers. Although the invention is in no way limited by this belief, skilled polymer chemists attribute partial crystallization of a polymer to the tendency for polymer chains to become aligned with one another, thus forming crystalline regions within the polymer. If two polymers, both of which are susceptible to the formation of such crystalline regions when in their pure form, but have somewhat different chemical structures, are blended, the two different polymer chains present in the blend may interfere with each other, preventing either type of polymer chain forming its crystalline regions, and thus rendering the blend non-crystallizing.

As should be apparent, it is desirable that the volume resistivity of the binder used in the present invention be as stable as possible throughout the working life of the display. However, empirically (as illustrated in the Examples in this Part B) it has been found that the major part of the changes in volume resistivity of binders occurs during the first 1000 hours of life, so that a binder which meets the stable resistivity test already mentioned will normally maintain a stable resistivity over a working life substantially greater than 1000 hours, and typically at least 10,000 hours. It is desirable that the volume resistivity of the binder not change by a factor of more than about 2, and preferably not greater than about 1.5, under the 1000 hour test previously described.

Commercial materials which have been found useful in the displays of the present invention include NeoRez R 9000, R 9314, R 9320 and R 9621 (all available from NeoResins, 730 Main Street, Wilmington, Mass. 01887) and Dispercoll U KA 8713, U 53 and U 54 (all available from Bayer Corporation, 100 Bayer Road, Pittsburgh Pa. 15205-9741). All of these materials are water-dispersed urethanes. R 9320 is a non-ionically stabilized polyester-based urethane, while U KA 8713 is an anionically-stabilized polyester urethane. Specific preferred blends are R 9320 with any one of the following (the following percentages are based on the total weight of the blend):

25-50% of U KA 8713
50% of R 9000
10-50% of R 9314
25% of R 9621
25-50% of U 53
50% of U 54.

No special techniques are required for forming the blends; the two or more components are simply mixed in conventional mixing equipment for a period sufficient to form an intimate mixture of the components. Attention must of course be paid to the chemical compatibility of the various components of the blend, especially the chemical compatibility of the dispersants present, since (as is well known to polymer chemists) admixing certain types of dispersants is highly likely to result in undesirable precipitation of the polymers.

Using a binder with volume resistivity (and preferably other properties) which are stable upon long term storage also assists in ensuring economical manufacture of the display. As already discussed, for commercial reasons, it is convenient to prepare a front plane laminate of the form shown in FIG. 1 comprising a substrate, a conductive layer, an electro-optic layer, a lamination adhesive and a release sheet; this front plane laminate may be prepared in large batches, preferably using a roll-to-roll process, stored and later cut into portions suitable for lamination to the backplanes of individual displays before lamination to form such displays. For economical operation of such a manufacturing process, it is necessary that the front plane laminate, and thus the lamination adhesive and binder therein, remain stable during the storage period in order that portions may be cut from the large batch at different times over a period of (say) several months to one year and laminated to the backplanes to form the final displays with consistent properties.

In practice, in addition to the polymeric binder material, the capsule/binder mixture used to form a layer of an encapsulated electrophoretic medium will normally contain additives intended to assist the coating process, especially during slot coating. Such additives may include thickening agents, for example, hydroxypropylmethylcellulose (HPMC) and surfactants, for example Triton X-100 (t-octylphenoxypolyethoxyethanol, available from Union Carbide Corporation, Danbury Conn.). Typically, the capsule binder mixture may contain about 0.2 to 0.3 percent by weight of HPMC and about 0.1 percent by weight of surfactant. Typically, a capsule/binder mixture may contain from about 8 to about 10 parts by weight of capsules per part by weight of binder (on a solids basis). Typically, a capsule/binder slurry is formed by adjusting the pH of the capsules (if necessary), mixing the capsules with the binder to form a substantially homogeneous mixture, and then adding the necessary additives and mixing to form the final capsule/binder coating slurry.

The following Examples are now given, though by way of illustration only, to show details of preferred materials, processes and techniques used in the second area of the present invention.

Example 2

This Example illustrates the improved stability of the volume resistivity of the aforementioned R 9320 upon prolonged storage provided by blending the material with the aforementioned U KA 8713.

Figure 5:
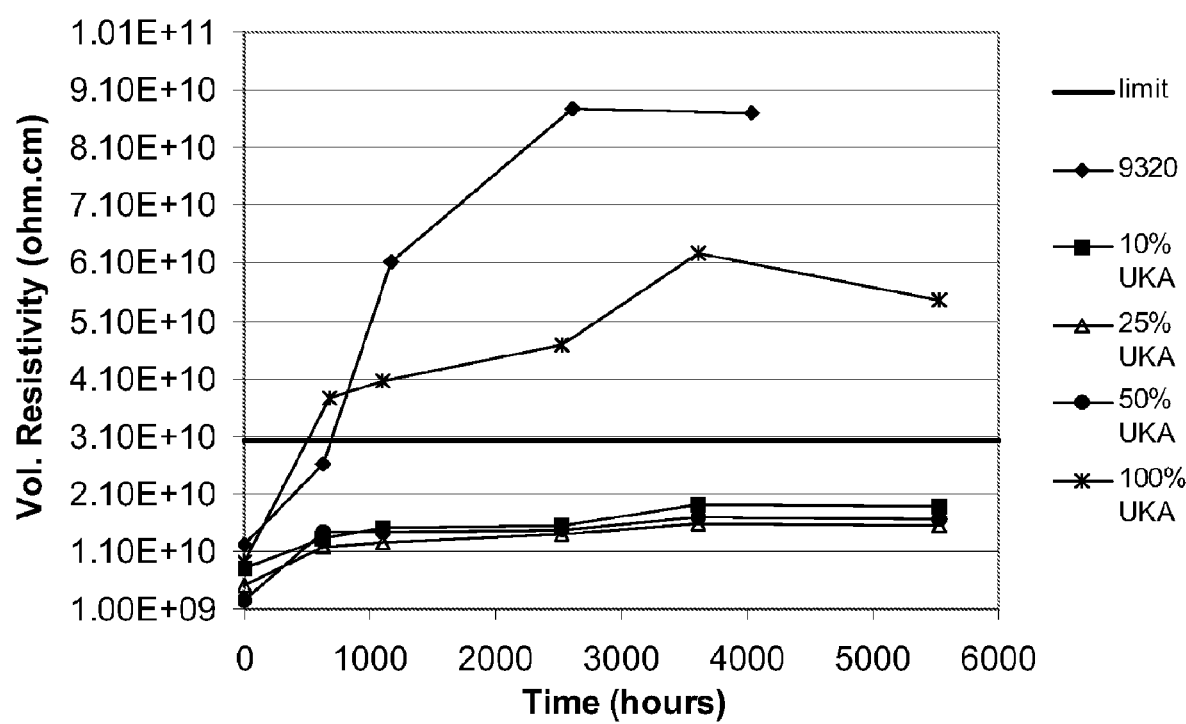
FIG. 5 is a graph illustrating the improved stability on storage of the volume resistivity of a binder material achieved by blending two commercial materials, as described in Example 2 below.

Test samples, using pure R 9320 and U KA 8713, and 90/10, 75/25 and 50/50 w/w percent blends of these two materials, were prepared in the following manner. The blend, adjusted to 40% solids content, was coated, using a doctor blade set at 150 µm, on to a 5 mil (127 µm) sheet of ITO-coated polyester masked on one edge, so that the masked area could later serve as an electrode. The resultant coating was dried in an oven at 50° C. for 20 minutes to produce a dry film approximately 60 µm thick. The resultant adhesive-coated film was then laminated, by vacuum or roll lamination, to a second sheet of ITO-coated polyester so that the adhesive was in contact with both ITO layers. The samples thus prepared were stored at ambient temperature and humidity for 2500 hours. The electrical properties of the adhesive were measured by impedance spectroscopy at 10° C. at intervals using a Solartron SI 1260 Impedance/Gain-phase analyzer with a Solartron 1296 dielectric interface. The results are shown in FIG. 5 of the accompanying drawings. The horizontal line at $3 \times 10^{10}$ ohm cm represents an empirical limit for the maximum volume resistivity of a lamination adhesive or binder useful in a preferred embodiment of an encapsulated electrophoretic display formed as described in the aforementioned E Ink and MIT patents and applications.

From FIG. 5, it will be seen that the volume resistivities of both R 9320 and U KA 8713 changed substantially over the storage period, the volume resistivity of the former increasing from about $10^{10}$ to about $9 \times 10^{10}$ ohm cm, while the latter rose from an initial $1 \times 10^{10}$ ohm cm to almost $5 \times 10^{10}$ ohm cm. In contrast, the volume resistivities of all three blends were substantially more stable over the test period, all falling within the range of about $1\text{-}1.5 \times 10^{10}$ ohm cm over the period of 500-2500 hours of storage.

Example 3

This Example illustrates the improved stability of the volume resistivity and dielectric constant of the aforementioned R 9320 upon prolonged storage provided by blending the material with the aforementioned R 9000.

Example 2 was repeated, except that R 9000 was substituted for U KA 8713, that the storage period was 4000 hours, and that the volume resistivity measurements were supplemented by measurements of the dielectric constant of the blends using the same impedance spectrometer as previously mentioned. The volume resistivity results are shown in FIG. 6 of the accompanying drawings and the dielectric constant results in FIG. 7.

Figure 6:
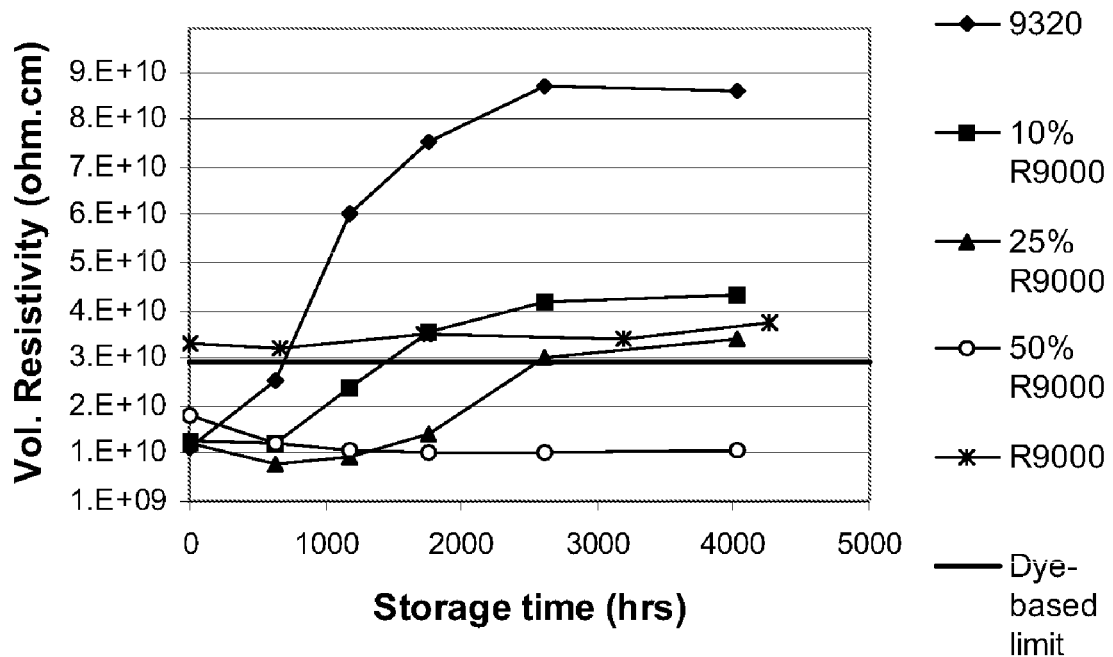
FIG. 6 is a graph illustrating the improved stability on storage of the volume resistivity of a binder material achieved by blending two commercial materials, as described in Example 3 below.
Figure 7:
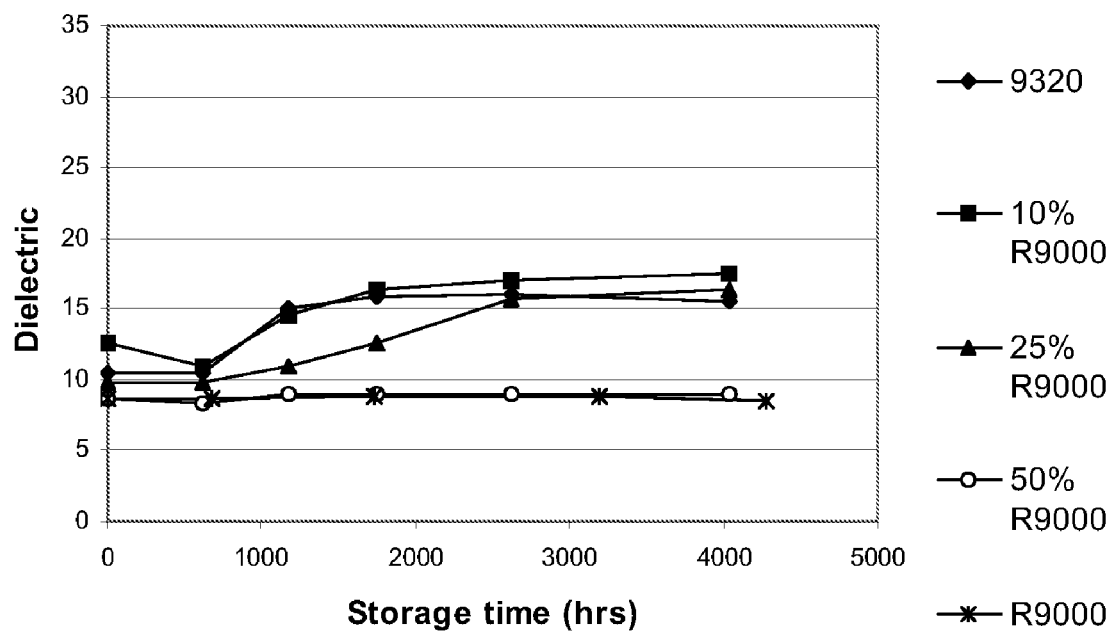
FIG. 7 is a graph illustrating the improved stability on storage of the dielectric constant of binder materials achieved by blending commercial materials, as described in Example 3 below.

From FIG. 6, it will be seen that, although the volume resistivities of both R 9320 and R 9000 underwent substantial changes over the test period, the blends had much more stable resistivities. In particular, the performance of the 50/50 w/w blend was outstanding, displaying a variation by less than a factor of 2 throughout the storage period. FIG. 7 shows that this same 50/50 w/w blend displayed essentially no variation in dielectric constant during the test period.

Example 4

This Example illustrates the improved stability of the volume resistivity and dielectric constant of the aforementioned R 9320 upon prolonged storage provided by blending the material with the aforementioned U 53.

Example 3 was repeated, except that the aforementioned U 53 was substituted for the R 9000 and that the storage period was 6000 hours. The volume resistivity results are shown in FIG. 8 of the accompanying drawings and the dielectric constant results in FIG. 9.

Figure 8:
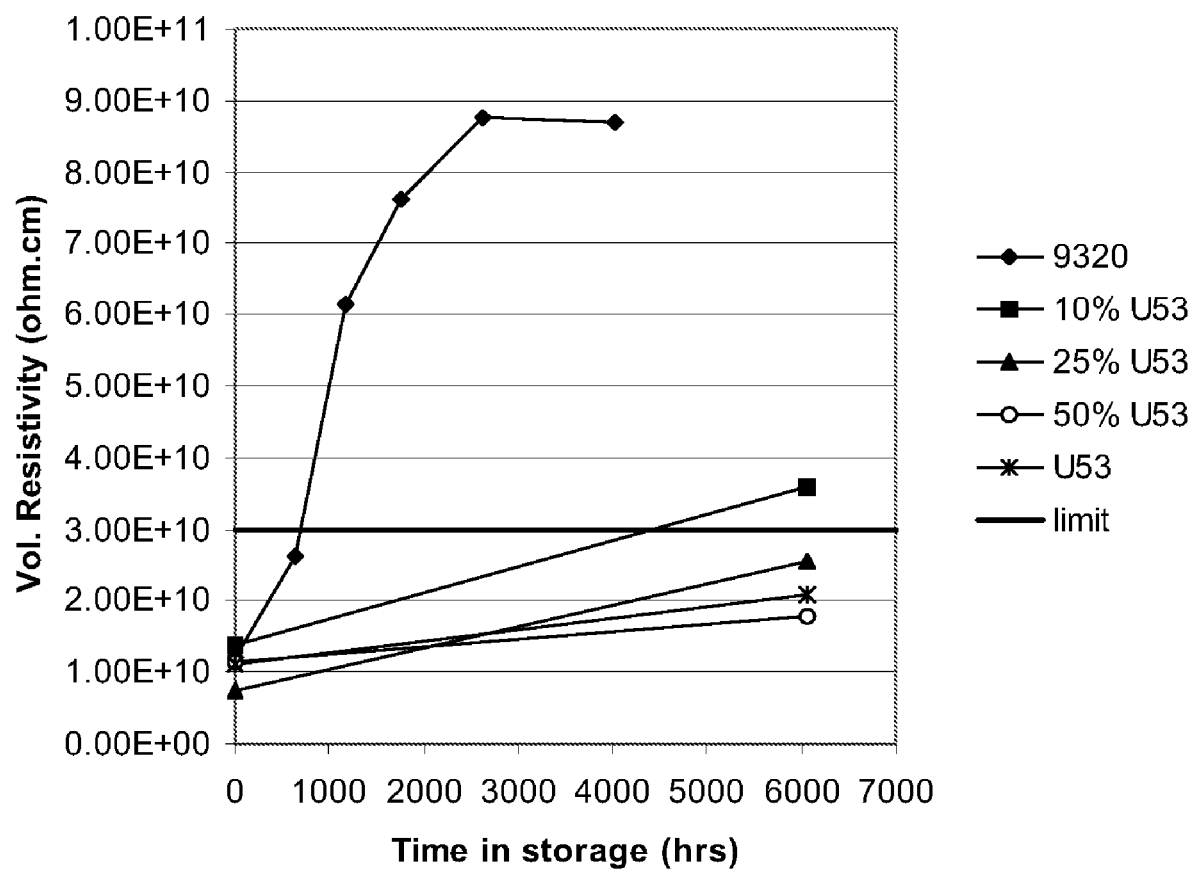
FIG. 8 is a graph illustrating the improved stability on storage of the volume resistivity of binder materials achieved by blending commercial materials, as described in Example 4 below.
Figure 9:
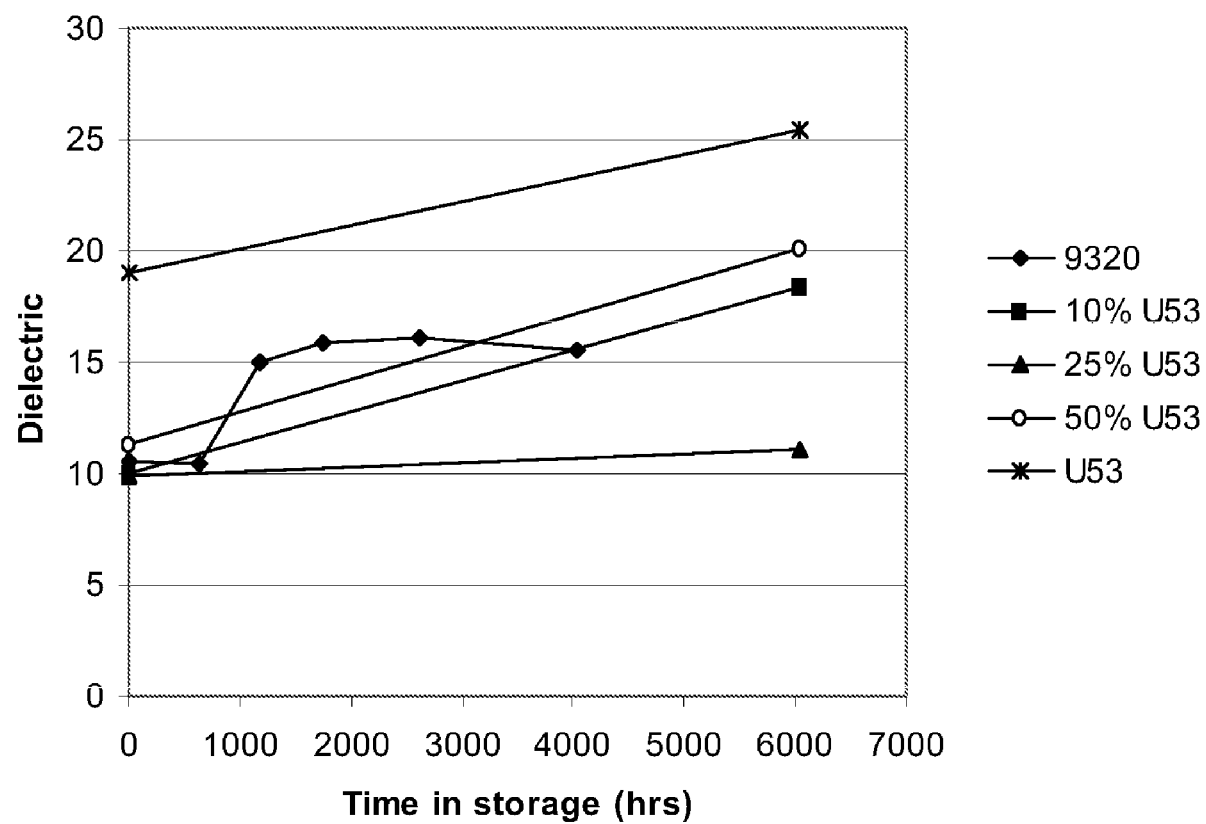
FIG. 9 is a graph illustrating the improved stability on storage of the dielectric constant of binder materials achieved by blending commercial materials, as described in Example 4 below.

From FIG. 8, it will be seen that the substantial changes in the volume resistivities of R 9320 over the test period were much less pronounced in the blends. In particular, the resistivities of the 75/25 and 50/50 w/w blends were within the acceptable range throughout the storage period. Similarly, FIG. 9 shows that both the 75/25 and 50/50 w/w blends displayed acceptable variation in dielectric constant during the test period.

Example 5

This Example illustrates the improved stability of the volume resistivity and dielectric constant of the aforementioned R 9320 upon prolonged storage provided by blending the material with the aforementioned U 54.

Example 3 was repeated, except that the aforementioned U 54 was substituted for the R 9000 and that the storage period was 5500 hours. The volume resistivity results are shown in FIG. 10 of the accompanying drawings and the dielectric constant results in FIG. 11.

Figure 10:
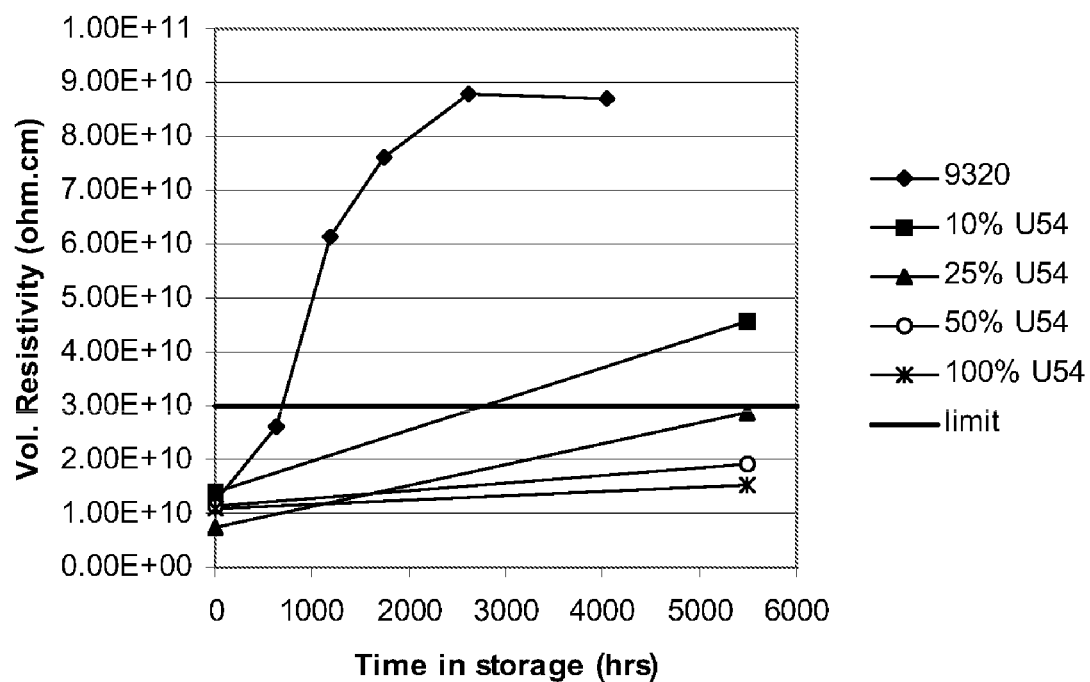
FIGS. 10 and 11 are graphs similar to FIGS. 8 and 9 respectively, but showing the results obtained in Example 5 below.
Figure 11:
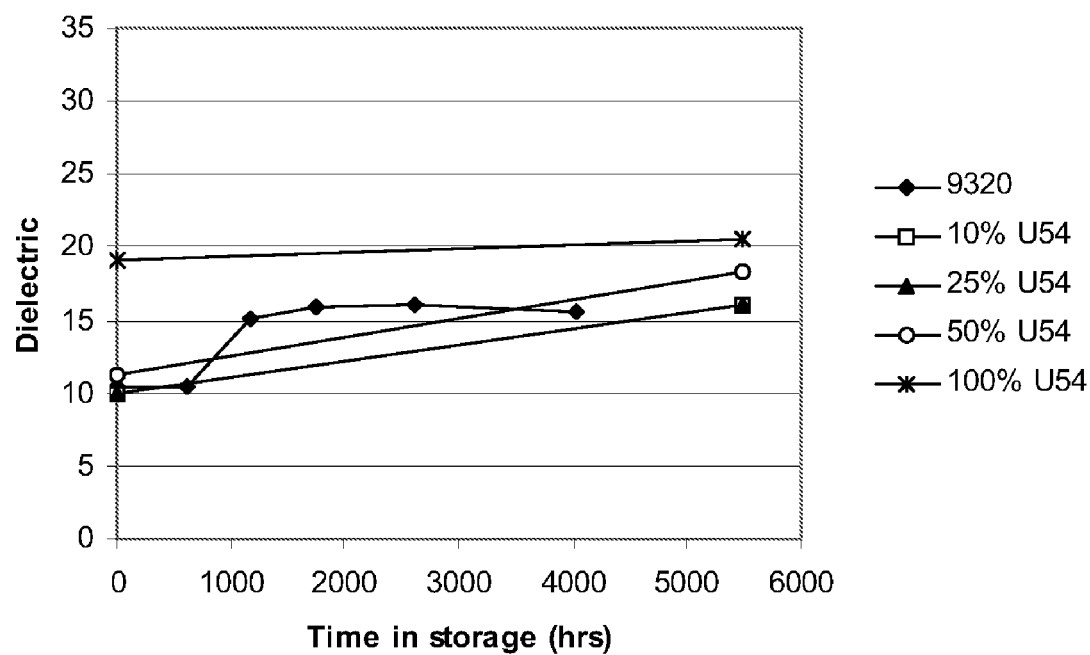

From FIG. 10, it will be seen that the substantial changes in the volume resistivities of R 9320 over the test period were much less pronounced in the blends. In particular, the resistivities of the 75/25 and 50/50 w/w blends were within the acceptable range throughout the storage period. Similarly, FIG. 11 shows that both the 75/25 and 50/50 w/w blends displayed acceptable variation in dielectric constant during the test period.

Example 6

This Example illustrates the improved stability of the volume resistivity and dielectric constant of the aforementioned R 9320 upon prolonged storage provided by blending the material with the aforementioned R 9314.

Figure 12:
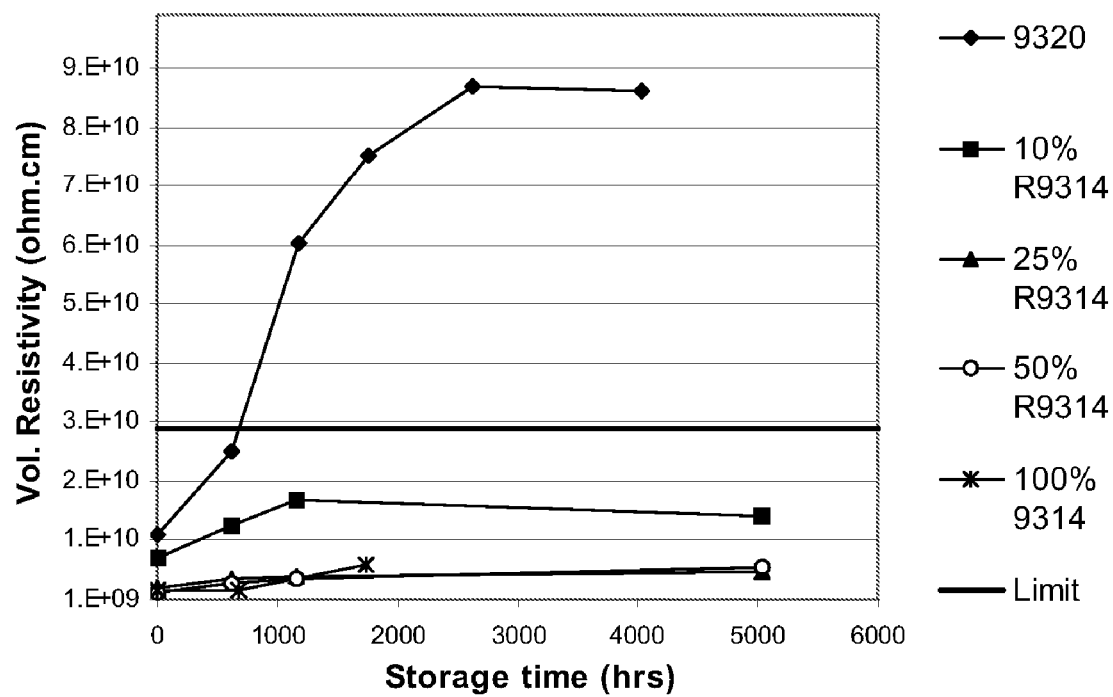
FIGS. 12 and 13 are graphs similar to FIGS. 8 and 9 respectively, but showing the results obtained in Example 6 below.
Figure 13:
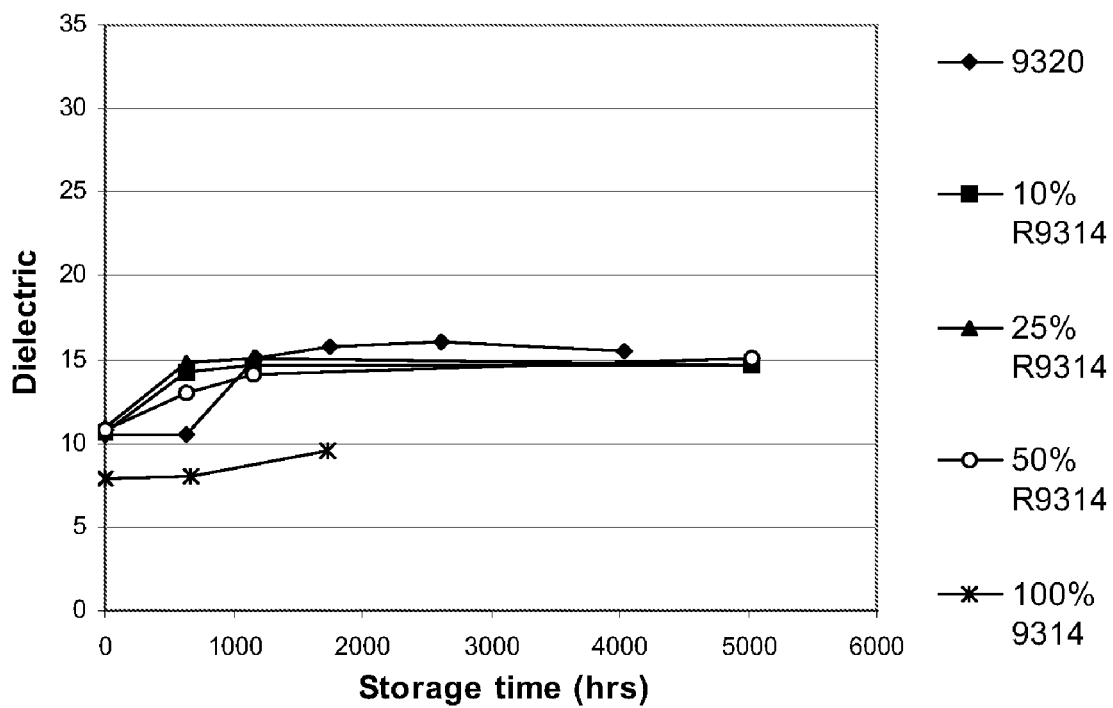

Example 3 was repeated, except that the aforementioned R 9314 was substituted for the R 9000 and that the storage period was 5000 hours. The volume resistivity results are shown in FIG. 12 of the accompanying drawings and the dielectric constant results in FIG. 13.

From FIG. 12, it will be seen that the blends did not suffer from the sharp variations of resistivity with time characteristic of R 9320 (cf. FIGS. 8 and 10), and the resistivities at all times remained below the $3\times10^{10}$ ohm cm limit. The dielectric constant data in FIG. 13 also show that all the blends were satisfactory.

Example 7

This Example illustrates the effect of a stable resistivity adhesive in improving the performance, and specifically the white state, of an electrophoretic display at low temperatures after prolonged storage.

Figure 14:
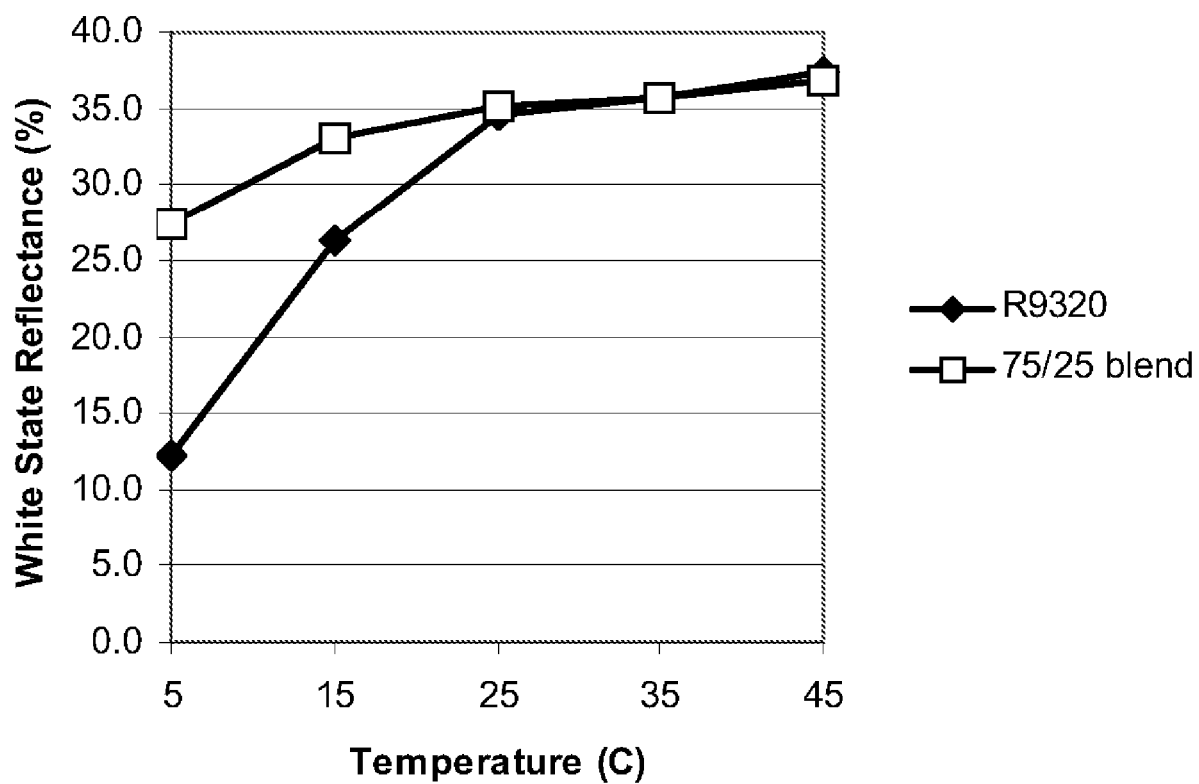
FIG. 14 is a graph showing the improved stability of the white optical state with temperature of an electrophoretic display achieved using a custom lamination adhesive, as described in Example 7 below.

Pure R 9320, and the 75/25 w/w R 9320/U KA 8713 blend mentioned in Example 2 above were used to prepare encapsulated dual particle electrophoretic displays substantially as described in Examples 27-29 of U.S. Pat. No. 6,822,782. The resultant displays, which have black and white optical states, were stored at ambient temperature and humidity (indoors) for three months and then tested by first driving the display to its black state, then applying to the electrodes of the display a 15 V, 600 msec electric pulse of a polarity which turned the black state to white, and finally measuring the reflectance of the white state at the end of this pulse. This test was repeated at temperatures from 5 to 45° C., and the results are shown in FIG. 14.

From this Figure, it will be seen that the low temperature decline in reflectivity is much less marked with the blended adhesive than with the pure R 9320. If one reasonably assumes that satisfactory performance for this display requires a minimum white state reflectance of 30%, the R 9320 display had a minimum operating temperature of about 19° C., whereas the display using the blended adhesive had a minimum operating temperature of about 9° C.

Example 8

This Example illustrates the preparation of the custom polyurethane used as one of the preferred binders in Table 1 above, and also explains the rationale for the design of this custom polyurethane.

There are several processes for waterborne polyurethane preparation, including the acetone process, melt dispersion process, prepolymer mixing process and Ketimine process; see, for example, J. R. Rosthauser et al., Waterborne polyurethane, excerpt from *Advances in Urethane Science and Technology*, K. C. Frisch and D. Klemper, (eds.), vol. 10, pp 121-162 (1987). Having regard to the known susceptibility of aromatic polyurethanes to light, and the need for hydrolytic stability (since hydrolysis of the polyurethane may cause changes in the volume resistivity), it was decided that a promising approach was polyurethanes based upon polyalkylene oxides and aliphatic diisocyanates.

Figure 15:
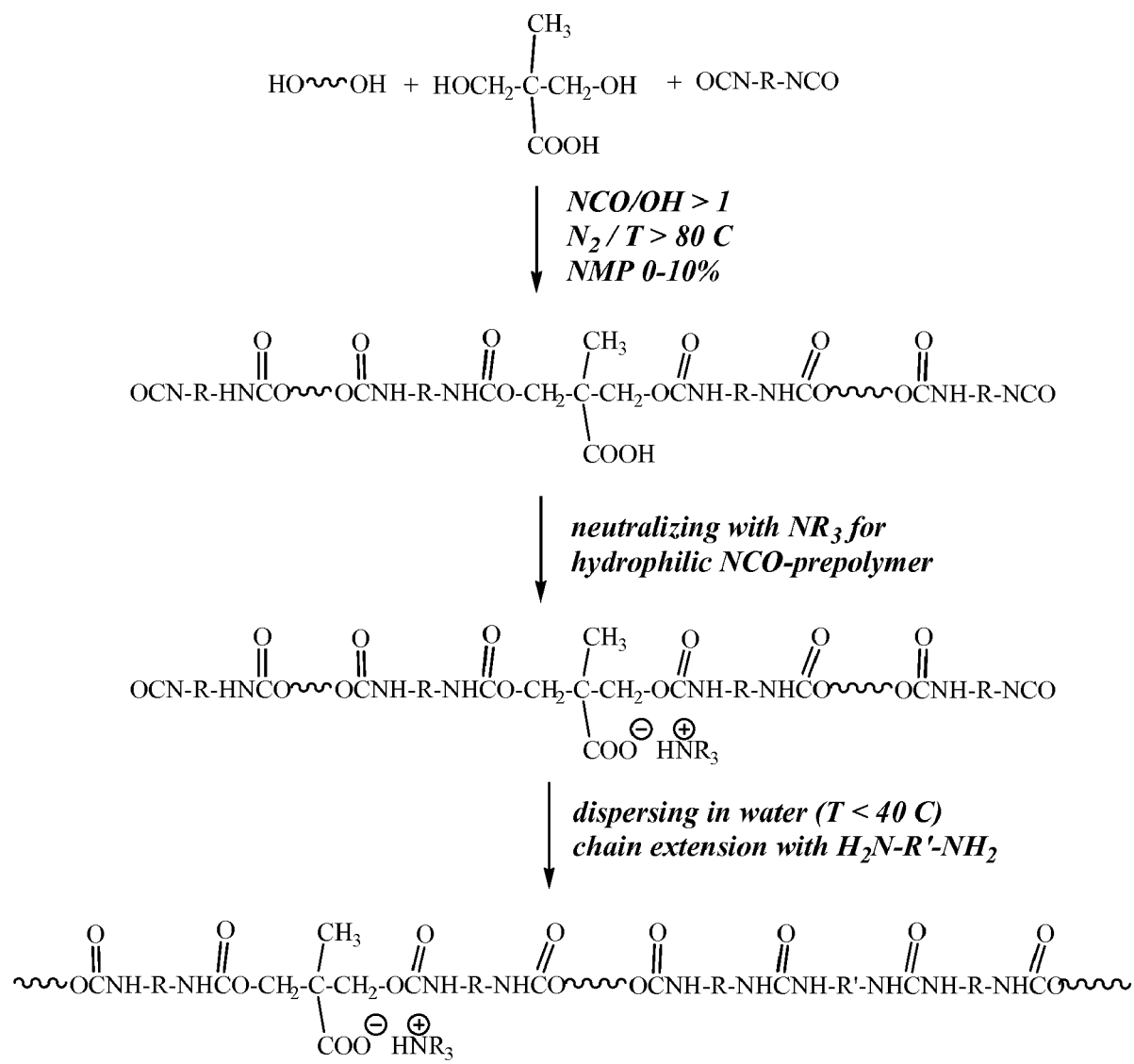
FIG. 15 illustrates the synthetic scheme used in Example 8 below to produce certain polyurethanes preferred for use in the present invention.
Figure 16:
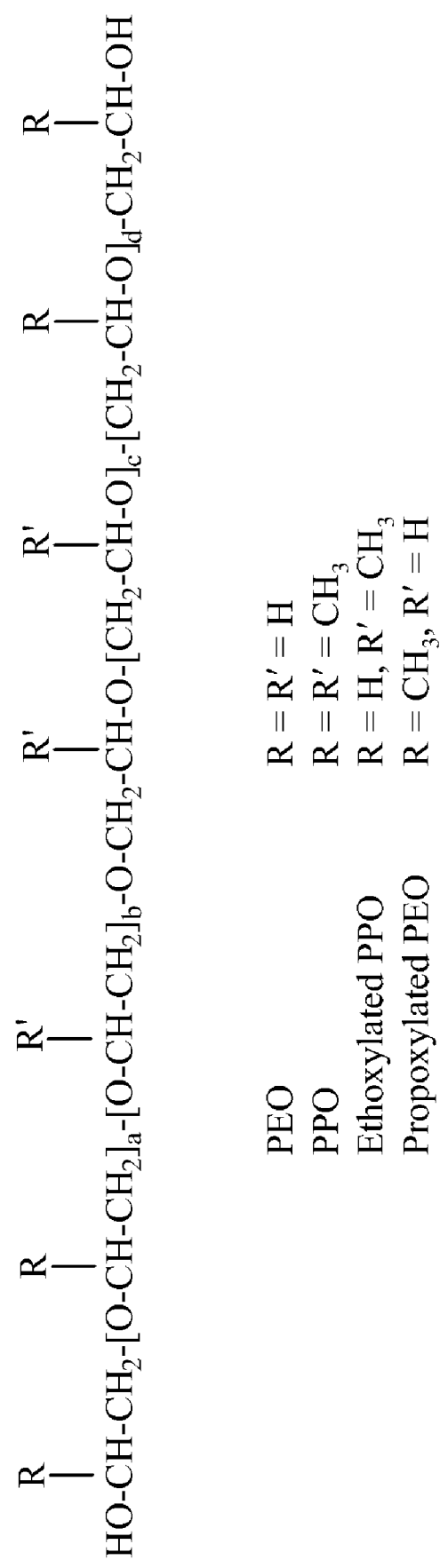
FIG. 16 illustrates the chemical structure of certain materials used in Example 8 below.

FIG. 15 of the accompanying drawings shows schematically the prepolymer synthetic route used to produce the custom polyurethane, utilizing a polyamine in the chain extension step and a small amount of solvent. In a first series of experiments, the polyalkylene oxide used was polypropylene oxide (PPO) in the form of the VORANOL (Registered Trade Mark) series from Dow Chemical Company, Wilmington Del.; the softness and flexibility provided by a PPO backbone is well suited for a binder material. The molecular weight of the PPO segment varied from 1000 to 4000. The structures of the materials used are shown in FIG. 16.

The diisocyanate used was 4,4'-methylene bis(cyclohexyl isocyanate), usually known as "$H_{12}$MDI", available from Bayer under the Registered Trade Mark DESMODUR W. This material was selected for its excellent light stability and moisture resistance for polyurethane applications.

Other materials used in these experiments were as follows:

NMP (1-methyl-2-pyrrolidone, available from Aldrich Chemical Company) as co-solvent;

DMPA (2,2-bis(hydroxymethyl)propionic acid, also available from Aldrich Chemical Company), as an internal anionic stabilizing segment;

$SnBu_2L_2$ (dibutyl tin dilaurate, also available from Aldrich Chemical Company) as catalyst;

TEA (triethylamine, also available from Aldrich Chemical Company), as a neutralizing agent; and HDA (hexamethylenediamine, also available from Aldrich Chemical Company), as a chain extender.

The apparatus used for preparing the polyurethanes comprised a 500 mL jacketed three-necked glass reactor provided with a circulated water cooling/heating bath, an overhead mechanical mixer with a 45° angled paddle, and a nitrogen inlet. The detailed synthetic procedure was as follows:

Prepolymer step: The reactor jacket was heated to 90° C., then pre-weighed DMPA, NMP, PPO diol and $SnBu_2L_2$ were added. An inert atmosphere was maintained during the reaction using the nitrogen inlet. The reactants were stirred at 250 rpm with the overhead mixer for 15 minutes, and DMPA was dissolved gradually during the mixing. $H_{12}$MDI was then added dropwise over a period of 5 minutes and polyaddition polymerization was allowed to proceed for 3 hours at 90° C.

Dispersing step: The reactor was the cooled to 70° C. and TEA was added dropwise over a period of approximately 5 minutes, then the reactants were stirred for 20 minutes. The reactor was cooled to 35° C. and it was observed that polymer viscosity increased sharply. The stirring speed was increased to 750 rpm to disperse the prepolymer into water, which was added dropwise over a period of approximately 15 minutes, and the resultant mixture was dispersed for an additional 30 minutes at 750 rpm.

Chain extension step: HDA was added dropwise over a period of approximately 5 minutes and the resultant mixture stirred for an hour. The reactor temperature was then increased to 70° C. for one hour to react all the residual diisocyanate. The reactor was then cooled to 25° C., the nitrogen inlet was shut off, and the product was collected for analysis.

The specific custom polyurethane mentioned in Table 1 above was prepared using this procedure with the following materials:

PPO2000 (Dow Voranol 220-056), CAS# 25322-69-4

NMP (1-methyl-2-pyrrolidone, Aldrich), CAS# 872-50-4

DMPA (2,2-bis(hydroxymethyl) propionic acid, Aldrich), CAS# 4767-03-7; $SnBu_2L_2$ (dibutyl tin dilaurate, Aldrich), CAS# 77-58-7

$H_{12}$MDI (4,4'-methylene bis(cyclohexyl isocyanate), Bayer Desmodur W), CAS# 5124-30-1

TEA (triethylamine, Aldrich), CAS# 121-44-8

The relative proportions of the materials are given in FIG. 17.

The polymer backbone in this polyurethane consisted of PPO-DMPA-H12MDI, 100 percent neutralized with TEA, followed by chain extension with HDA. The DMPA/PPO2000 molar ratio was kept at 1:1 and the NCO/OH ratio was 1.4:1.

Five separate batches of the material were prepared and the weight average molecular weight and volume resistivities of the materials are shown in Table 2 below; Batch 4 was used as the custom polyurethane in Table 1 above.

TABLE 2

| Batch No. | $M_w$ | VR (ohm-cm) 22° C./25% RH |
|---|---|---|
| 1 | 36430 | 8.0e9 |
| 2 | 42896 | 4.0e10 |
| 3 | 53256 | 7.0e10 |
| 4 | Not Available | 2.0e10 |
| 5 | 52861 | 7.0e10 |

These data indicate a correlation between molecular weight and volume resistivity, which may be explained by an ionic conduction mechanism.

A second custom polyurethane was prepared in a similar manner and using the same materials, except that water was used for chain extension instead of HDA. A detailed description of the materials used is given in FIG. 18.

Section (ii): Light Resistance and Control

The effects of light upon a binder are an important factor in producing a display with a long working lifetime and stable electro-optic properties during this lifetime. Accordingly, it has been found advantageous for the binder to contain an ultra-violet stabilizer, conveniently a hindered amine light stabilizer (HALS) such as those sold commercially under the Registered Trade Mark "TINUVIN". The optimum amount of such a stabilizer can readily be determined empirically, but will typically be in the range of about 0.05 to about 0.5 percent by weight of the binder.

Whether or not an ultra-violet absorber is used in the binder, the binder material itself should desirably be chosen so as to have minimal susceptibility to degradation by light and other radiation, especially ultra-violet radiation. To this end, provided that the necessary electro-optic properties of the binder can be achieved in other ways, it has been found desirable to use a binder material essentially free from aromatic organic materials, since such materials render the adhesive more susceptible to radiation-induced chemical changes, especially ultra-violet radiation-induced changes. For example, the custom polyurethanes described in Part D below are formed from aliphatic materials and are free from aromatic groups.

Section (iii): Mechanical Properties

It has been found that, in order to ensure that the binder binds the electro-optic layer to the electrode (with which it is normally in contact) in a manner which is resistant to the mechanical shocks to which electro-optic displays are often subject, the binder material should have a peel strength from an electrode material (for example ITO) with which is in contact of at least about 2, and preferably at least about 4, lb/inch. The peel strength from the specific electrode material used is best determined empirically, since it should be noted that the properties of electrode materials such as ITO, fluorine-doped tin oxide and organic semiconductors may vary considerably with the manner in which the layers are deposited so that, for example, the peel strength of any specific binder material from an ITO-coated polymer film may vary greatly depending upon the exact process used to deposit the ITO. Those skilled in adhesion technology will be aware of a number of standard procedures, such as that prescribed by the American Society for Testing and Materials, which may be used to measure the relevant peel strength.

As already noted, the proportion of binder material in the electro-optic medium affects the electro-optic properties of the display. The shear modulus of the binder is also important. The binder should have a relatively low shear modulus at the temperatures to which it is subjected during lamination to enable it to flow over and planarize any projections or recesses in the electro-optic medium. Desirably, the binder has a shear modulus at 120° C. of not more than about 1 megaPascal, and preferably not more than about 0.2 megaPascal.

Section (iv): Electrical Properties

As already discussed, electro-optic displays are known to be sensitive to changes in environmental humidity, although the reasons for this sensitivity have not hitherto been well understood. The present inventors have discovered that this sensitivity is largely due to changes in the volume resistivity of lamination adhesives and binders used in prior art electro-optic displays, and that the problems can be greatly reduced or eliminated by paying careful attention to the variation of the volume resistivity with relative humidity. Some binder materials can display changes in volume resistivity of more than two orders of magnitude when the temperature and humidity of their environment is varied within the ranges of 10-50° C. and 10-90 percent relative humidity (RH). For satisfactory performance, it has been found that the volume resistivity of the binder material should not vary by a factor of more than about 10 within the ranges of 10 to 90 percent RH and 10 to 50° C., or within any broader RH and temperature ranges within which the display is intended to operate. Desirably, the volume resistivity does not change by a factor of more than about 3, and preferably not more than about 2 within the specified RH and temperature ranges. In testing materials for changes in volume resistivity with RH and temperature, the same precautions as discussed above should be observed to ensure that the samples tested are truly in equilibrium with the atmosphere at the desired RH and temperature before the volume resistivities are measured.

It has also been found that, in the case of an electrophoretic medium comprising particles moving through a fluid, there is another, more complex requirement for the electrical properties of the binder material, namely that the product of the dielectric constant and the volume resistivity of the binder material should not be greater than the corresponding product for the fluid within the ranges of 10 to 90 percent RH and 10 to 50° C., or within any broader RH and temperature ranges within which the display is intended to operate. The relative sizes of the two products affect the electric field across the fluid, and to ensure that this field is satisfactorily large, the aforementioned relationship should be observed.

Also, the ratio of the dielectric constant of the binder material to the dielectric constant of the fluid within the temperature over the range of from 10 to 50° C. (or the operating temperature range of the display, if wider) should not vary from this ratio at 25° C. by more than about 2 percent, and desirably not by more than about 1 percent. Again, ideally this ratio would not vary at all with temperature.

Furthermore, the ratio of the volume resistivity of the binder material to the volume resistivity of the fluid within the temperature range of from 10 to 50° C. (or the operating temperature range of the display, if wider) should not vary from this ratio at 25° C. by more than a factor of about 100, desirably not by a factor of more than about 10, and preferably not by a factor of more than about 2. Again, ideally the ratio would not vary at all with temperature.

The ratios mentioned in the two preceding paragraphs affect the electric field experienced by the electrophoretic particles and hence the switching of the display. Ideally, the two ratios would be the same at all relevant temperatures, although of course this is essentially impossible to achieve in practice.

Section (v): Physico-Chemical Properties

The present inventors have also discovered that there are certain important requirements for the physico-chemical properties of binder materials used in electrophoretic displays. The solubility of the fluid in the binder material should not exceed about 1 percent by weight, desirably not exceed about 0.1 percent by weight and preferably not exceed about 0.01 percent by weight. The solubility of the fluid in the lamination adhesive can of course readily be measured by standard techniques for measuring the solubility of a liquid in a solid. Thus, as will readily be apparent to physical chemists, the relevant solubility can be measured by forming a dried (or otherwise cured—since the relevant solubility is that of the fluid in the binder material in the form in which it exists in the final display after drying or curing of the binder material) film of the binder material, of known weight, using the same processing conditions as are used to form the film of the adhesive in the actual display, soaking this film in a bath of the fluid and measuring the weight gain of the film once the weight of the film becomes stable.

The solubility of the fluid in the binder material is important because, although the binder material is in theory separated from the fluid by the capsule (or microcell wall), in practice some fluid inevitably finds its way into the binder. The presence of an excessive amount of fluid in the binder is undesirable, since the fluid tends to change the electrical properties of the binder is an unpredictable manner, and may cause the binder to swell (thus changing the distance between the electrodes of the display) and may reduce the adhesion between the electrophoretic medium and the adjacent substrate or electrode. Keeping the solubility of the fluid in the binder to a minimum helps to reduce these problems to a level where they do not substantially interfere with the proper operation of the display.

binder material, and are not objectionable in most applications of binder materials) and free monomers. Although the permissible limits of any particular mobile species are best determined empirically, by way of general guidance regarding materials commonly present in commercial binders materials, it has been found desirable to avoid an NMP concentration in excess of about 5 percent by weight, a triethanolamine concentration in excess of about 1 percent by weight and a surfactant concentration greater than about 0.5 percent by weight, based on the weight of the binder material. It is preferred to eliminate biocides entirely from the binder material.

No known binder material possesses properties meeting perfectly all the numerous criteria described above, and hence at present any binder material necessarily represents a compromise between competing criteria. Examples of acceptable binder materials include blends of from 75-25 parts by weight of NeoResin R 9630 with 25-75 parts by weight of NeoResin R 9330 (an experimental material) or NeoResin R 9314, a 75/25 blend of NeoResin R 9314 and NeoResin 9621, and the custom polyurethanes described below. In the case of the blends of NeoResin materials, the optimum formulation appears to be 60 parts by weight of R 9630 with 40 parts by weight of R 9330 or R 9314. All these preferred binder materials are aliphatic polyurethanes free from aromatic materials, and have the high light stability characteristic of such aliphatic polyurethanes. No special techniques are required for forming the polyurethane blends; the components are simply mixed in conventional equipment until a substantially a homogeneous mixture is obtained. Drying of the preferred binder materials can typically be effected in air at 50° C. for 10 minutes. Selected properties of these preferred binders are given in the following Table 1:

TABLE 1

| Properties | Preferred Characteristics | 60:40 w/w R 9630/R 9330 | 60:40 w/w; R 9630/R 9314 | Polyurethane of Example 8 |
|---|---|---|---|---|
| Mechanical | | | | |
| Adhesion | Peel strength >2 lbs/in | 6 | 6 | 4 |
| Bulk modulus | Bulk modulus @ 120° C. $\leq 10^6$ Pascals | $10^6$ | $10^6$ | $6 \times 10^5$ |
| Electrical | | | | |
| Volume resistivity (25° C./22% RH) | $10^8$ to $10^{12}$ ohms-cm | $1 \times 10^{10}$ | $1 \times 10^{10}$ | $2 \times 10^{10}$ |
| Temporal Stability of VR (test of Section (i) above) | <3 | <2 | <2 | <2 |

A further requirement for the binder material used in an encapsulated electrophoretic display is that it be substantially free from mobile species which can affect the operation of the display. Electrophoretic displays depend for their operation on the maintenance of stable charges on the electrophoretic particles, and it has been found that these charges may be affected by migration of mobile species from the binder into the internal phase containing the electrophoretic particles. Mobile species of concern in this regard include ionic species, especially alkali metal ions such as $Na^+$, surfactants, solvents, primarily organic solvents such as N-methylpyrrolidone (NMP), biocides (which are often present in commercial binder materials to prevent microorganism growth on the The electro-optic medium present in the displays of the second area of the present invention may be of any of the types previously discussed. Thus, the electro-optic medium may be a rotating bichromal member, an electrochromic medium or a microcell electrophoretic medium. However, it is generally preferred that the electro-optic medium be an electrophoretic medium comprising a plurality of capsules, each capsule comprising a capsule wall and an internal phase comprising electrically charged particles in a fluid and capable of moving through the fluid on application of an electric field to the electrophoretic medium, the electrophoretic medium further comprising a polymeric binder within which the capsules are held.

Also, as already indicated, the display may be of any of the forms described in the aforementioned patents and applications. Thus, typically the display will comprise at least one electrode disposed between the electro-optic medium and one of the substrates, this electrode being arranged to apply an electric field to the electro-optic medium. Generally, the display will comprise two electrodes disposed on opposed sides of the electro-optic medium and between the electro-optic medium and the two substrates, at least one of the electrodes and the adjacent substrate being light-transmissive such that the electro-optic medium can be viewed through the light-transmissive substrate and electrode.

Apart from the inclusion of the binders of the present invention, the electrophoretic media and displays of the present invention may employ the same components and manufacturing techniques as in the aforementioned E Ink and MIT patents and applications. The reader is referred to these patent and applications, and especially to the aforementioned U.S. Pat. No. 6,831,769, columns 25-36 for detailed of preferred materials and processes for the production of encapsulated electrophoretic displays.

Part C: Front Plane Laminates and Double Release Films Using the Lamination Adhesives Described in U.S. Pat. No. 6,831,769

As already indicated, a third area of the present invention relates to front plane laminates and double release films using the lamination adhesives described in the aforementioned U.S. Pat. No. 6,831,769. Thus, this area of the invention provides an article of manufacture (a front plane laminate) comprising in order, a light-transmissive electrically-conductive layer; a layer of a solid electro-optic medium in electrical contact with the electrically-conductive layer; an adhesive layer; and a release sheet, the adhesive layer having any one or more of the following properties:

(a) having a volume resistivity, measured at 10° C., which does not change by a factor of more than about 3 after being held at 25° C. and 45 percent relative humidity for 1000 hours;

(b) the volume resistivity of the adhesive changes by a factor of less than about 10 within a range of 10 to 90 percent relative humidity and over a temperature range of 10 to 50° C.;

(c) the adhesive has a shear modulus at 120° C. of not more than about 1 megaPascal;

(d) the product of the dielectric constant and the volume resistivity of the adhesive is not greater than the product of the dielectric constant and the volume resistivity of the electro-optic medium within a range of 10 to 90 percent relative humidity and over a temperature range of 10 to 50° C.;

(e) comprising an ultra-violet stabilizer;

(f) being substantially free from mobile species.

In such a front plane laminate, the electro-optic medium may comprise a rotating bichromal member, polymer-dispersed electrophoretic or microcell electrophoretic medium, or an electrophoretic medium comprising a plurality of capsules, each capsule comprising a capsule wall and an internal phase encapsulated within the capsule wall, the internal phase comprising electrically charged particles suspended in a fluid and capable of moving through the fluid on application of an electric field to the electrophoretic material.

The third area of the present invention also provides an article of manufacture (a front plane laminate) comprising in order, a light-transmissive electrically-conductive layer; a layer of an electrophoretic medium in electrical contact with the electrically-conductive layer, the electrophoretic medium comprising a plurality of electrically charged particles in a fluid and capable of moving therethrough on application of an electric field to the electrophoretic medium; an adhesive layer; and a release sheet, the adhesive layer having any one or more of the following properties:

(a) the product of the dielectric constant and the volume resistivity of the adhesive layer is not greater than the product of the dielectric constant and the volume resistivity of the fluid within a range of 10 to 90 percent relative humidity and over a temperature range of 10 to 50° C.;

(b) the ratio of the dielectric constant of the adhesive layer to the dielectric constant of the fluid within the temperature over the range of from 10 to 50° C. does not vary from this ratio at 25° C. by more than about 2 percent;

(c) the ratio of the volume resistivity of the adhesive layer to the volume resistivity of the fluid within the temperature over the range of from 10 to 50° C. does not vary from this ratio at 25° C. by more than a factor of about 100; and (d) the solubility of the fluid in the adhesive layer does not exceed about 1 percent weight/weight over the range of 10 to 50° C.

In such a front plane laminate, the electrophoretic medium may comprise a plurality of capsules, each capsule comprising a capsule wall and an internal phase encapsulated within the capsule wall, the internal phase comprising electrically charged particles in a fluid and capable of moving through the fluid on application of an electric field to the electrophoretic material.

The third area of the present invention also provides an article of manufacture (a double release film) comprising a layer of a solid electro-optic medium having first and second surfaces on opposed sides thereof, a first adhesive layer on the first surface of the layer of solid electro-optic medium; a release sheet disposed on the opposed side of the first adhesive layer from the layer of solid electro-optic medium; and a second adhesive layer on the second surface of the layer of solid electro-optic medium. At least one of first and second adhesive layers has any one or more of the following properties:

(a) having a volume resistivity, measured at 10° C., which does not change by a factor of more than about 3 after being held at 25° C. and 45 percent relative humidity for 1000 hours;

(b) the volume resistivity of the adhesive changes by a factor of less than about 10 within a range of 10 to 90 percent relative humidity and over a temperature range of 10 to 50° C.;

(c) the adhesive has a shear modulus at 120° C. of not more than about 1 megaPascal;

(d) the product of the dielectric constant and the volume resistivity of the adhesive is not greater than the product of the dielectric constant and the volume resistivity of the electro-optic medium within a range of 10 to 90 percent relative humidity and over a temperature range of 10 to 50° C.;

(e) comprising an ultra-violet stabilizer; and (f) being substantially free from mobile species.

In such a double release film, the electro-optic medium may comprise a rotating bichromal member, polymer-dispersed electrophoretic or microcell electrophoretic medium, or an electrophoretic medium comprising a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

Finally, the third area of the present invention provides an article of manufacture (a double release film) comprising a layer of an electrophoretic medium having first and second surfaces on opposed sides thereof, the electrophoretic medium comprising a plurality of electrically charged particles in a fluid and capable of moving therethrough on application of an electric field to the electrophoretic medium; a first adhesive layer on the first surface of the layer of electrophoretic medium; a release sheet disposed on the opposed side of the first adhesive layer from the layer of electrophoretic medium; and a second adhesive layer on the second surface of the layer of electrophoretic medium. At least one of first and second adhesive layers has any one or more of the following properties:

(a) the product of the dielectric constant and the volume resistivity of the adhesive layer is not greater than the product of the dielectric constant and the volume resistivity of the fluid within a range of 10 to 90 percent relative humidity and over a temperature range of 10 to 50° C.;

(b) the ratio of the dielectric constant of the adhesive layer to the dielectric constant of the fluid within the temperature over the range of from 10 to 50° C. does not vary from this ratio at 25° C. by more than about 2 percent;

(c) the ratio of the volume resistivity of the adhesive layer to the volume resistivity of the fluid within the temperature over the range of from 10 to 50° C. does not vary from this ratio at 25° C. by more than a factor of about 100; and (d) the solubility of the fluid in the adhesive layer does not exceed about 1 percent weight/weight over the range of 10 to 50° C.

In such a double release film, the electrophoretic medium may comprise a polymer-dispersed electrophoretic or microcell electrophoretic medium, or the electrophoretic medium may comprise a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

The front plane laminates and double release films of the present invention may have any of the optional features of the front plane laminates and double release films described in the aforementioned U.S. Pat. No. 6,982,178 and Publication No. 2004/0155857, and may be used in any of the processes there described. Thus, for example, the front plane laminates of the present invention may be provided with conductive vias extending through the electro-optic layer to enable the conductive layer of the front plane laminate (which forms a continuous front electrode in the final display) to make electrical contact with the backplane of the display. Similarly, the front plane laminates of the present invention may be provided with connection areas in which the electrically-conductive layer is exposed free from the electro-optic medium to enable an electrical connection to be made to the electrically-conductive layer.

It will be apparent to those skilled in the art that numerous changes and modifications can be made in the specific embodiments of the present invention described above without departing from the scope of the invention. In particular, although the invention has been described above mainly in connection with encapsulated electrophoretic media having discrete capsules, similar advantages can be achieved by the use of anisotropic adhesives in the other types of electro-optic displays previously discussed. Accordingly, the whole of the foregoing description is to be construed in an illustrative and not in a limitative sense.

The invention claimed is:

1. A process for forming a layer of an anisotropic adhesive having greater conductivity perpendicular to the plane of the layer than in this plane, the process comprising: dispersing a plurality of conductive particles in an adhesive matrix, the particles having a complex conductivity differing from that of the matrix; applying to the particles/matrix mixture an electric or magnetic field effective to cause the particles to form conductive strands extending substantially perpendicular to the plane of the layer; and increasing the viscosity of the matrix to prevent the particles moving out of the strands.

2. A process according to claim 1 wherein the conductive particles have a conductivity greater than about $10^{-9}$ S/cm. and a diameter not greater than about one-tenth of the thickness of the layer of lamination adhesive.

3. A process according to claim 1 wherein the conductive particles are formed from a semiconducting polymer.

4. A process according to claim 1 wherein the conductive particles are formed from a low conductivity material having a polar material adsorbed on its surface to increase its conductivity.

5. A process according to claim 1 wherein the matrix has a conductivity less than about $10^{-10}$ S/cm.

6. A process according to claim 1 wherein the particles are magnetizable and the matrix is substantially non-magnetizable.

7. A process according to claim 6 wherein the magnetizable particles comprise an iron oxide.

8. A process according to claim 1 wherein the layer of anisotropic adhesive formed is thereafter laminated to a layer of an electro-optic material.

9. A microcavity electrophoretic display comprising a layer of a binder having a plurality of closed cavities formed therein, said cavities being at least partially filled with an electrophoretic medium comprising a plurality of electrically charged particles in a fluid and capable of moving therethrough on application of an electric field to the electrophoretic medium, the display further comprising at least one electrode arranged to apply an electric field to the electrophoretic medium, the binder being characterized by any one or more of the following:

(a) having a volume resistivity, measured at 10° C., which does not change by a factor of more than about 3 after being held at 25° C. and 45 percent relative humidity for 1000 hours;

(b) having a volume resistivity which changes by a factor of less than about 10 within a range of 10 to 90 percent relative humidity and over a temperature range of 10 to 50° C.;

(c) having a shear modulus at 120° C. of not more than about 1 megaPascal;

(d) the product of the dielectric constant and the volume resistivity of the binder is not greater than the product of the dielectric constant and the volume resistivity of the fluid within a range of 10 to 90 percent relative humidity and over a temperature range of 10 to 50° C.;

(e) comprising an ultra-violet stabilizer;

(f) the ratio of the dielectric constant of the binder to the dielectric constant of the fluid within the temperature over the range of from 10 to 50° C. does not vary from this ratio at 25° C. by more than about 2 percent;

(g) the ratio of the volume resistivity of the binder to the volume resistivity of the fluid within the temperature over the range of from 10 to 50° C. does not vary from this ratio at 25° C. by more than a factor of about 100;

(h) the solubility of the fluid in the binder does not exceed about 1 percent weight/weight over the range of 10 to 50° C.; and (i) the binder is substantially free from mobile species.

10. An electrophoretic display according to claim 9 wherein the electrophoretic medium comprises a polymer-dispersed electrophoretic or microcell electrophoretic medium.

11. An electrophoretic display according to claim 9 wherein the electrophoretic medium comprises a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

12. An article of manufacture comprising in order:
a light-transmissive electrically-conductive layer;
a layer of an electrophoretic medium in electrical contact with the electrically-conductive layer, the electrophoretic medium comprising a binder having a plurality of closed cavities formed therein, said cavities being at least partially filled with an electrophoretic medium comprising a plurality of electrically charged particles in a fluid and capable of moving therethrough on application of an electric field to the electrophoretic medium;
an adhesive layer; and
a release sheet,
the binder being characterized by any one or more of the following:
(a) having a volume resistivity, measured at 10° C., which does not change by a factor of more than about 3 after being held at 25° C. and 45 percent relative humidity for 1000 hours;
(b) having a volume resistivity which changes by a factor of less than about 10 within a range of 10 to 90 percent relative humidity and over a temperature range of 10 to 50° C.;
(c) having a shear modulus at 120° C. of not more than about 1 megaPascal;
(d) the product of the dielectric constant and the volume resistivity of the binder is not greater than the product of the dielectric constant and the volume resistivity of the fluid within a range of 10 to 90 percent relative humidity and over a temperature range of 10 to 50° C.;
(e) comprising an ultra-violet stabilizer;
(f) the ratio of the dielectric constant of the binder to the dielectric constant of the fluid within the temperature over the range of from 10 to 50° C. does not vary from this ratio at 25° C. by more than about 2 percent;
(g) the ratio of the volume resistivity of the binder to the volume resistivity of the fluid within the temperature over the range of from 10 to 50° C. does not vary from this ratio at 25° C. by more than a factor of about 100;
(h) the solubility of the fluid in the binder does not exceed about 1 percent weight/weight over the range of 10 to 50° C.; and
(i) the binder is substantially free from mobile species.

13. An article of manufacture according to claim 12 wherein the electrophoretic medium comprises a polymer-dispersed electrophoretic or microcell electrophoretic medium.

14. An article of manufacture according to claim 12 wherein the electrophoretic medium comprises a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

15. An article of manufacture comprising:
a layer of an electrophoretic medium having first and second surfaces on opposed sides thereof, the electrophoretic medium comprising a binder having a plurality of closed cavities formed therein, said cavities being at least partially filled with an internal comprising a plurality of electrically charged particles in a fluid and capable of moving therethrough on application of an electric field to the electrophoretic medium;
a first adhesive layer on the first surface of the layer of electrophoretic medium;
a release sheet disposed on the opposed side of the first adhesive layer from the layer of electrophoretic medium; and
a second adhesive layer on the second surface of the layer of electrophoretic medium,
the binder being characterized by any one or more of the following:
(a) having a volume resistivity, measured at 10° C., which does not change by a factor of more than about 3 after being held at 25° C. and 45 percent relative humidity for 1000 hours;
(b) having a volume resistivity which changes by a factor of less than about 10 within a range of 10 to 90 percent relative humidity and over a temperature range of 10 to 50° C.;
(c) having a shear modulus at 120° C. of not more than about 1 megaPascal;
(d) the product of the dielectric constant and the volume resistivity of the binder is not greater than the product of the dielectric constant and the volume resistivity of the fluid within a range of 10 to 90 percent relative humidity and over a temperature range of 10 to 50° C.;
(e) comprising an ultra-violet stabilizer;
(f) the ratio of the dielectric constant of the binder to the dielectric constant of the fluid within the temperature over the range of from 10 to 50° C. does not vary from this ratio at 25° C. by more than about 2 percent;
(g) the ratio of the volume resistivity of the binder to the volume resistivity of the fluid within the temperature over the range of from 10 to 50° C. does not vary from this ratio at 25° C. by more than a factor of about 100;
(h) the solubility of the fluid in the binder does not exceed about 1 percent weight/weight over the range of 10 to 50° C.; and
(i) the binder is substantially free from mobile species.

16. An article of manufacture according to claim 15 wherein the electrophoretic medium comprises a polymer-dispersed electrophoretic or microcell electrophoretic medium.

17. An article of manufacture according to claim 15 wherein the electrophoretic medium comprises an electrophoretic medium comprising a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

18. An article of manufacture comprising in order:
a light-transmissive electrically-conductive layer;
a layer of a solid electro-optic medium in electrical contact with the electrically-conductive layer; an adhesive layer; and
a release sheet,
the adhesive layer being characterized by any one or more of the following:
(a) having a volume resistivity, measured at 10° C., which does not change by a factor of more than about 3 after being held at 25° C. and 45 percent relative humidity for 1000 hours;

(b) the volume resistivity of the adhesive changes by a factor of less than about 10 within a range of 10 to 90 percent relative humidity and over a temperature range of 10 to 50° C.;

(c) the adhesive has a shear modulus at 120° C. of not more than about 1 megaPascal;

(d) the product of the dielectric constant and the volume resistivity of the adhesive is not greater than the product of the dielectric constant and the volume resistivity of the electro-optic medium within a range of 10 to 90 percent relative humidity and over a temperature range of 10 to 50° C.;

(e) comprising an ultra-violet stabilizer;

(f) being substantially free from mobile species.

19. An article of manufacture according to claim 18 wherein the electro-optic medium comprises a rotating bichromal member, polymer-dispersed electrophoretic or microcell electrophoretic medium.

20. An article of manufacture according to claim 18 wherein the electro-optic medium comprises an electrophoretic medium comprising a plurality of capsules, each capsule comprising a capsule wall and an internal phase encapsulated within the capsule wall, the internal phase comprising electrically charged particles suspended in a fluid and capable of moving through the fluid on application of an electric field to the electrophoretic material.

21. An article of manufacture comprising in order:
a light-transmissive electrically-conductive layer;
a layer of an electrophoretic medium in electrical contact with the electrically-conductive layer, the electrophoretic medium comprising a plurality of electrically charged particles in a fluid and capable of moving therethrough on application of an electric field to the electrophoretic medium;
an adhesive layer; and
a release sheet,
the adhesive layer being characterized by any one or more of the following:

(a) the product of the dielectric constant and the volume resistivity of the adhesive layer is not greater than the product of the dielectric constant and the volume resistivity of the fluid within a range of 10 to 90 percent relative humidity and over a temperature range of 10 to 50° C.;

(b) the ratio of the dielectric constant of the adhesive layer to the dielectric constant of the fluid within the temperature over the range of from 10 to 50° C. does not vary from this ratio at 25° C. by more than about 2 percent;

(c) the ratio of the volume resistivity of the adhesive layer to the volume resistivity of the fluid within the temperature over the range of from 10 to 50° C. does not vary from this ratio at 25° C. by more than a factor of about 100; and (d) the solubility of the fluid in the adhesive layer does not exceed about 1 percent weight/weight over the range of 10 to 50° C.

22. An article of manufacture according to claim 21 wherein the electrophoretic medium comprises a polymer-dispersed electrophoretic or microcell electrophoretic medium.

23. An article of manufacture according to claim 21 wherein the electrophoretic medium comprises a plurality of capsules, each capsule comprising a capsule wall and an internal phase encapsulated within the capsule wall, the internal phase comprising electrically charged particles in a fluid and capable of moving through the fluid on application of an electric field to the electrophoretic material.

24. An article of manufacture comprising:
a layer of a solid electro-optic medium having first and second surfaces on opposed sides thereof;
a first adhesive layer on the first surface of the layer of solid electro-optic medium;
a release sheet disposed on the opposed side of the first adhesive layer from the layer of solid electro-optic medium; and
a second adhesive layer on the second surface of the layer of solid electro-optic medium,
at least one of first and second adhesive layers being characterized by any one or more of the following:

(a) having a volume resistivity, measured at 10° C., which does not change by a factor of more than about 3 after being held at 25° C. and 45 percent relative humidity for 1000 hours;

(b) the volume resistivity of the adhesive changes by a factor of less than about 10 within a range of 10 to 90 percent relative humidity and over a temperature range of 10 to 50° C.;

(c) the adhesive has a shear modulus at 120° C. of not more than about 1 megaPascal;

(d) the product of the dielectric constant and the volume resistivity of the adhesive is not greater than the product of the dielectric constant and the volume resistivity of the electro-optic medium within a range of 10 to 90 percent relative humidity and over a temperature range of 10 to 50° C.;

(e) comprising an ultra-violet stabilizer; and (f) being substantially free from mobile species.

25. An article of manufacture according to claim 24 wherein the electro-optic medium comprises a rotating bichromal member, polymer-dispersed electrophoretic or microcell electrophoretic medium.

26. An article of manufacture according to claim 24 wherein the electro-optic medium comprises an electrophoretic medium comprising a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

27. An article of manufacture comprising:
a layer of an electrophoretic medium having first and second surfaces on opposed sides thereof, the electrophoretic medium comprising a plurality of electrically charged particles in a fluid and capable of moving therethrough on application of an electric field to the electrophoretic medium;
a first adhesive layer on the first surface of the layer of electrophoretic medium;
a release sheet disposed on the opposed side of the first adhesive layer from the layer of electrophoretic medium; and
a second adhesive layer on the second surface of the layer of electrophoretic medium,
at least one of first and second adhesive layers being characterized by any one or more of the following:

(a) the product of the dielectric constant and the volume resistivity of the adhesive layer is not greater than the product of the dielectric constant and the volume resistivity of the fluid within a range of 10 to 90 percent relative humidity and over a temperature range of 10 to 50° C.;

(b) the ratio of the dielectric constant of the adhesive layer to the dielectric constant of the fluid within the temperature over the range of from 10 to 50° C. does not vary from this ratio at 25° C. by more than about 2 percent;

(c) the ratio of the volume resistivity of the adhesive layer to the volume resistivity of the fluid within the temperature over the range of from 10 to 50° C. does not vary from this ratio at 25° C. by more than a factor of about 100; and (d) the solubility of the fluid in the adhesive layer does not exceed about 1 percent weight/weight over the range of 10 to 50° C.

28. An article of manufacture according to claim 27 wherein the electrophoretic medium comprises a polymer-dispersed electrophoretic or microcell electrophoretic medium.

29. An article of manufacture according to claim 27 wherein the electrophoretic medium comprises a plurality of capsules, each capsule comprising a capsule wall and an internal phase encapsulated within the capsule wall, the internal phase comprising electrically charged particles in a fluid and capable of moving through the fluid on application of an electric field to the electrophoretic medium.

* * * * *